United States Patent
Kanno

(10) Patent No.: US 7,439,118 B2
(45) Date of Patent: Oct. 21, 2008

(54) METHOD OF MANUFACTURING SEMICONDUCTOR INTEGRATED CIRCUIT

(75) Inventor: Michihiro Kanno, Kanagawa (JP)

(73) Assignee: Sony Corporation, Tokyo (JP)

( * ) Notice: Subject to any disclaimer, the term of this patent is extended or adjusted under 35 U.S.C. 154(b) by 164 days.

(21) Appl. No.: 11/356,930

(22) Filed: Feb. 17, 2006

(65) Prior Publication Data

US 2006/0189075 A1 Aug. 24, 2006

(30) Foreign Application Priority Data

Feb. 22, 2005 (JP) ............................ P2005-045629

(51) Int. Cl.
*H01L 21/336* (2006.01)
*H01L 21/8234* (2006.01)

(52) U.S. Cl. ..................... 438/197; 438/238; 438/381; 257/E21.17; 257/E21.229; 257/E21.245; 257/E21.645; 257/E21.646

(58) Field of Classification Search ................. 438/197, 438/238, 381, 680, 706, 740, 723, 724, 756, 438/757, 752, 753
See application file for complete search history.

(56) References Cited

U.S. PATENT DOCUMENTS

| 6,538,278 B1 * | 3/2003 | Chau .......................... 257/324 |
| 6,602,748 B2 * | 8/2003 | Watatani ...................... 438/239 |
| 6,982,196 B2 * | 1/2006 | Belyansky et al. .......... 438/199 |

* cited by examiner

*Primary Examiner*—David Nhu
(74) *Attorney, Agent, or Firm*—Sonnenschein Nath & Rosenthal LLP

(57) ABSTRACT

A method of manufacturing a semiconductor integrated circuit including a logic part and a memory array part, the logic part having N-type and P-type FETs, and the memory array part having N-type and P-type FETs, includes the steps of forming N-type and P-type FETs constituting the logic part and the memory array part, thereafter sequentially forming a first insulation film having a tensile stress and a second insulation film on the whole surface, selectively removing the second insulation film and the first insulation film present on the upper side of the region of the P-type FET constituting the logic part, then forming a third insulation film having a compressive stress on the whole surface, and thereafter selectively removing the third insulation film present on the upper side of the region of the N-type FET constituting the logic part and the third insulation film present on the upper side of the regions of the N-type and P-type FETs constituting the memory array part.

8 Claims, 45 Drawing Sheets

[STEP-100]

[STEP-120]

[STEP—120] (CONTINUED)

[STEP-120] (CONTINUED)

[STEP-130]

[STEP-140]

[STEP—140] (CONTUNUED)

[STEP—140] (CONTINUED)

[STEP-150]

[EXAMPLE 2]

ION IMPLANTATION

[STEP—310]

[STEP—310] (CONTINUED)

ION IMPLANTATION

[STEP-320]

[STEP-320] (CONTINUED)

[EXAMPLE 4]

ION IMPLANTATION

[STEP-510]

[STEP-520]

[STEP—520] (CONTINUED)

[STEP-520] (CONTINUED)

[STEP—530]

[STEP-540]

[STEP-540] (CONTUNUED)

[STEP-540] (CONTINUED)

[STEP-610]

[STEP-610] (CONTINUED)

[STEP-620]

[STEP-620] (CONTINUED)

[STEP-630]

[STEP-630] (CONTINUED)

[STEP-630] (CONTINUED)

[STEP-640]

[STEP-650]

[STEP-650] (CONTINUED)

[EXAMPLE 7]

ION IMPLANTATION

[STEP-810]

[STEP-820]

[STEP-820] (CONTINUED)

[STEP-820] (CONTINUED)

[STEP-830]

[STEP-840]

[STEP-840] (CONTINUED)

FIG. 40A – PRIOR ART
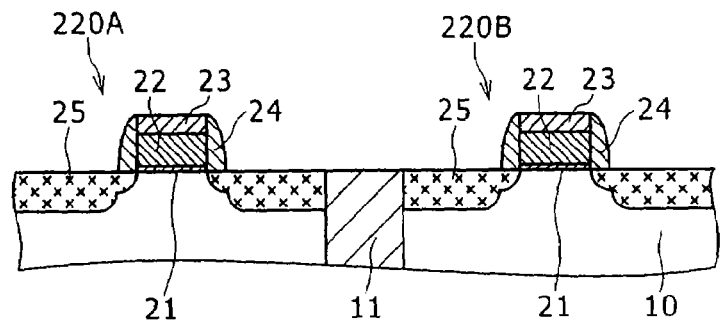
FIG. 40B – PRIOR ART
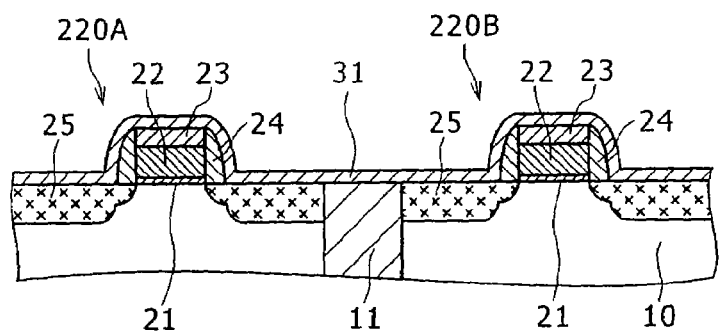
FIG. 40C – PRIOR ART
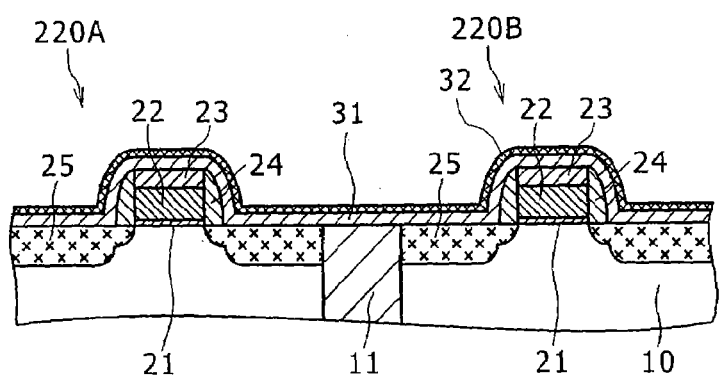

FIG. 41A – PRIOR ART
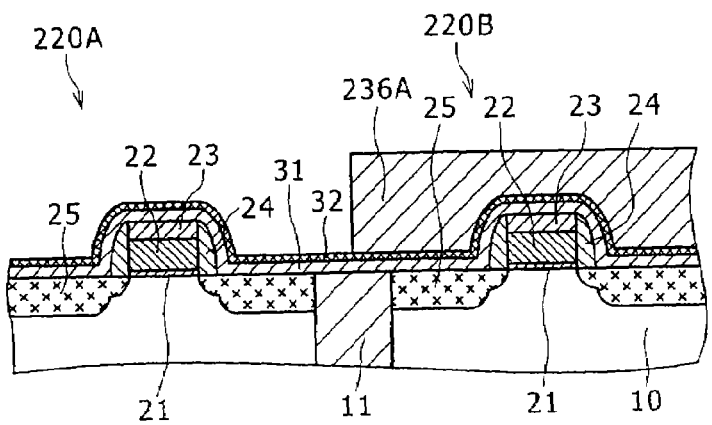
FIG. 41B – PRIOR ART
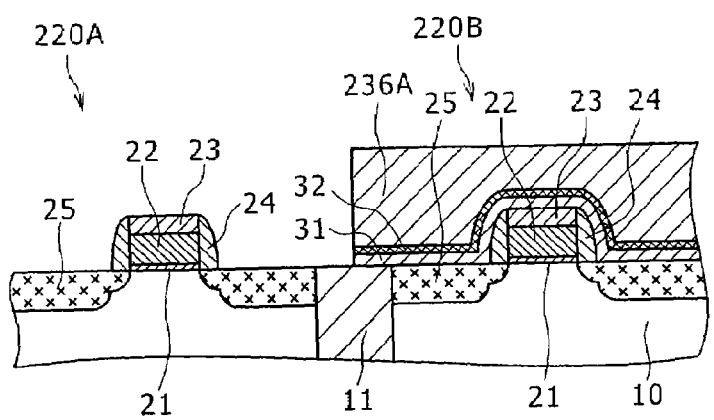
FIG. 41C – PRIOR ART
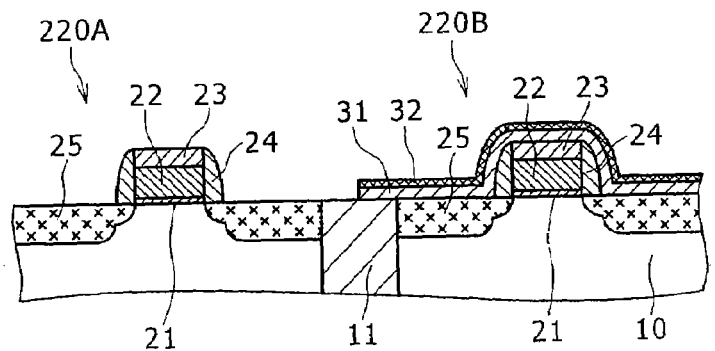

FIG. 42A – PRIOR ART
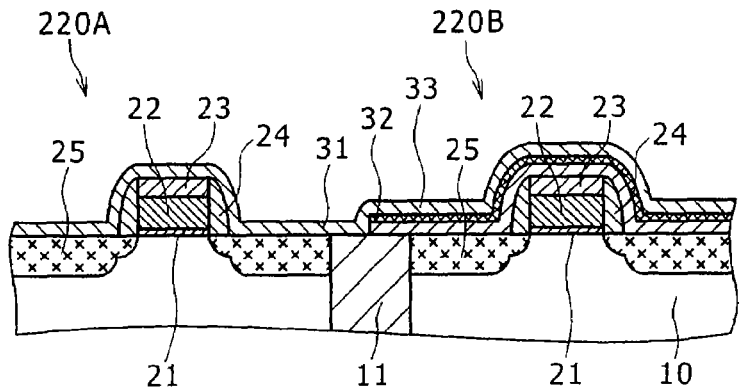
FIG. 42B – PRIOR ART
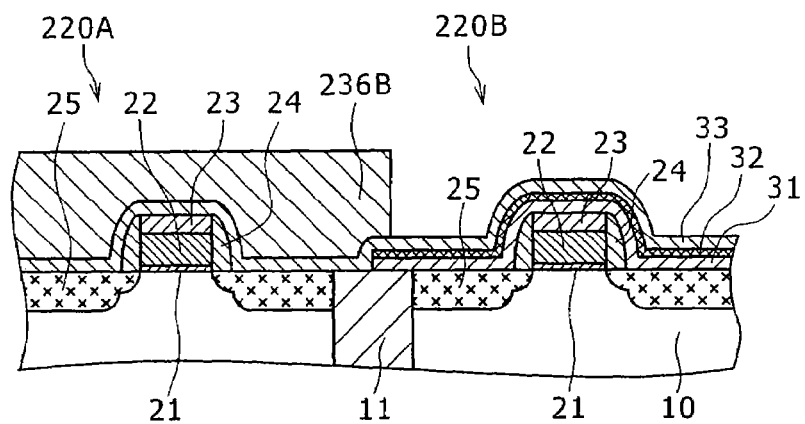
FIG. 42C – PRIOR ART
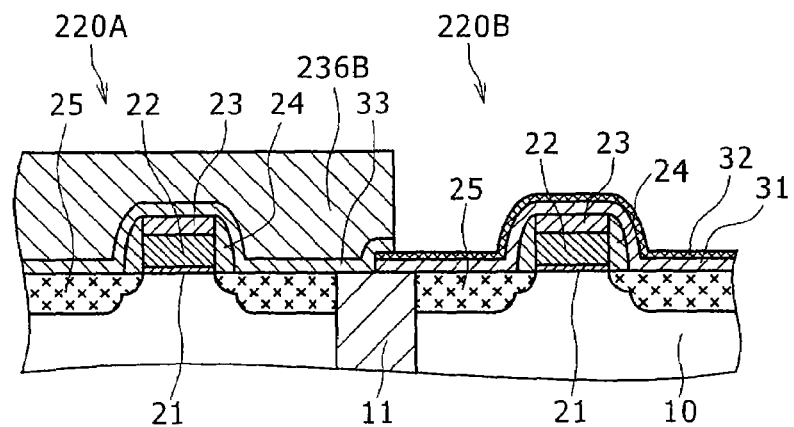

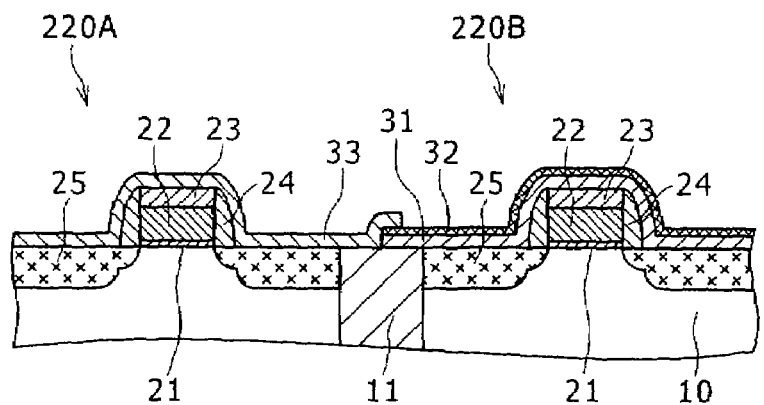
FIG.43A - PRIOR ART
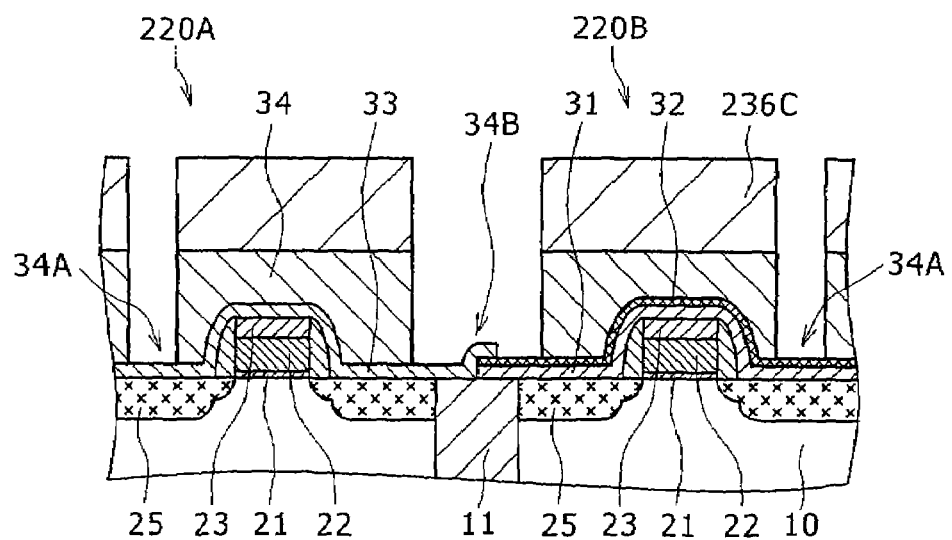
FIG.43B - PRIOR ART

FIG. 44A – PRIOR ART
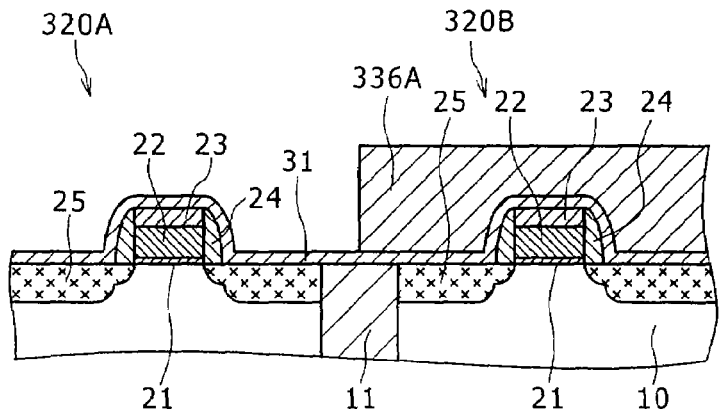
FIG. 44B – PRIOR ART
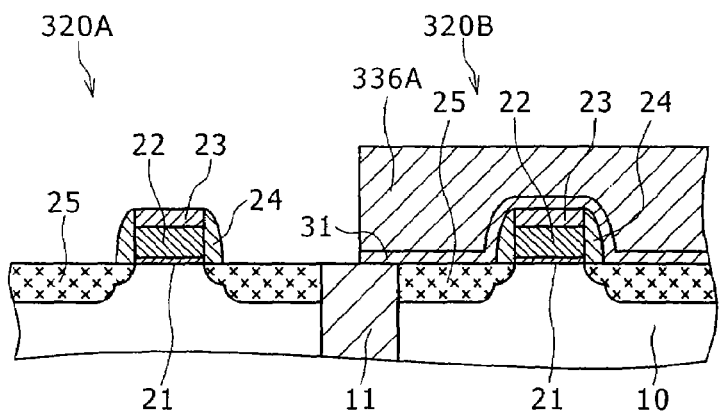
FIG. 44C – PRIOR ART
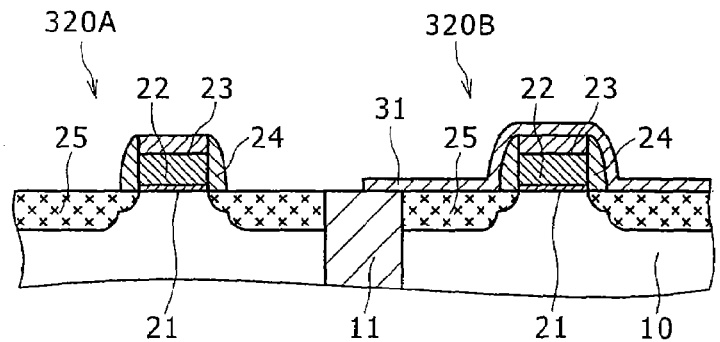

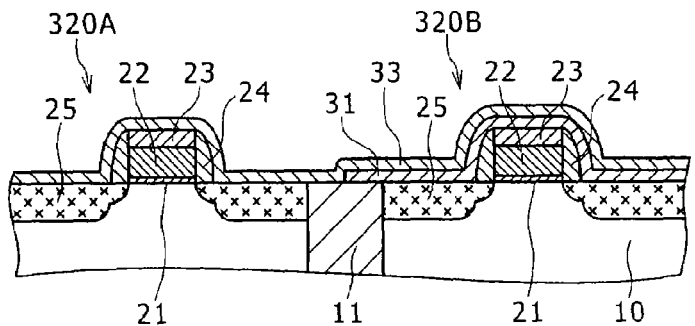
FIG. 45A – PRIOR ART
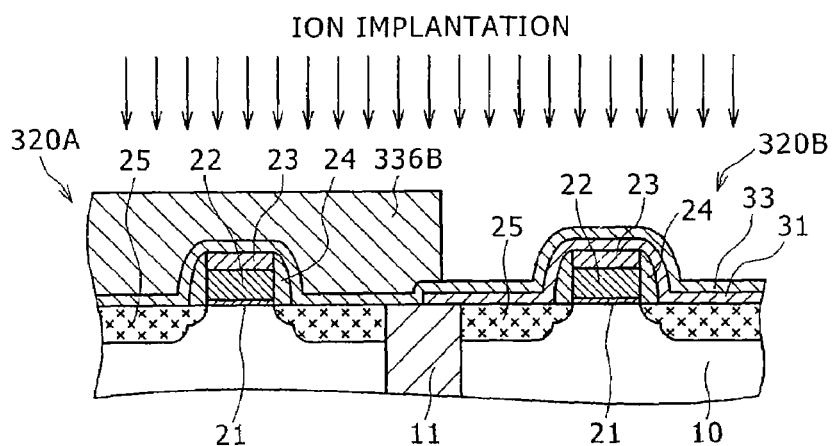
FIG. 45B – PRIOR ART
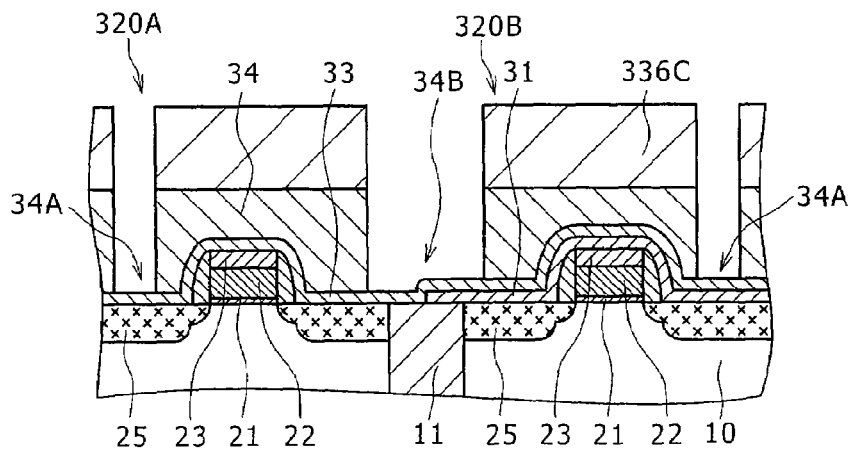
FIG. 45C – PRIOR ART

METHOD OF MANUFACTURING SEMICONDUCTOR INTEGRATED CIRCUIT

CROSS REFERENCES TO RELATED APPLICATIONS

The present invention contains subject matter related to Japanese Patent Application JP 2005-045629, filed in the Japanese Patent Office on Feb. 22, 2005, the entire contents of which being incorporated herein by reference.

BACKGROUND OF THE INVENTION

The present invention relates to a method of manufacturing a semiconductor integrated circuit including a logic part and a memory array part, the logic part having an N channel type field effect transistor and a P channel type field effect transistor, and the memory array part also having an N channel type field effect transistor and a P channel type field effect transistor.

Attendant on the progress of miniaturization of semiconductor integrated circuits, it has been becoming difficult to enhance the performance of the field effect transistor by only the scaling adopted in the past. In view of this, a technology of enhancing the performance by increasing the mobility through the use of a film stress has been paid attention to in relation to the semiconductor integrated circuits of the 90 nm generation and the latter generations (see, for example, Shinya Ito, et al., "Mechanical Stress Effect of Etch-Stop Nitride and its Impact on Deep Submicron Transistor Design", 2001 IEDM, or K. Goto, et al., "High Performance 35 nm Gate CMOSFET's with Vertical Scaling and Total Stress Control for 65 nm Technology", 2003 IEDM). In this technology, insulation films different in film stress are formed on the respective regions of an N channel type field effect transistor (hereinafter referred to as N-type FET) and a P channel type field effect transistor (hereinafter referred to as P-type FET) after the formation of gate parts, channel forming regions and source/drain regions. Specifically, an insulation film having a tensile stress is formed on the region of the N-type FET, and an insulation film having a compressive stress is formed on the region of the P-type FET.

In a semiconductor integrated circuit, a logic part having N-type FETs and P-type FETs and a memory array part having N-type FETs and P-type FETs are usually produced on the basis of the same step. Now, a method of manufacturing a memory array part composed of an SRAM (Static Random Access Memory) according to the related art (for convenience, referred to as the first manufacturing method according to the related art) will be described referring to FIGS. 40A, 40B, 40C, 41A, 41B, 41C, 42A, 42B, 42C, 43A and 43B, which are schematic partly end elevation diagrams of a semiconductor substrate and the like. The schematic partly end elevation diagrams in these drawings or schematic partly end elevation diagrams in various drawings which are schematic partly end elevation diagrams of a semiconductor substrate and the like to be described later are schematic partly end elevation diagrams taken along the dot-dash line in FIG. 1C. Besides, an equivalent circuit of the memory array part is shown in FIG. 1B, and a schematic layout diagram of a gate part, source/drain regions and the like is shown in FIG. 1C and FIG. 10B.

[Step 10]

First, based on a known method, a device separation region 11 having a trench structure is formed in a semiconductor substrate 10, then a gate part composed of a gate insulation film 21, a gate electrode 22 and an offset film 23 is formed on the semiconductor substrate 10, gate side walls 24 are formed on side surfaces of the gate part, and source-drain regions 25 are formed in the semiconductor substrate 10. Incidentally, the region, interposed between the two source/drain regions 25, of the semiconductor substrate 10 corresponds to a channel forming region. In this manner, P-type FETs 220A (see $TR_1$ and $TR_4$ in FIGS. 1B and 1C) and N-type FETs 220B (see $TR_2$, $TE_3$, $TR_5$ and $TR_6$ in FIGS. 1B and 1C) can be obtained (see FIG. 40A).

[Step 11]

Next, for example, based on a plasma CVD process, a first insulation film 31 composed of a 50 nm thick silicon nitride film and having a tensile stress is formed on the whole surface (see FIG. 40B), and a second insulation film 32 composed of a 30 nm thick silicon oxide film is formed on the first insulation film 31 (see FIG. 40C).

[Step 12]

Thereafter, based on the known lithographic technology, a resist layer 236A covering the region of the N-type FETs 220B is formed (see FIG. 41A), then the second insulation film 32 and the first insulation film 31 exposed in the region of the P-type FETs 220A not covered with the resist layer 236A are removed by a dry etching process (see FIG. 41B), and the resist layer 236A is removed based on an ashing treatment (see FIG. 41C).

[Step 13]

Next, for example, based on a plasma CVD process, a third insulation film 33 composed of a 50 nm thick silicon nitride film and having a compressive stress is formed on the whole surface (see FIG. 42A). Thereafter, based on the known lithographic technology, a resist layer 236B covering the region of the P-type FETs 220A is formed (see FIG. 42B), then the third insulation film 33 exposed in the region of the N-type FETs 220B not covered with the resist layer 236B is removed by a dry etching process (see FIG. 42C), and the resist layer 236B is removed based on an ashing treatment (see FIG. 43A). Since the second insulation film 32 composed of the silicon oxide film is formed as an etching stopper layer, the third insulation film 33 can be securely removed by the dry etching process. Incidentally, at the time of removing the third insulation film 33, the third insulation film 33 is dry etched in such a manner as to obtain a three-layer structure of the first insulation film 31, the second insulation film 32, and the third insulation film 33 and that the semiconductor substrate 10 and the like are not exposed in the boundary region between the first insulation film 31 and the third insulation film 33.

[Step 14]

Thereafter, a layer insulation layer 34 and a resist layer 236C are formed on the whole surface, and the layer insulation layer 34 is dry etched by using the resist layer 236C as an etching mask, to form openings 34A for forming contact holes and an opening 34B for forming a local inter connect 35 (see the schematic layout diagram in FIG. 10B) in the layer insulation layer 34 (see FIG. 43B), and the resist layer 236C is removed. Next, a wiring material layer is formed on the layer insulation layer 34 inclusive of the inside of the openings 34A and 34B, and the wiring material layer on the layer insulation layer 34 is patterned, whereby a wiring layer can be formed on the layer insulation layer 34 and, simultaneously, the contact holes and the local interconnect 35 can be formed.

Alternatively, another method of producing a memory array part according to the related art (for convenience, referred to as the second manufacturing method according to the related art) may be adopted, which will be described referring to FIGS. 44A, 44B, 44C, 45A, 45B, and 45C, which are schematic partly end elevation diagrams of a semiconductor substrate and the like.

[Step 20]

First, based on a known method, a device separation region 11 having a trench structure is formed in a semiconductor substrate 10, then a gate part composed of a gate insulation film 21, a gate electrode 22 and an offset film 23 is formed on the semiconductor substrate 10, thereafter gate side walls 24 are formed on side surfaces of the gate part, and source/drain regions 25 are formed in the semiconductor substrate 10. Incidentally, the region, between the two source/drain regions 25, of the semiconductor substrate 10 corresponds to a channel forming region. In this manner, P-type FETs 320A (see $TR_1$ and $TR_4$ in FIGS. 1B and 1C) and N-type FETs 320B (see $TR_2$, $TR_3$, $TR_5$, and $TR_6$ in FIGS. 1B and 1C) can be obtained.

[Step 21]

Next, for example based on a plasma CVD process, a first insulation film 31 composed of a 50 nm thick silicon nitride film and having a tensile stress is formed on the whole surface. Thereafter, based on a known lithographic technology, a resist layer 336A covering the region of the N-type FETs 320B is formed (see FIG. 44A), the first insulation film 31 exposed in the region of the P-type FETs 320A not covered with the resist layer 336A is removed by a dry etching process (see FIG. 44B), and the resist layer 336A is removed based on an ashing treatment (see FIG. 44C).

[Step 22]

Next, for example, based on a plasma CVD process, a third insulation film 33 composed of a 50 nm thick silicon nitride film and having a compressive stress is formed on the whole surface (see FIG. 45A). Thereafter, based on a known lithographic technology, a resist layer 336B covering the region of the P-type FETs 320A is formed (see FIG. 45B), and ion implantation for relaxation of compressive stress is applied to the third insulation film 33 exposed in the region of the N-type FETs 320B not covered with the resist layer 336B. Examples of the ion species used here include germanium (Ge). Thereafter, the resist layer 336B is removed based on an ashing treatment.

[Step 23]

Next, a layer insulation layer 34 and a resist layer 336C are formed on the whole surface, the layer insulation layer 34 is dry etched by using the resist layer 336C as an etching mask, to form openings 34A for forming contact holes and an opening 34B for forming a local interconnect 35 (see the schematic layout diagram in FIG. 10B) in the layer insulation layer 34 (see FIG. 45C), and the resist layer 336C is removed. Subsequently, a wiring material layer is formed on the layer insulation layer 34 inclusive of the inside of the openings 34A and 34B, and the wiring material layer on the layer insulation layer 34 is patterned, whereby a wiring layer can be formed on the layer insulation layer 34 and, simultaneously, the contact holes and the local interconnect 35 can be formed.

SUMMARY OF THE INVENTION

Meanwhile, in the first manufacturing method according to the related art, when the second insulation film 32 exposed in the region of the P-type FETs 220A not covered with the resist layer 236A and the first insulation film 31 thereunder are removed by a dry etching process in Step 12 (see FIG. 41B), the source/drain regions 25 and the gate part constituting the P-type FET 220A may be damaged by over-etching, with the result of deterioration of memory retention characteristics. In addition, when the layer insulation layer 34 is dry etched by using the resist layer 236C as an etching mask so as to form the openings 34A for forming the contact holes and the opening 34B for forming the local interconnect 35 in Step 14, it may be necessary to etch the three-layer structure composed of the third insulation film 33, the second insulation film 32 and the first insulation film 31 without damaging the semiconductor substrate 10, at a bottom portion of the opening 34B, and, therefore, it is difficult to achieve the etching.

In addition, in the second manufacturing method according to the related art, the problem in Step 14 in the first manufacturing method according to the related art is not generated, but there may arise the problem that when the first insulation film 31 exposed in the region of the P-type FETs 320A not covered with the resist layer 336A is removed by a dry etching process in Step 21 (see FIG. 44B), the source/drain regions 25 or the gate part constituting the P-type FET 320A is damaged by over-etching, with the result of deterioration of memory retention characteristics.

Accordingly, there is a need for providing a method of manufacturing a semiconductor integrated circuit by which the problem that field effect transistors constituting a memory array part are damaged, with the result of deterioration of memory retention characteristics, and the difficulties in forming an opening for forming a local interconnect in a layer insulation layer can be obviated, at the time of manufacturing a semiconductor integrated circuit including a logic part and a memory array part. The logic part has an N channel type field effect transistor and a P channel type field effect transistor. The memory array part has an N channel type field effect transistor and a P channel type field effect transistor.

In order to fulfill the above need, according one embodiment of the present invention, there is provided a method of manufacturing a semiconductor integrated circuit including a logic part and a memory array part, the logic part having an N channel type field effect transistor and a P channel type field effect transistor, and the memory array part having an N channel type field effect transistor and a P channel type field effect transistor, the method including the steps of:

(A) forming gate parts, channel forming regions and source/drain regions of the N channel type field effect transistor and said P channel type field effect transistor which constitute the logic part, and gate parts, channel forming regions and source/drain regions of the N channel type field effect transistor and the P channel type field effect transistor which constitute the memory array part, in a semiconductor substrate;

(B) forming a first insulation film having a tensile stress on the whole surface and forming a second insulation film on the first insulation film;

(C) selectively removing the second insulation film and the first insulation film present on the upper side of the region of the P channel type field effect transistor constituting the logic part;

(D) forming a third insulation film having a compressive stress on the whole surface; and (E) selectively removing the third insulation film present on the upper side of the region of the N channel type field effect transistor constituting the logic part and the third insulation film present on the upper side of the regions of said N channel type field effect transistor and the P channel type field effect transistor which constitute the memory array part.

In the method of manufacturing a semiconductor integrated circuit according to the one embodiment of the present invention, ion implantation for relaxation of tensile stress may be applied to the first insulation film present on the region of the P channel type field effect transistor constituting the memory array part, subsequently to the step (E).

According to another embodiment of the present invention, there is provided a method of manufacturing a semiconductor integrated circuit including a logic part and a memory array part, the logic part having an N channel type field effect transistor and a P channel type field effect transistor, and the memory array part having an N channel type field effect transistor and a P channel type field effect transistor, the method including the steps of:

(A) forming gate parts, channel forming regions and source/drain regions of the N channel type field effect transistor and the P channel type field effect transistor which constitute the logic part, and gate parts, channel forming regions and source/drain regions of the N channel type field effect transistor and the P channel type field effect transistor which constitute the memory array part, in a semiconductor substrate;

(B) forming a first insulation film having a tensile stress on the whole surface and forming a second insulation film on the first insulation film;

(C) selectively removing the second insulation film and the first insulation film present on the upper side of the region of the P channel type field effect transistor constituting the logic part;

(D) forming a third insulation film having a compressive stress on the whole surface; and (E) applying ion implantation for relaxation of compressive stress to the third insulation film present on the upper side of the region of the N channel field effect transistor constituting the memory array part, and selectively removing the third insulation film present on the upper side of the region of the N channel type field effect transistor constituting the logic part.

In the method of manufacturing a semiconductor integrated circuit according to the another embodiment of the present invention, ion implantation for relaxation of tensile stress may be applied to the first insulation film present on the region of the P channel type field effect transistor constituting the memory array part, in any step between the steps (B) to (D) (namely, either between the step (B) and the step (C) or between the step (C) and the step (D)). Incidentally, in the step (E), the third insulation film present on the upper side of the region of the N channel type field effect transistor constituting the logic part may be selectively removed after the ion implantation for relaxation of compressive stress is applied to the third insulation film present on the upper side of the region of the N channel type field effect transistor constituting the memory array part, or the ion implantation for relaxation of compressive stress may be applied to the third insulation film present on the upper side of the region of the N channel type field effect transistor constituting the memory array part after the third insulation film present on the upper side of the region of the N channel type field effect transistor constituting the logic part.

According to a further embodiment of the present invention, there is provided a method of manufacturing a semiconductor integrated circuit including a logic part and a memory array part, the logic part having an N channel type field effect transistor and a P channel type field effect transistor, and the memory array part having an N channel type field effect transistor and a P channel type field effect transistor, the method including the steps of:

(A) forming gate parts, channel forming regions and source/drain regions of the N channel type field effect transistor and the P channel type field effect transistor which constitute the logic part, and gate parts, channel forming regions and source/drain regions of the N channel type field effect transistor and the P channel type field effect transistor which constitute the memory array part, in a semiconductor substrate;

(B) forming a first insulation film having a tensile stress on the whole surface and forming a second insulation film on the first insulation film;

(C) selectively removing the second insulation film present on the upper side of the regions of the N channel type field effect transistor and the P channel type field effect transistor which constitute the logic part;

(D) selectively removing the first insulation film present on the region of the P channel type field effect transistor constituting the logic part;

(E) forming a third insulation film having a compressive stress on the whole surface; and (F) selectively removing the third insulation film present on the upper side of the region of the N channel type field effect transistor constituting the logic part and the third insulation film present on the upper side of the regions of the N channel type field effect transistor and the P channel type field effect transistor which constitute the memory array part.

In the method of manufacturing a semiconductor integrated circuit according to the further embodiment of the present invention, ion implantation for relaxation of tensile stress may be applied to the first insulation film present on the region of the P channel type field effect transistor constituting the memory array part, subsequently to the step (F).

According to yet another embodiment of the present invention, there is provided a method of manufacturing a semiconductor integrated circuit including a logic part and a memory array part, the logic part having an N channel type field effect transistor and a P channel type field effect transistor, and the memory array part having an N channel type field effect transistor and a P channel type field effect transistor, the method including the steps of:

(A) forming gate parts, channel forming regions and source/drain regions of the N channel type field effect transistor and the P channel type field effect transistor which constitute the logic part, and gate parts, channel forming regions and source/drain regions of the N channel type field effect transistor and the P channel type field effect transistor which constitute the memory array part, in a semiconductor substrate;

(B) forming a first insulation film having a tensile stress on the whole surface and forming a second insulation film on the first insulation film;

(C) selectively removing the second insulation film present on the upper side of the regions of the N channel type field effect transistor and the P channel type field effect transistor which constitute the logic part;

(D) selectively removing the first insulation film present on the region of the P channel type field effect transistor constituting the logic part;

(E) forming a third insulation film having a compressive stress on the whole surface; and (F) applying ion implantation for relaxation of compressive stress to the third insulation film present on the upper side of the region of the N channel type field effect transistor constituting the memory array part, and selectively removing the third insulation film present on the upper side of the region of the N channel type field effect transistor constituting the logic part.

In the method of manufacturing a semiconductor integrated circuit according to the yet another embodiment of the present invention, ion implantation for relaxation of tensile stress may be applied to the first insulation film present on the region of the P channel type field effect transistor constituting the memory array part, in any step between the step (B) and the step (D) (namely, either between the steps (B) and (C) or between the steps (C) and (D)). Incidentally, in the step (F), the third insulation film present on the upper side of the N channel type field effect transistor constituting the logic part may be selectively removed after the ion implantation for relaxation of compressive stress is applied to the third insulation film present on the region of the N channel type field effect transistor constituting the memory array part, or ion implantation for relaxation of compressive stress may be applied to the third insulation film present on the upper side of the N channel type field effect transistor constituting the memory array part after the third insulation film present on the upper side of the region of the N channel type field effect transistor constituting the logic part is selectively removed.

According to a yet further embodiment of the present invention, there is provided a method of manufacturing a semiconductor integrated circuit including a logic part and a memory array part, the logic part having an N channel type field effect transistor and a P channel type field effect transistor, and the memory array part having an N channel type field effect transistor and a P channel type field effect transistor, the method including the steps of:

(A) forming gate parts, channel forming regions and source/drain regions of the N channel type field effect transistor and the P channel type field effect transistor which constitute the logic part, and gate parts, channel forming regions and source/drain regions of the N channel type field effect transistor and the P channel type field effect transistor which constitute the memory array part, in a semiconductor substrate;

(B) forming a first insulation film having a tensile stress on the whole surface and forming a second insulation film on the first insulation film;

(C) selectively removing the second insulation film and the first insulation film present on the upper side of the region of the N channel type field effect transistor constituting the logic part;

(D) forming a third insulation film having a compressive stress on the whole surface; and (E) selectively removing the third insulation film present on the upper side of the region of said P channel type field effect transistor constituting the logic part, wherein in any step between the step (B) and the step (D), ion implantation for relaxation of compressive stress is applied to the first insulation film present on the N channel type field effect transistor constituting the memory array part.

In the method of manufacturing a semiconductor integrated circuit according to the yet further embodiment of the present invention, ion implantation for relaxation of tensile stress may be applied to the third insulation film present on the upper side of the region of the P channel type field effect transistor constituting the memory array part, after the third insulation film having a tensile stress is formed. Specifically, the ion implantation for relaxation of tensile stress may be carried out subsequently to the step (D), or subsequently to the step (E).

In the methods of manufacturing a semiconductor integrated circuit according to the one to yet further embodiments of the present invention (these methods may hereinafter be referred to generically as the present invention), the first insulation film and the third insulation film may each be composed of a silicon nitride film (SiN film), and the second insulation film may be composed of a silicon oxide film ($SiO_x$ film). Incidentally, though not limitative, an example of the thickness of the first insulation film and the third insulation film is in the range of $5 \times 10^{-8}$ to $2 \times 10^{-7}$ m. In addition, an examples of the tensile stress and the compressive stress is $1 \times 10^9$ Pa.

In the present invention, in the case of composing each of he first insulation film and the third insulation film of a silicon oxide film, the first insulation film having a tensile stress and the third insulation film having a compressive stress can be formed by appropriately selecting the film forming conditions in the plasma CVD process, for example.

In the present invention, examples of the ion species in the ion implantation for relaxation of stress include impurities with a low activation rate, such as germanium (Ge), silicon (Si), and argon (Ar).

In the present invention, in the P channel type field effect transistor and the N channel type field effect transistor which constitute the memory array part, an insulation film having a desired stress is formed on the regions of the P channel type field effect transistor and the N channel type field effect transistor, so that it is possible to contrive enhancement of the performances of the P channel type field effect transistor and the N channel type field effect transistor which constitute the memory array part. Specifically, in the region of the N channel type field effect transistor constituting the memory array part, the insulation film having the tensile stress may be left, whereby it is possible to contrive enhancement of the performance of the N channel type field effect transistor, and a lowering in cell current determining the SRAM reading speed is obviated. Besides, in the region of the P channel type field effect transistor constituting the memory array part, for example, ion implantation may be applied to the insulation film having a tensile stress, whereby it is possible to contrive relaxation of tensile stress, suppress the lowering in the performance of the P channel type field effect transistor, and to control the threshold voltage $V_{th}$.

Moreover, in the process of manufacturing the semiconductor integrated circuit, basically, the regions of the P channel type field effect transistor and the N channel type field effect transistor which constitute the memory array part are covered with the first insulation film, so that the problem that the field effect transistors constituting the memory array part would be damaged, leading to deterioration of memory retention characteristics or a lowering in operating speed can be obviated. In addition, such problems as difficulties in forming the opening for forming a local interconnect in the layer insulation layer, a reduction in processing margin, and a lowering in the yield of the semiconductor integrated circuit can be obviated.

BRIEF DESCRIPTION OF THE DRAWINGS

FIGS. 40A, 40B and 40C are schematic partly end elevation diagrams of a semiconductor substrate and the like for illustrating a method of manufacturing a memory array part according to the related art (a first manufacturing method according to the related art).

FIGS. 41A, 41B and 41C are schematic partly end elevation diagrams of the semiconductor substrate and the like for illustrating the first manufacturing method of according to the related art, following to FIG. 40C.

FIGS. 42A, 42B and 42C are schematic partly end elevation diagrams of the semiconductor substrate and the like for illustrating the first manufacturing method according to the related art, following to FIG. 41C.

FIGS. 43A and 43B are schematic partly end elevation diagrams of the semiconductor substrate and the like for illustrating the first manufacturing method according to the related art, following to FIG. 42C.

FIGS. 44A, 44B and 44C are schematic partly end elevation diagrams of a semiconductor substrate and the like for illustrating a method of manufacturing a memory array part according to the related art (a second manufacturing method according to the related art).

FIGS. 45A, 45B and 45C are schematic partly end elevation diagrams of the semiconductor substrate and the like for illustrating the second manufacturing method according to the related art, following to FIG. 44C.

DETAILED DESCRIPTION OF THE PREFERRED EMBODIMENTS

Figure 1A:
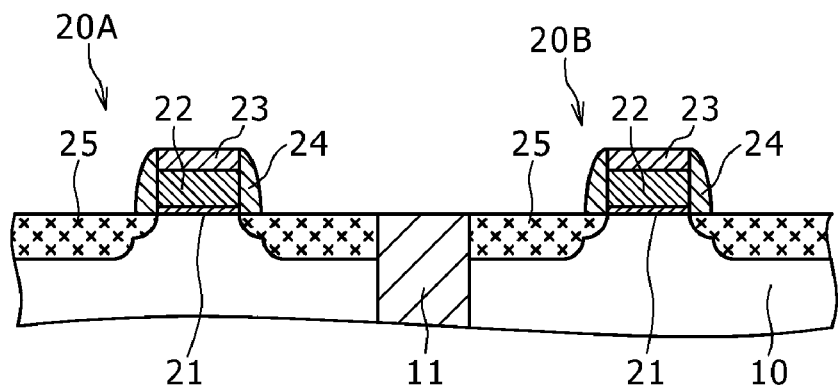
FIG. 1A is a schematic partly end elevation diagram of a semiconductor substrate and the like for illustrating a method of manufacturing a semiconductor integrated circuit according to Example 1.

Now, the present invention will be described based on some embodiments thereof, referring to the drawings.

EXAMPLE 1

Figure 1B:
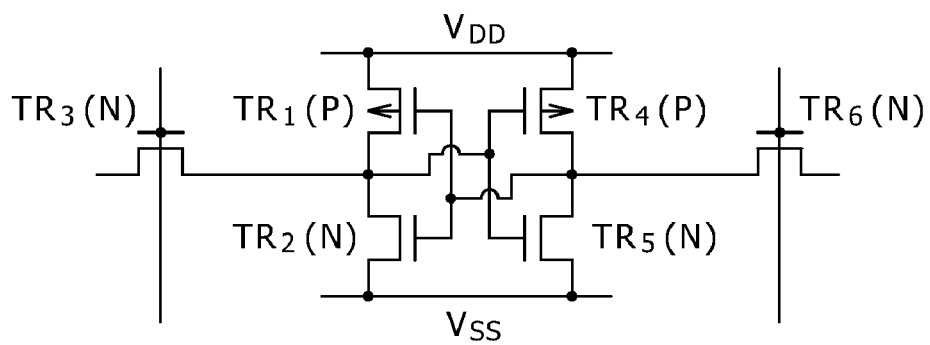
FIG. 1B is a diagram showing an equivalent circuit of a memory array part.
Figure 1C:
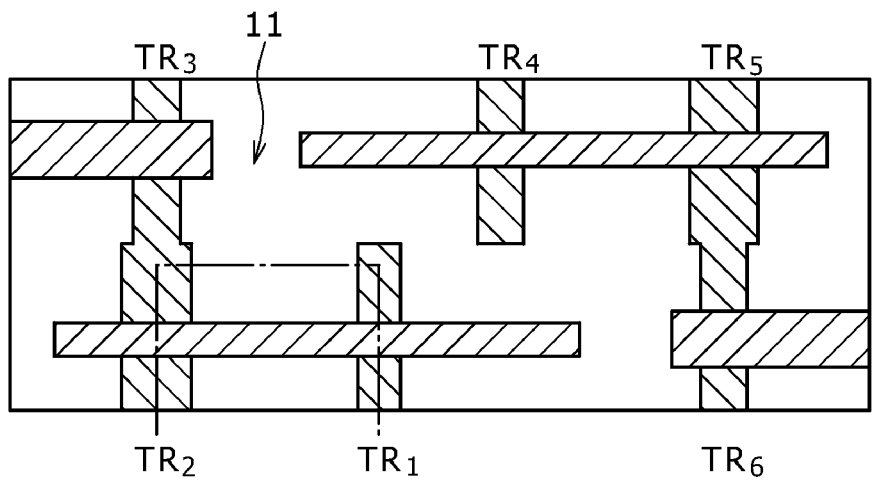
FIG. 1C is a schematic layout diagram of the semiconductor integrated circuit according to Example 1.

Example 1 relates to a method of manufacturing a semiconductor integrated circuit according to a first embodiment of the present invention. The method of manufacturing a semiconductor integrated circuit in Example 1 or in any of Examples 2 to 5 which will be described later is a method of manufacturing a semiconductor integrated circuit including a logic part and a memory array part (specifically, a memory array part composed of an SRAM). The logic part has an N channel type field effect transistor (specifically, an N channel type MOS transistor, hereinafter referred to as N-type FET 120B) and a P channel type field effect transistor (specifically, a P channel type MOS transistor, hereinafter referred to as P-type FET 120A). The memory array part has an N channel type field effect transistor (specifically, an N channel type MOS transistor, hereinafter referred to as N-type FET 20B) and a P channel type field effect transistor (specifically, a P channel type MOS transistor, hereinafter referred to as P-type FET 20A). Now, the method of manufacturing a semiconductor integrated circuit in Example 1 will be described below, referring to FIG. 1A, FIGS. 2A and 2B, FIGS. 3A and 3B, FIGS. 4A and 4B, FIGS. 5A and 5B, FIGS. 6A and 6B, FIGS. 7A and 7B, FIGS. 8A and 8B, FIGS. 9A and 9B, and FIG. 10A, which are schematic partly end elevation diagrams of a semiconductor substrate and the like. Incidentally, the schematic partly end elevation diagrams in these drawings or in various drawings which are schematic partly end elevation diagrams of a semiconductor substrate and the like which will be described later are schematic partly end elevation diagrams taken along the dot-dash line in FIG. 1C. In addition, an equivalent circuit of a memory array part in Example 1 or in any of Examples 2 to 8 is shown in FIG. 1B, and a schematic layout diagram of a gate part and the like is shown in FIGS. 1C and 10B. Furthermore, in Example 1 or in any of Examples 2 to 8 which will be described later, a first insulation film and a third insulation film are each composed of a silicon nitride film (SiN film), and a second insulation film is composed of a silicon oxide film ($SiO_x$ film)

[Step 100]

First, based on a known method, a device separation region 11 having a trench structure is formed in a semiconductor substrate 10, then gate portions each composed of a gate insulation film 21, a gate electrode 22, and an offset film 23 are formed on the semiconductor substrate 10, thereafter gate side walls 24 are formed on side surfaces of the gate parts, and source/drain regions 25 are formed in the semiconductor substrate 10. Incidentally, the region between the two source/drain regions 25, of the semiconductor substrate 10 corresponds to a channel forming region. In this manner, a P-type FET 20A (see $TR_1$ and $TR_4$ in FIGS. 1B and 1C) and an N-type FET 20B (see $TR_2$, $TR_3$, $TR_5$, and $TR_6$ in FIGS. 1B and 1C) constituting a memory array part can be obtained (see FIG. 1A). Simultaneously, a P-type FET 120A and an N-type FET 120B constituting a logic part can be obtained.

[Step 110]

Figure 2A:
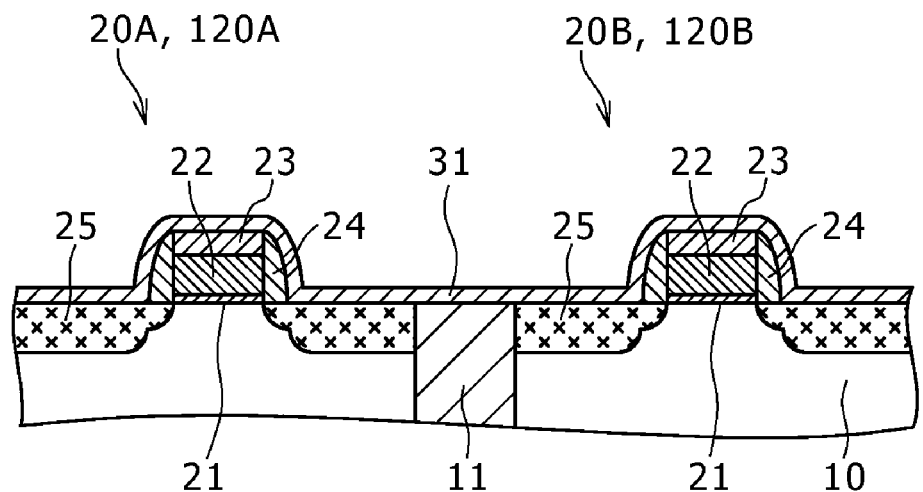
FIGS. 2A and 2B are schematic partly end elevation diagrams of the semiconductor substrate and the like for illustrating the method of manufacturing a semiconductor integrated circuit according to Example 1, following to FIG. 1A.
Figure 2B:
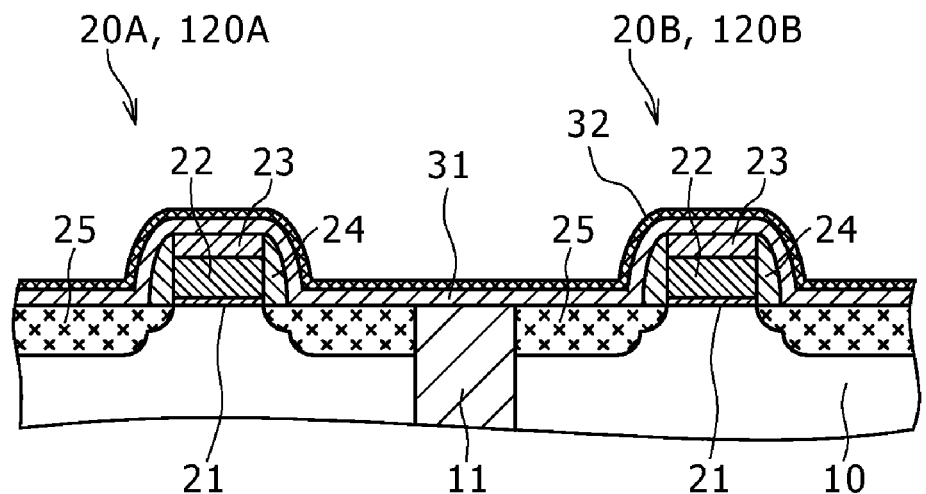
Figure 3A:
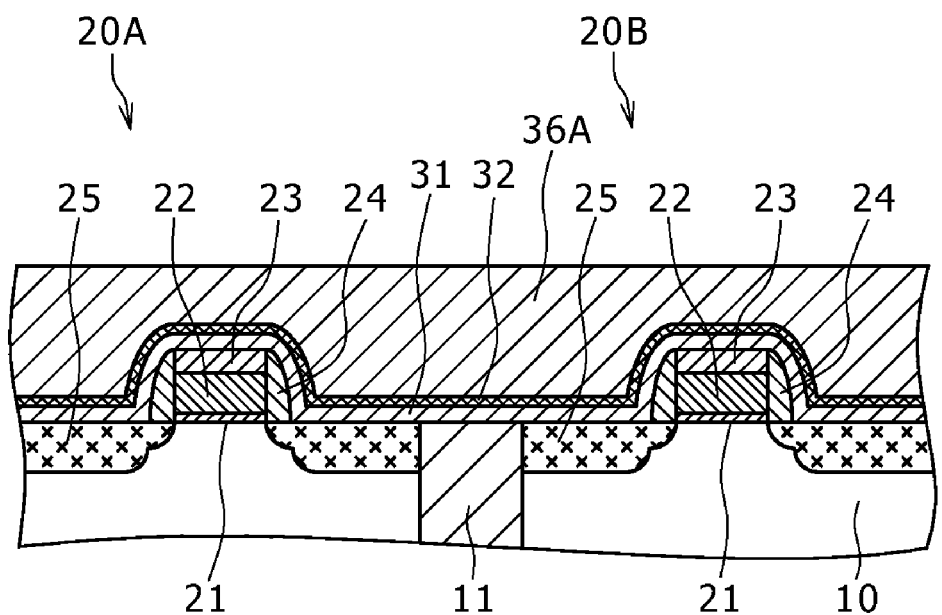
FIGS. 3A and 3B are schematic partly end elevation diagrams of the semiconductor substrate and the like for illustrating the method of manufacturing a semiconductor integrated circuit according to Example 1, following to FIG. 2B.
Figure 3B:
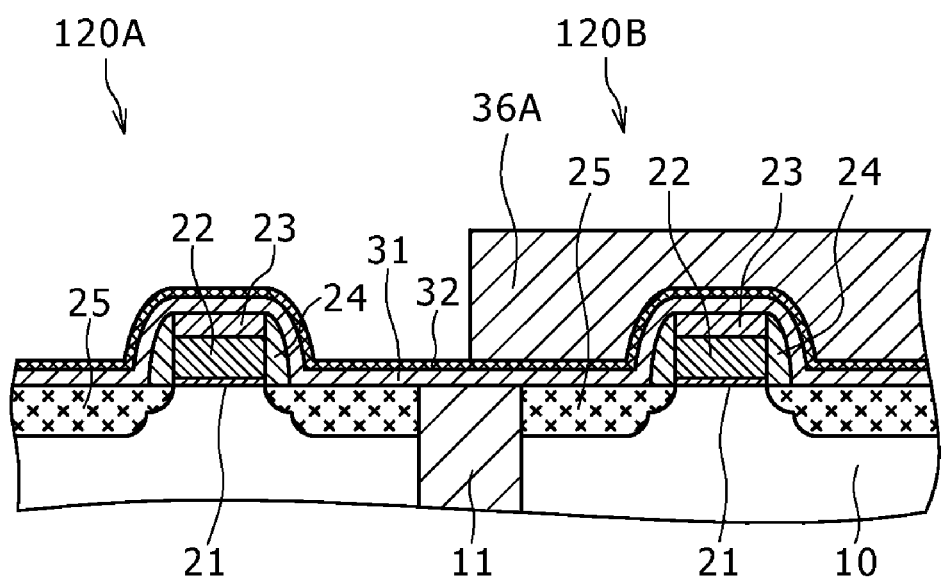
Figure 4A:
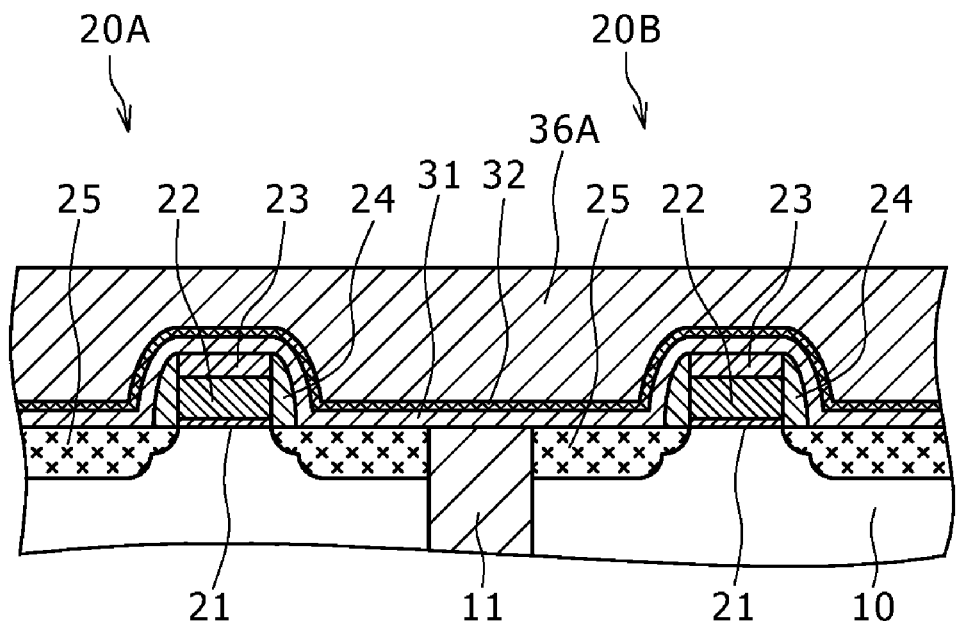
FIGS. 4A and 4B are schematic partly end elevation diagrams of the semiconductor substrate and the like for illustrating the method of manufacturing a semiconductor integrated circuit according to Example 1, following to FIGS. 3A and 3B.
Figure 4B:
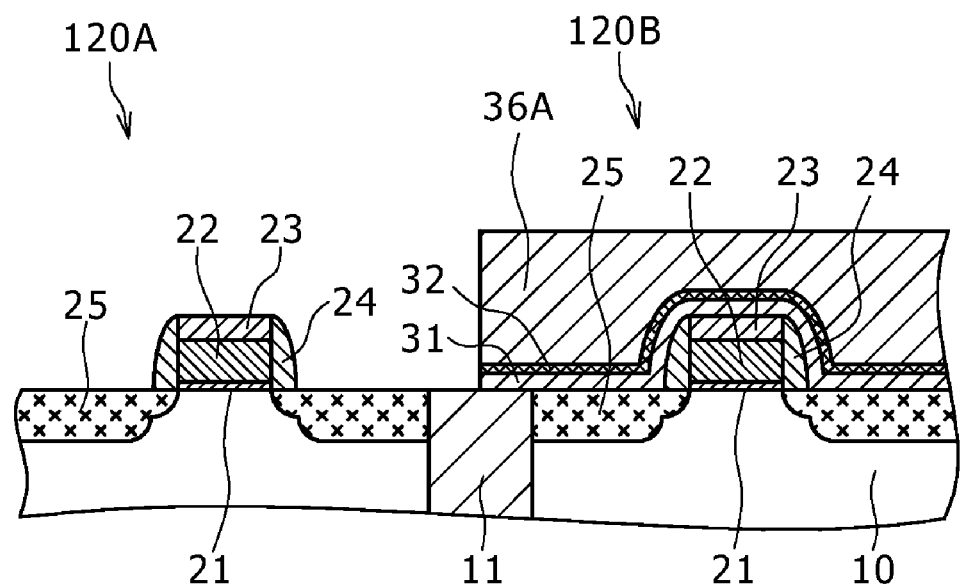
Figure 5A:
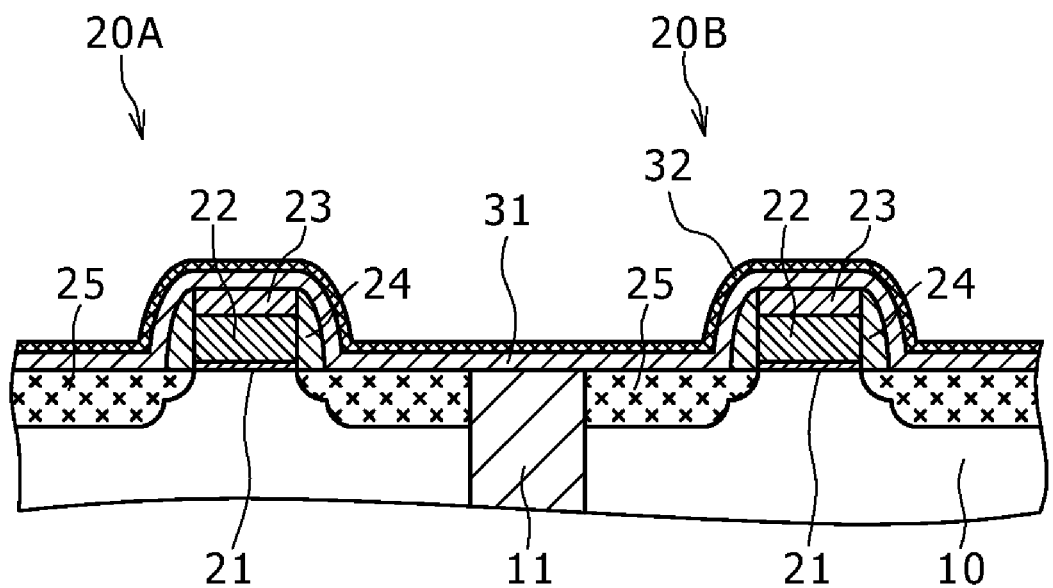
FIGS. 5A and 5B are schematic partly end elevation diagrams of the semiconductor substrate and the like for illustrating the method of manufacturing a semiconductor integrated circuit according to Example 1, following to FIGS. 4A and 4B.
Figure 5B:
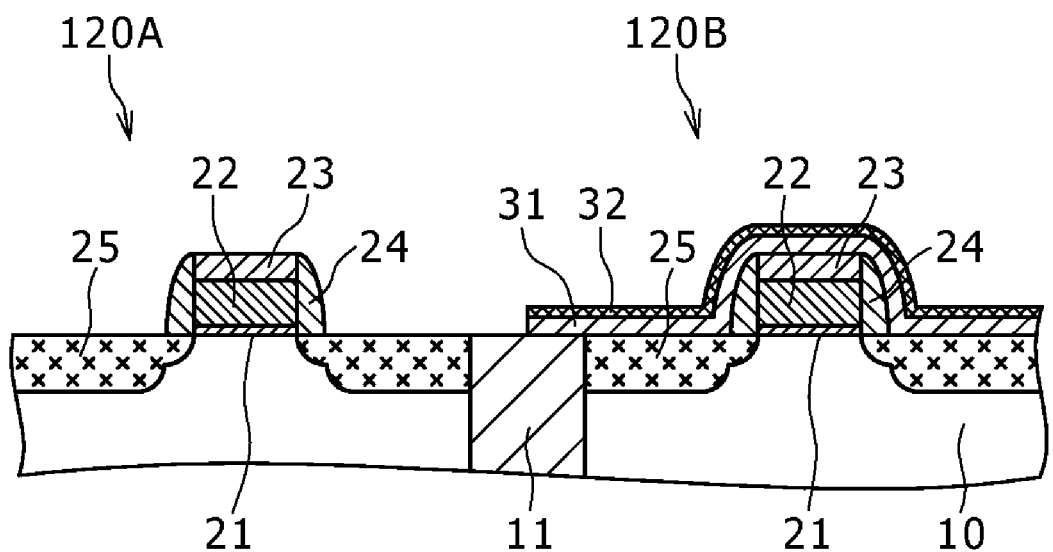

Next, for example based on a plasma CVD process (film forming temperature: 400° C.), a first insulation film 31 composed of a 50 nm thick silicon nitride film and having a tensile stress ($1.0 \times 10^9$ to $2.0 \times 10^9$ Pa) is formed on the whole surface (see FIG. 2A), and, based on an atmospheric pressure $O_3$-TEOS-CVD process (film forming temperature: 500° C.), a second insulation film 32 composed of a 30 nm thick silicon oxide film is formed on the first insulation film 31 (see FIG. 2B).

[Step 120]

Thereafter, the second insulation film 32 and the first insulation film 31 present on the upper side of the region of the P-type FET 120A constituting the logic part is selectively removed. Specifically, based on a known lithographic technique, a resist layer 36A covering the region of the P-type FET 20A and the N-type FET 20B constituting the memory array part are formed and the region of the N-type FET 120B constituting the logic part is formed (see FIGS. 3A and 3B), the second insulation film 32 exposed in the region of the P-type FET 120A not covered with the resist layer 36A and the first insulation film 31 thereunder are removed by a dry etching process (see FIGS. 4A and 4B), and the resist layer 36A is removed based on an ashing treatment (see FIGS. 5A and 5B).

[Step 130]

Figure 6A:
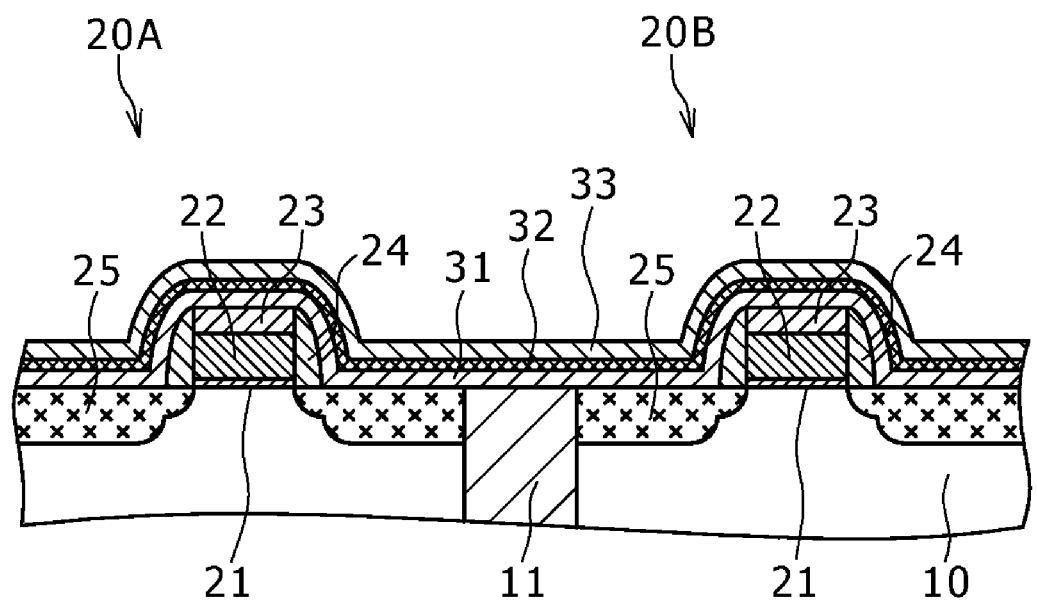
FIGS. 6A and 6B are schematic partly end elevation diagrams of the semiconductor substrate and the like for illustrating the method of manufacturing a semiconductor integrated circuit according to Example 1, following to FIGS. 5A and 5B.
Figure 6B:
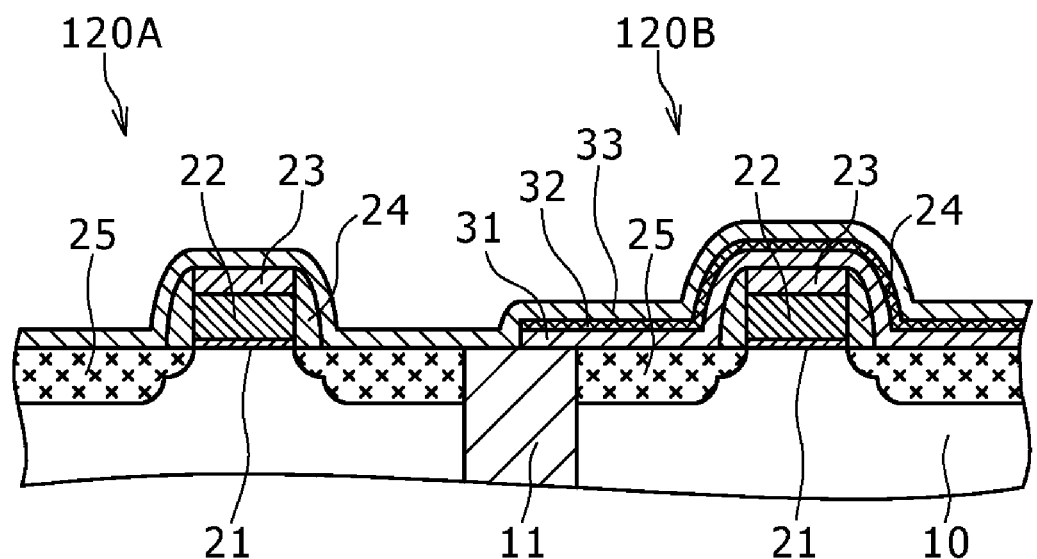
Figure 7A:
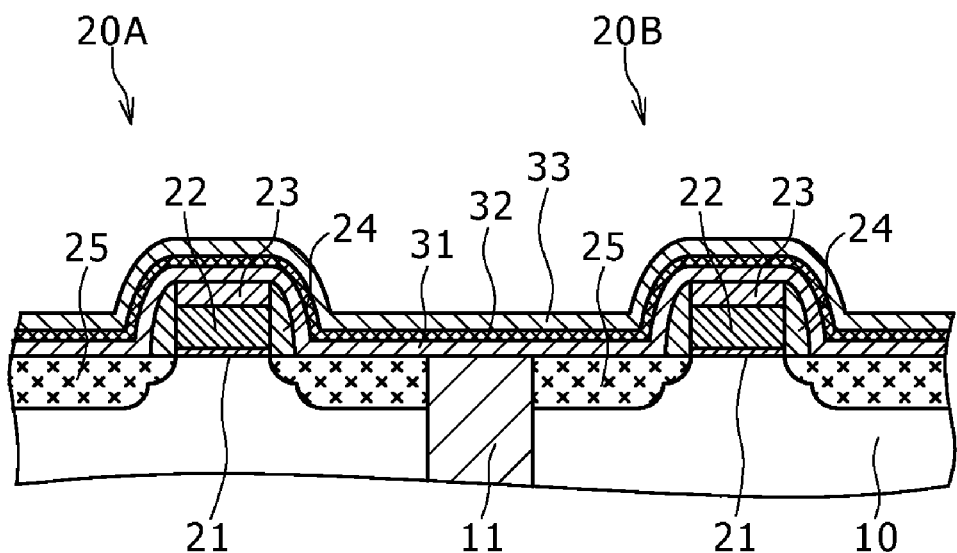
FIGS. 7A and 7B are schematic partly end elevation diagrams of the semiconductor substrate and the like for illustrating the method of manufacturing a semiconductor integrated circuit according to Example 1, following to FIGS. 6A and 6B.
Figure 7B:
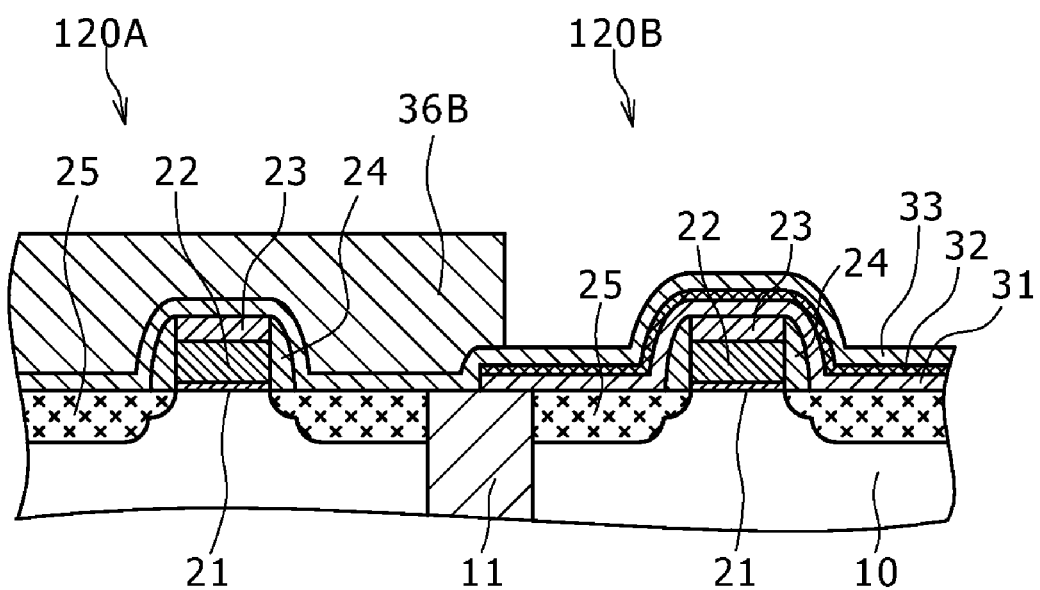
Figure 8A:
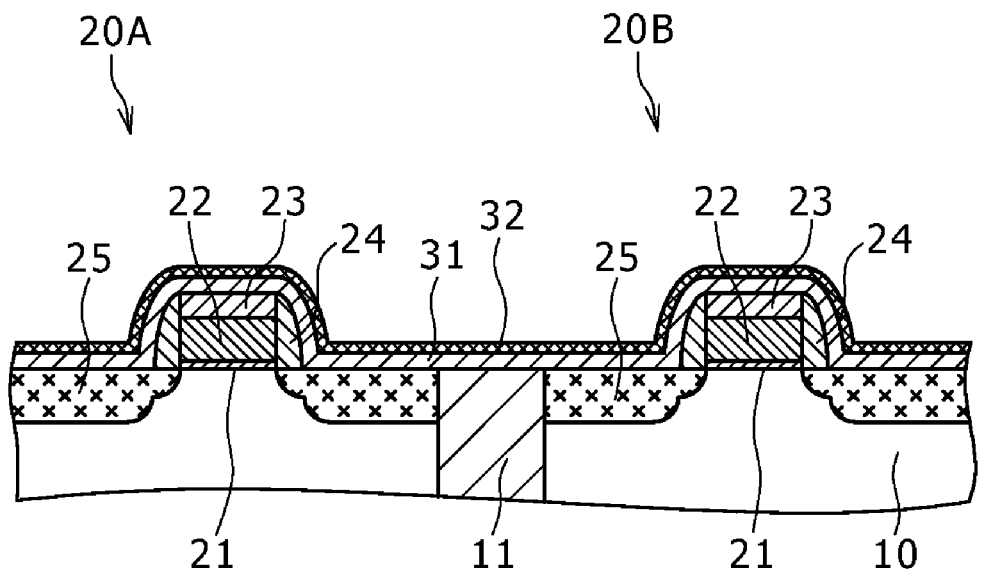
FIGS. 8A and 8B are schematic partly end elevation diagrams of the semiconductor substrate and the like for illustrating the method of manufacturing a semiconductor integrated circuit according to Example 1, following to FIGS. 7A and 7B.
Figure 8B:
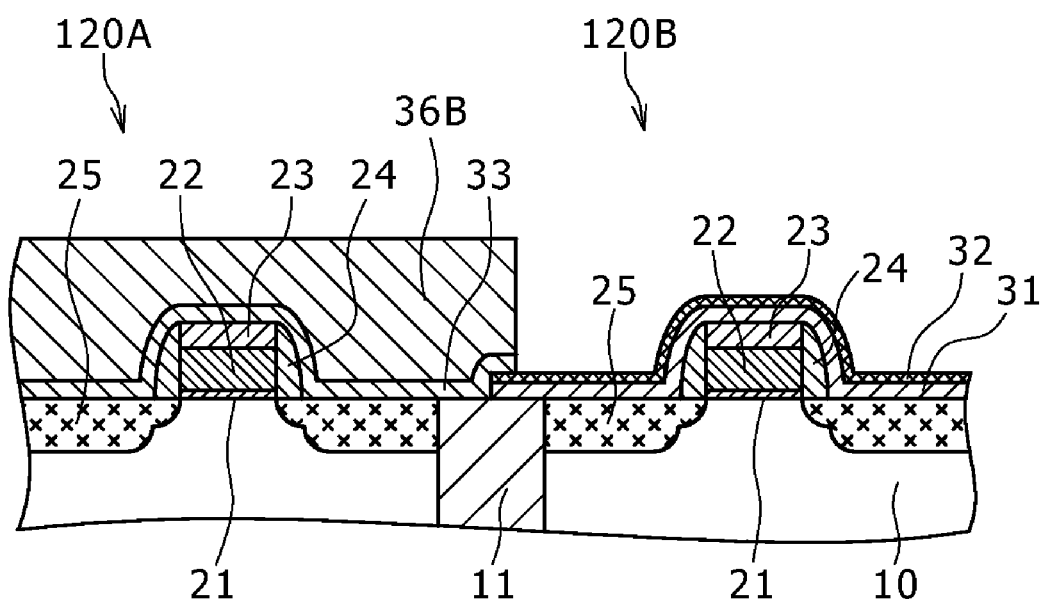
Figure 9A:
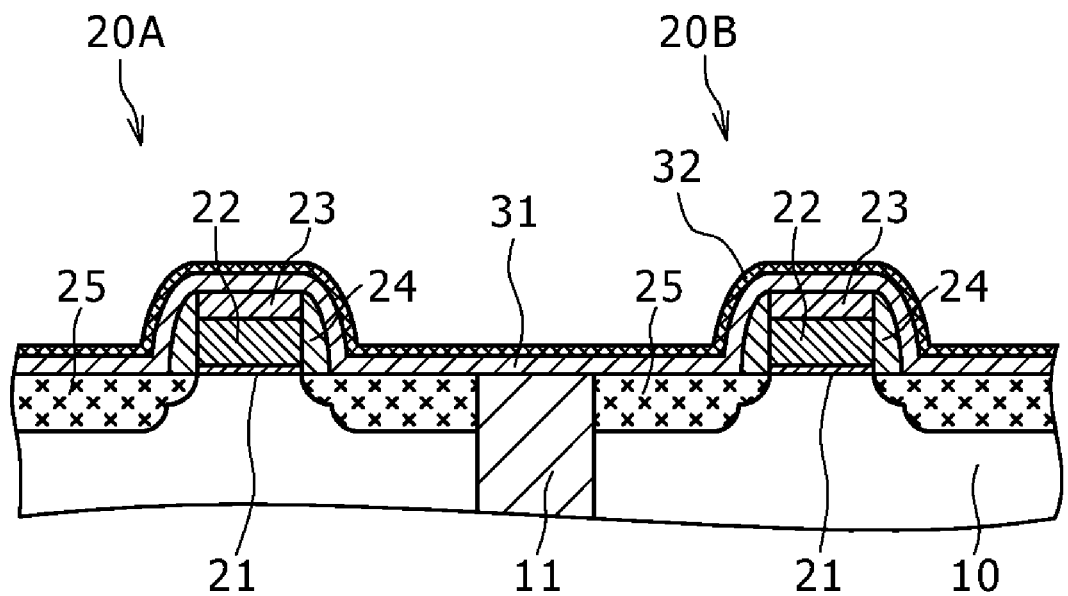
FIGS. 9A and 9B are schematic partly end elevation diagrams of the semiconductor substrate and the like for illustrating the method of manufacturing a semiconductor integrated circuit according to Example 1, following to FIGS. 8A and 8B.
Figure 9B:
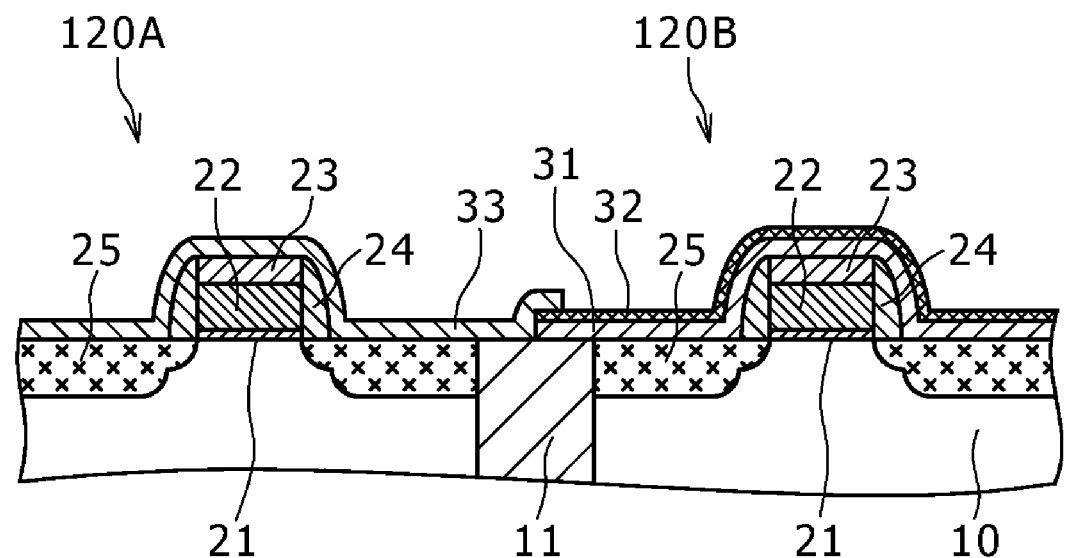

Next, for example based on a plasma CVD process (film forming temperature: 400° C.), a third insulation film 33 composed of a 50 nm thick silicon nitride film and having a compressive stress ($1.0 \times 10^9$ to $2.0 \times 10^9$ Pa) is formed on the whole surface (see FIGS. 6A and 6B).

[Ste 140]

Thereafter, the third insulation film 33 present on the upper side of the region of the N-type FET 120B constituting the logic part and the third insulation film 33 present on the upper side of the regions of the N-type FET 20B and the P-type FET 20A which constitute the memory array part are selectively removed. Specifically, based on a known lithographic technique, a resist layer 36B covering the region of the P-type FET 120A is formed (see FIGS. 7A and 7B), the third insulation film 33 exposed in the regions of the P-type FET 20A and the N-type FET 20B constituting the memory array part and the N-type FET 120B constituting the logic part, which are not covered with the resist layer 36B, are removed by a dry etching process (see FIGS. 8A and 8B), and then the resist layer 36B is removed based on an ashing treatment (see FIGS. 9A and 9B). Since the second insulation film 32 composed of the silicon oxide film is provided as an etching stopper layer, at the time of removing the third insulation film 33 in the logic part, the third insulation film 33 is dry etched so as to obtain a three-layer structure of the first insulation film 31, the second insulation film 32 and the third insulation film 33 in such a manner that the semiconductor substrate 10 and the like would not be exposed, in the boundary region between the first insulation film 31 and the third insulation film 33. When such a structure is formed in the memory array part, the above-mentioned problems would be generated, but, in the logic part, such a structure can be formed without generating serious problems.

[Step 150]

Figure 10A:
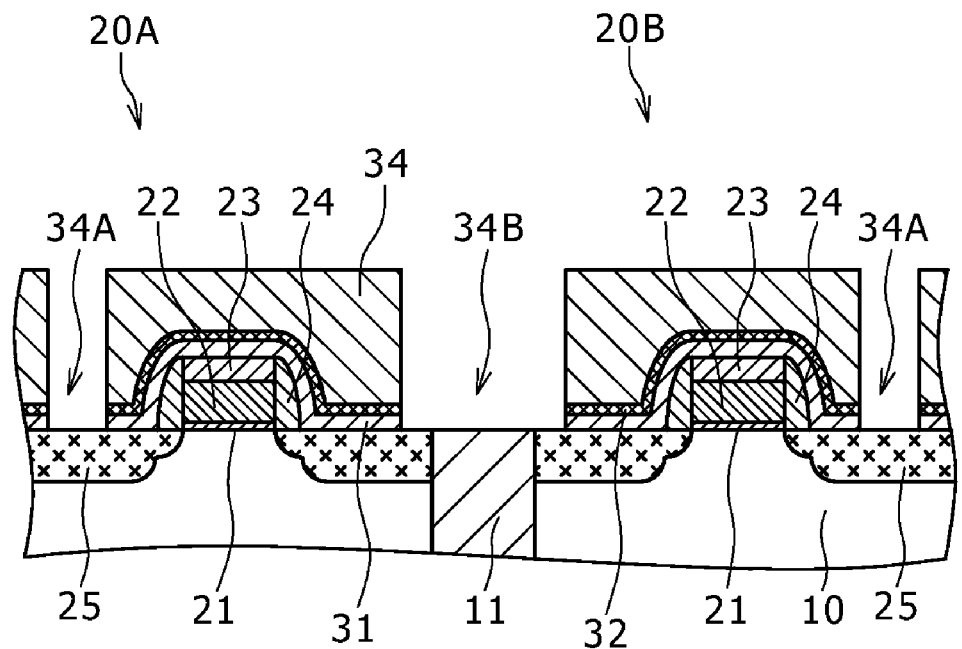
FIG. 10A is a schematic partly end elevation diagram of the semiconductor substrate and the like for illustrating the method of manufacturing a semiconductor integrated circuit according to Example 1, following to FIG. 9A.
Figure 10B:
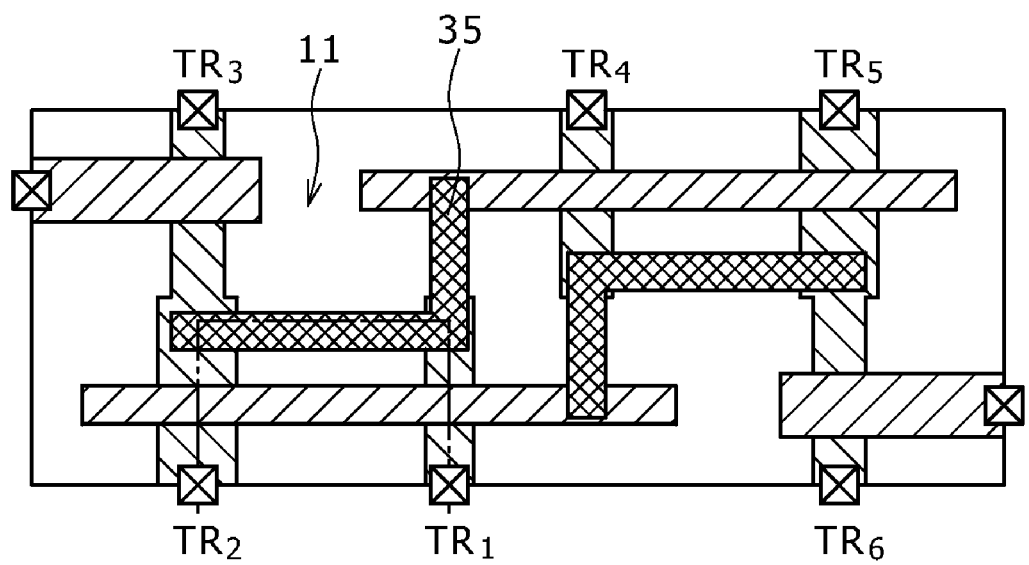
FIG. 10B is a schematic layout diagram of the semiconductor integrated circuit according to Example 1 shown in FIG. 1A.

Next, a layer insulation layer 34 and a resist layer (not shown) are formed on the whole surface, then the layer insulation layer 34 is dry etched by using the resist layer as an etching mask, whereby openings 34A for forming contact holes and an opening 34B for forming a local interconnect 35 (see the schematic layout diagram in FIG. 10B) are formed in the layer insulation layer 34, and thereafter the resist layer is removed (see FIG. 10A). Subsequently, a wiring material layer is formed on the layer insulation layer 34 inclusive of the openings 34A and 34B, and the wiring material layer on the layer insulation layer 34 is patterned, whereby a wiring layer can be formed on the layer insulation layer 34, and, simultaneously, the contact holes and the local interconnect 35 can be formed.

In the P-type FET 20A and the N-type FET 20B constituting the memory array part obtained in Example 1 in this manner, the first insulation film 31 having a tensile stress and the second insulation film 32 are formed on the upper side of the regions of the P-type FET 20A and the N-type FET 20B. With such a structure adopted, it is possible to contrive enhancement of the performance of the N-type FET 20B constituting the memory array part, and a lowering in the cell current determining the SRAM reading speed is obviated. Incidentally, in Example 1, the third insulation film 33 having a compressive stress is not formed on the upper side of the region of the P-type FET 20A constituting the memory array part, so that it is impossible to contrive enhancement of the performance of the P-type FET 20A; however, the difficulties in processing at the time of forming an opening for forming the local interconnect in the layer insulation film can be obviated. Besides, in each of the steps, basically, the regions of the P-type FET 20A and the N-type FET 20B constituting the memory array part are continuedly covered with the first insulation film 31, and, therefore, there would not arise the problem that the MOS transistors constituting the memory array part are damaged, with the result of deterioration of memory retention characteristics.

EXAMPLE 2

Figure 11:
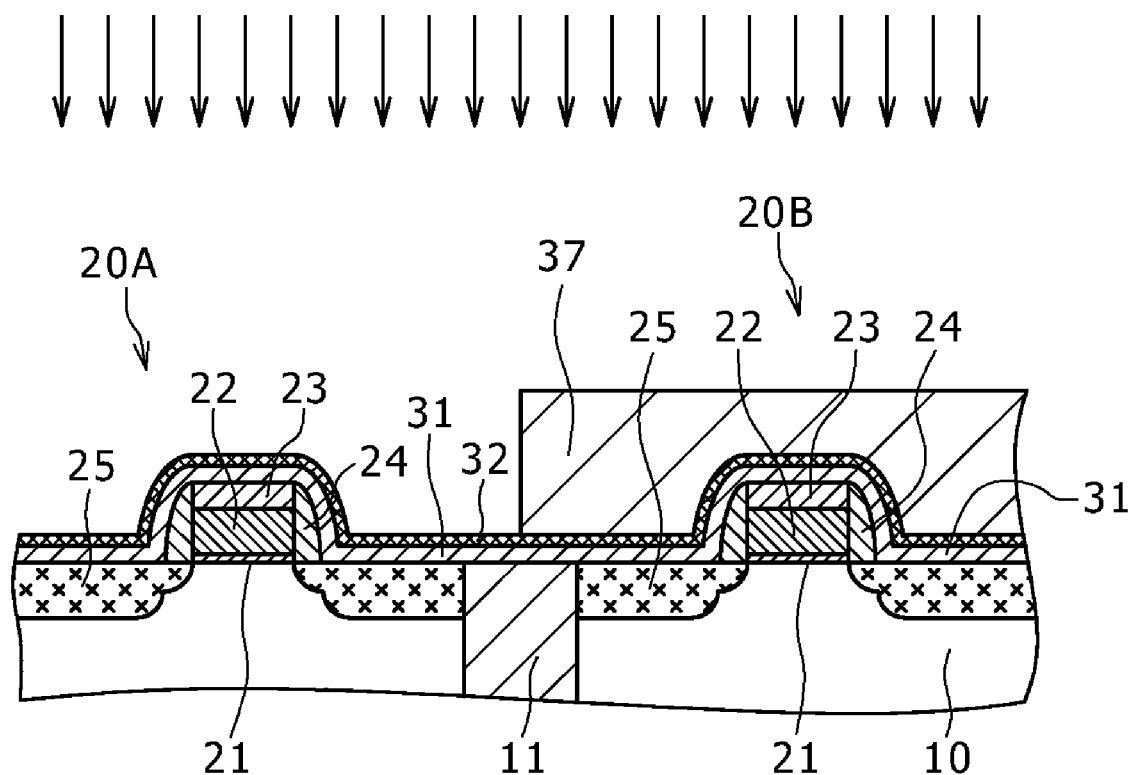
FIG. 11 is a schematic partly end elevation diagram of a semiconductor substrate and the like for illustrating a method of manufacturing a semiconductor integrated circuit according to Example 2.
Figure 12A:
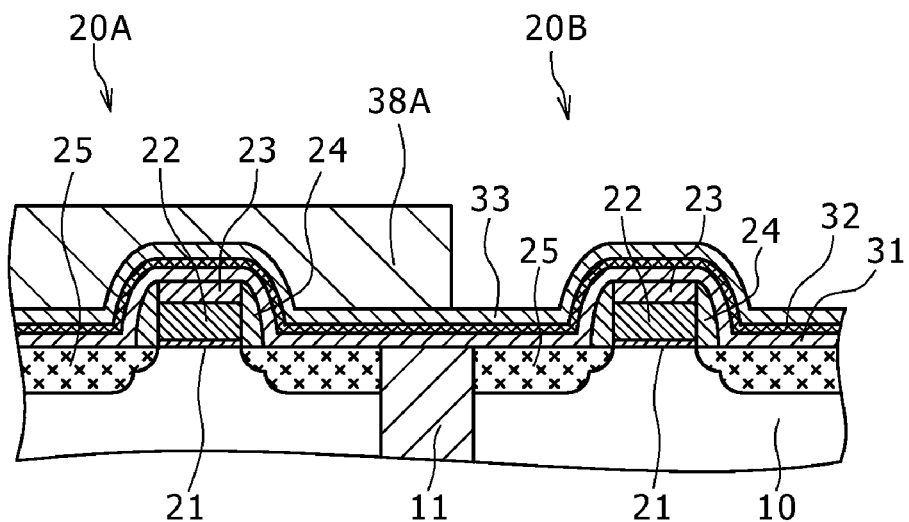
FIGS. 12A and 12B are schematic partly end elevation diagrams of the semiconductor substrate and the like for illustrating the method of manufacturing a semiconductor integrated circuit according to Example 3.
Figure 12B:
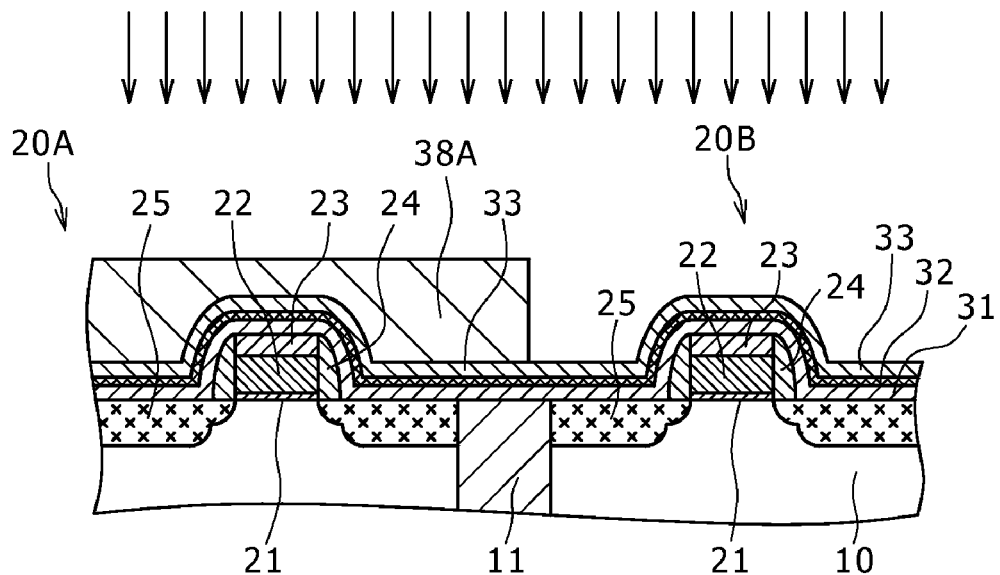
Figure 13A:
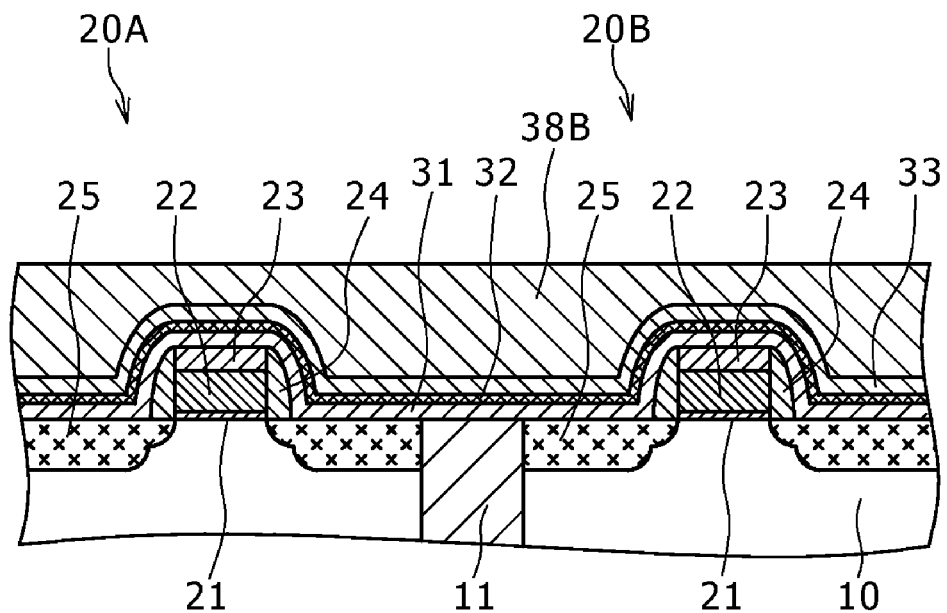
FIGS. 13A and 13B are schematic partly end elevation diagrams of the semiconductor substrate and the like for illustrating the method of manufacturing a semiconductor integrated circuit according to Example 3, following to FIG. 12B.
Figure 13B:
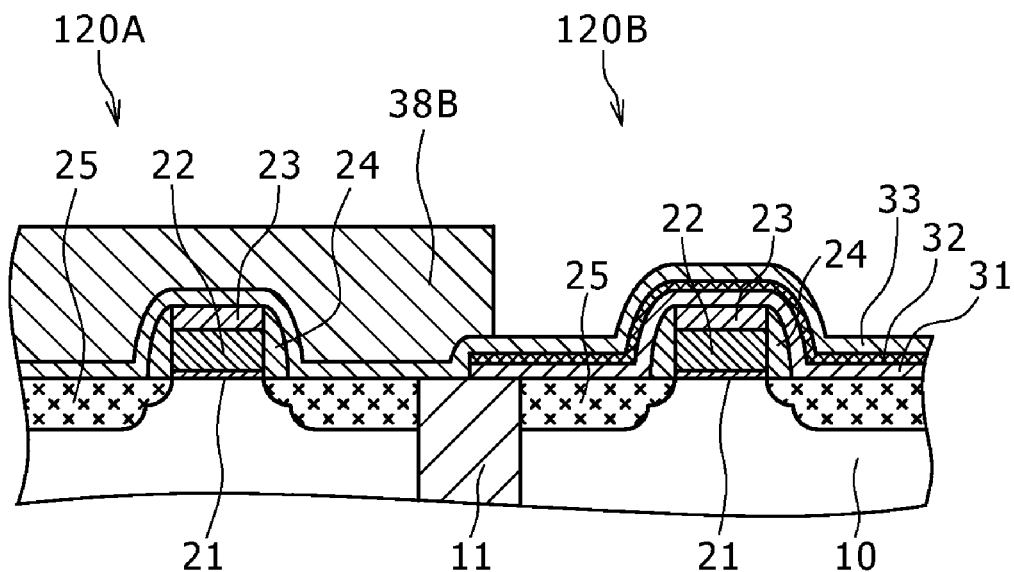
Figure 14A:
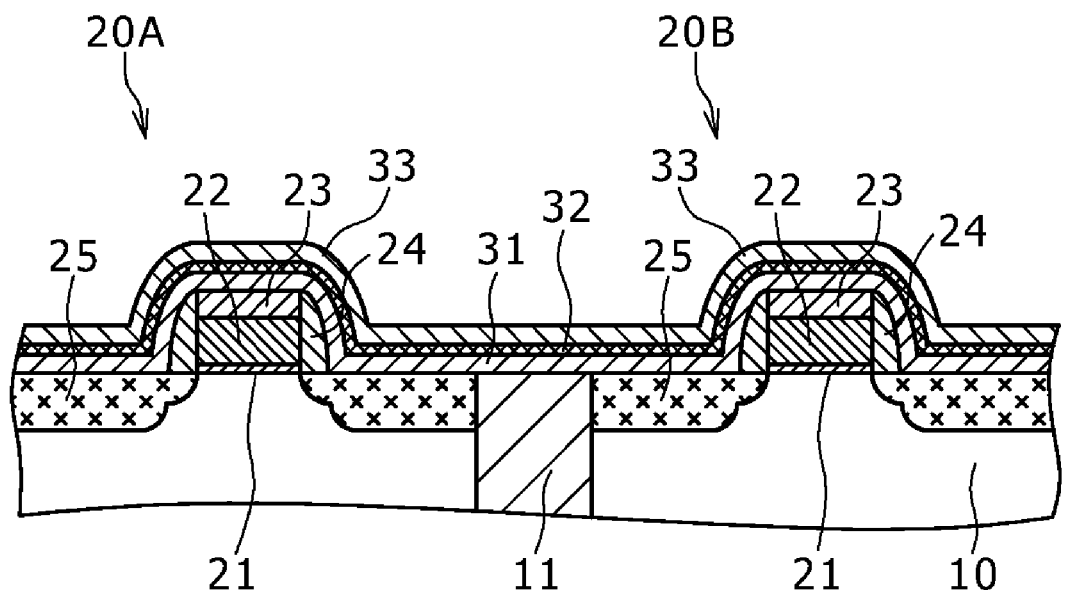
FIGS. 14A and 14B are schematic partly end elevation diagrams of the semiconductor substrate and the like for illustrating the method of manufacturing a semiconductor integrated circuit according to Example 3, following to FIGS. 13A and 13B.
Figure 14B:
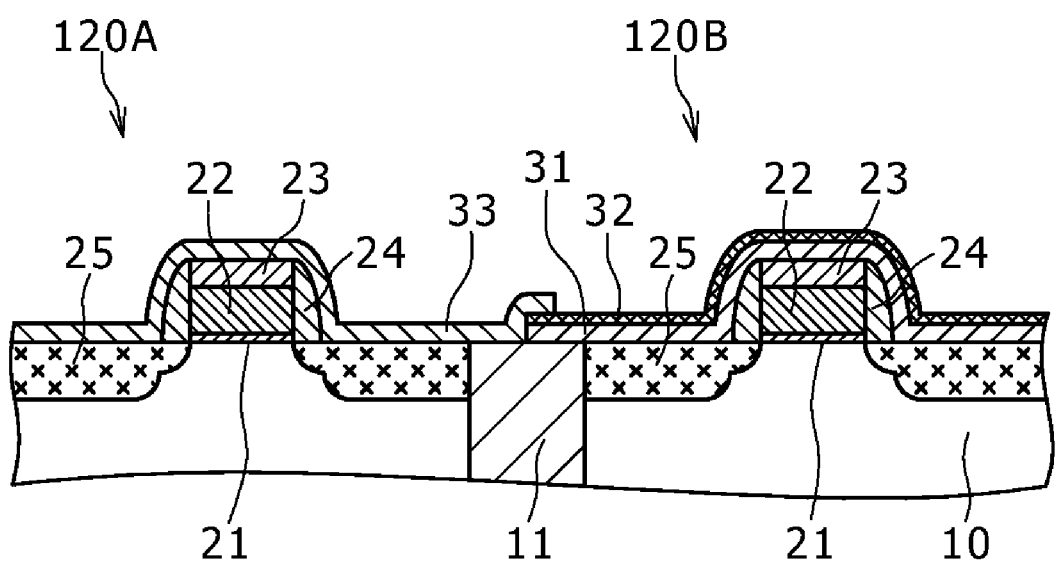

Example 2 is a modification of the method of manufacturing a semiconductor integrated circuit of Example 1. In Example 2, following to Step 140, ion implantation for relaxation of tensile stress is applied to the first insulation film 31 present on the region of the P-type FET 20A constituting the memory array part. Specifically, based on a known lithographic technique, a resist layer 37 covering the regions of the N-type FET 20B constituting the memory array part and the P-type FET 120A and the N-type FET 120B which constitute the logic part is formed, and ion implantation is applied to the first insulation film 31 exposed in the region of the P-type FET 20A constituting the memory array part which region is not covered with the resist layer 37 (see FIG. 11). The conditions of the ion implantation are exemplified in Table 1 below. Incidentally, the ion implantation exerts no influence on the source/drain regions 25 of the P-type FET 20A constituting the memory array part.

TABLE 1

| Ion species | Germanium (Ge) |
|---|---|
| Acceleration voltage | 50 keV |
| Dose | $3 \times 10^{15}/cm^2$ |

By this, the tensile stress on the first insulation film 31 which is formed on the region of the P-type FET 20A constituting the memory array part and which has a tensile stress is relaxed, so that it is possible to further enhance the performance of the P-type FET 20A, as compared with Example 1.

Incidentally, the step of applying the ion implantation for relaxation of tensile stress to the first insulation film 31 on the region of the P-type FET 20A constituting the memory array part may be carried out following to Step 140 in this manner, or may be carried out in any step after the formation of the first insulation film 31 and before the formation of the layer insulation layer 34.

EXAMPLE 3

Example 3 relates to a method of manufacturing a semiconductor integrated circuit according to a second embodiment of the present invention. Now, the method of manufacturing a semiconductor integrated circuit in Example 3 will be described below, referring to FIGS. 12A and 12B, FIGS. 13A and 13B, and FIGS. 14A and 14B, which are schematic partly end elevation diagrams of a semiconductor substrate and the like.

[Step 300]

First, in the same manner as in Steps 100 and 110, gate parts, channel forming regions and source/drain regions of an N-type FET 120B and a P-type FET 120A which constitute a logic part and gate parts, channel forming regions and source/drain regions of an N-type FET 20B and a P-type FET 20A which constitute a memory array part are formed in a semiconductor substrate 10, then a first insulation film 31 having a tensile stress is formed on the whole surface, and a second insulation film 32 is formed on the first insulation film 31. Thereafter, in the same manner as in Steps 120 and 130, the second insulation film 32 and the first insulation film 31 present on the upper side of the region of the P-type FET 20A constituting the logic part are selectively removed, and a third insulation film 33 having a compressive stress is formed on the whole surface.

[Step 310]

Next, ion implantation for relaxation of compressive stress is applied to the third insulation film 33 present on the upper side of the region of the N-type FET 20B constituting the memory array part. Specifically, based on a known lithographic technique, a resist layer 38A covering the regions of the P-type FET 20A constituting the memory array part and the P-type FET 120A constituting the logic part is formed (see FIG. 12A), ion implantation is applied to the third insulation film 33 exposed in the region of the N-type FET 20B constituting the memory array part which region is not covered with the resist layer 38A, ion implantation is applied also to the third insulation film 33 exposed in the region of the N-type FET 120B constituting the logic part which region is not covered with the resist layer 38A (see FIG. 12B), and the resist layer 38A is removed based on an ashing treatment. The conditions of ion implantation may be the same as exemplified in Table 1 above. Incidentally, the ion implantation has no influence on the tensile stress on the first insulation film 31 on the N-type FETs 20B and 120B constituting the memory array part and the logic part, respectively. Here, a method may be adopted in which the resist layer 38A covering the region of the N-type FET 120B constituting the logic part is formed, and ion implantation is not applied to the third insulation film 33 in the region of the N-type FET 120B.

[Step 320]

Thereafter, the third insulation film 33 present on the upper side of the region of the N-type FET 120B constituting the logic part is selectively removed. Specifically, based on a known lithographic technique, a resist layer 38B covering the regions of the P-type FET 20A and the N-type FET 20B which constitute the memory array part and the P-type FET 120A constituting the logic part is formed (see FIGS. 13A and 13B), then the third insulation film 33 exposed in the region of the N-type FET 120B constituting the logic part which region is not covered with the resist layer 38B is removed by a dry etching process, and thereafter the resist layer 38B is removed based on an ashing treatment (see FIGS. 14A and 14B). Since the second insulation film 32 composed of the silicon oxide film is present as an etching stopper layer, the third insulation film 33 can be securely removed by the dry etching process. Incidentally, the third insulation film 33 is dry etched so as to obtain a three-layer structure of the first insulation film 31, the second insulation film 32 and the third insulation film 33 so that the semiconductor substrate 10 and the like would not be exposed in the boundary region between the first insulation film 31 and the third insulation film 33, at the time of removing the third insulation film 33, in the logic part. When such a structure is formed in the memory array part, the above-mentioned problems would be generated, but, in the logic part, such a structure can be formed without generating serious problems.

[Step 330]

Next, the same step as Step 150 in Example 1 is carried out, whereby a semiconductor integrated circuit can be obtained.

In the P-type FET 20A and the N-type FET 20B which constitute the memory array part obtained in Example 3 in this manner, the first insulation film 31 having a tensile stress, the second insulation film 32 and the third insulation film 33 having a compressive stress are formed, and the compressive stress is relaxed in the third insulation film 33 having a compressive stress which is formed on the region of the N-type FET 20B. With such a structure adopted, it is possible to contrive enhancement of the performance of the N-type FET 20B constituting the memory array part, and a lowering in the cell current determining the SRAM reading speed is obviated. Incidentally, in Example 3, though the third insulation film 33 having a compressive stress is formed on the upper side of the region of the P-type FET 20A constituting the memory array part, the first insulation film 31 having a tensile stress is formed on the lower side thereof, so that it is impossible to contrive enhancement of the performance of the P-type FET 20A; however, difficulties in processing for forming an opening for forming a local interconnect in the layer insulation layer can be obviated. Besides, in each of the steps, basically, the regions of the P-type FET 20A and the N-type FET 20B which constitute the memory array part are continuedly covered with the first insulation film 31, so that there would not arise the problem that the MOS transistors constituting the memory array part are damaged, with the result of deterioration of memory retention characteristics.

Incidentally, the step of applying the ion implantation for relaxation of compressive stress to the third insulation film 33 present on the upper side of the N-type FET 20B constituting the memory array part may be carried out in Step 310 in this manner, or may be carried out after Step 320. In other words, the ion implantation step may be carried out either after the formation of the third insulation film 33 or before the formation of the layer insulation layer 34.

EXAMPLE 4

Figure 15A:
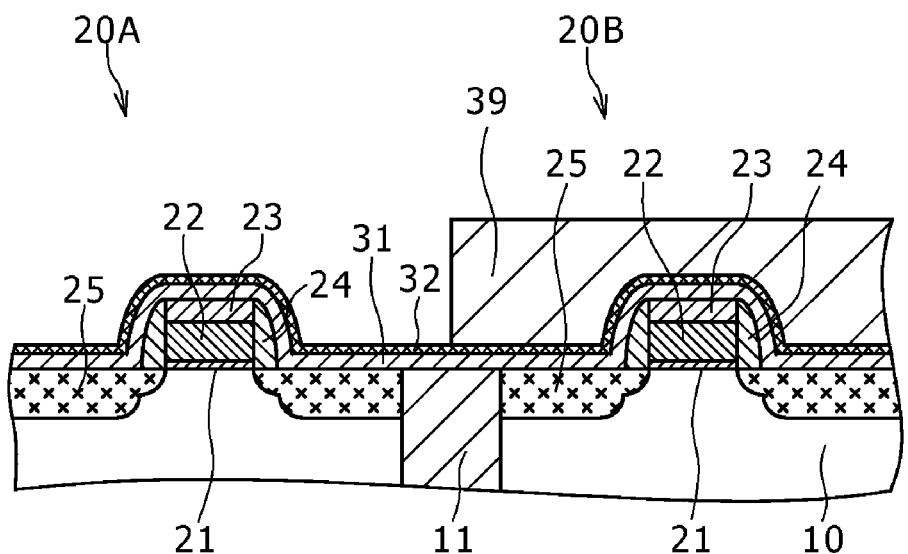
FIGS. 15A and 15B are schematic partly end elevation diagrams of a semiconductor substrate and the like for illustrating a method of manufacturing a semiconductor integrated circuit according to Example 4.
Figure 15B:
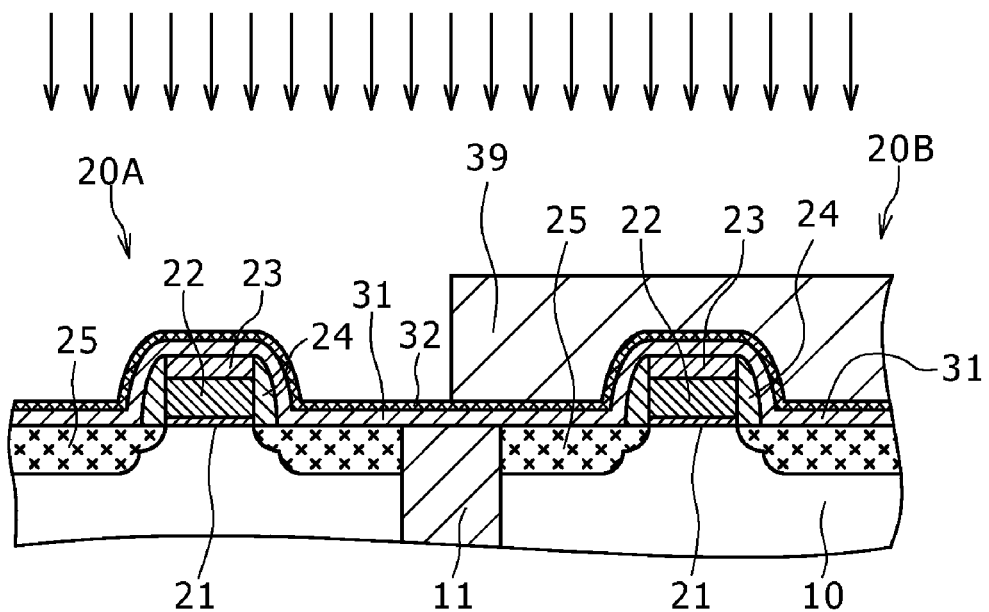
Figure 16A:
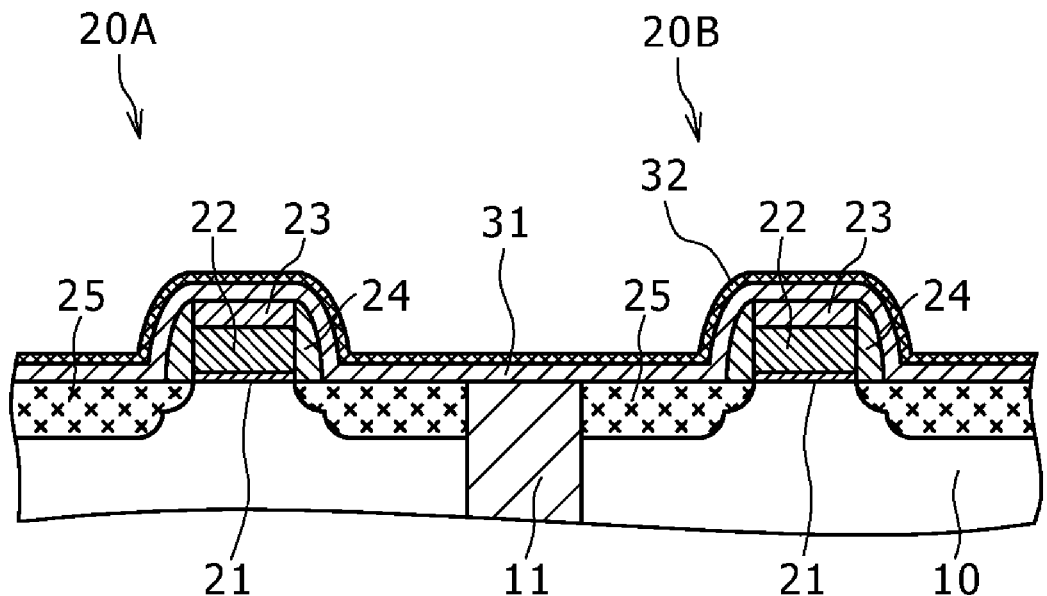
FIGS. 16A and 16B are schematic partly end elevation diagrams of a semiconductor substrate and the like for illustrating a method of manufacturing a semiconductor integrated circuit according to Example 5.
Figure 16B:
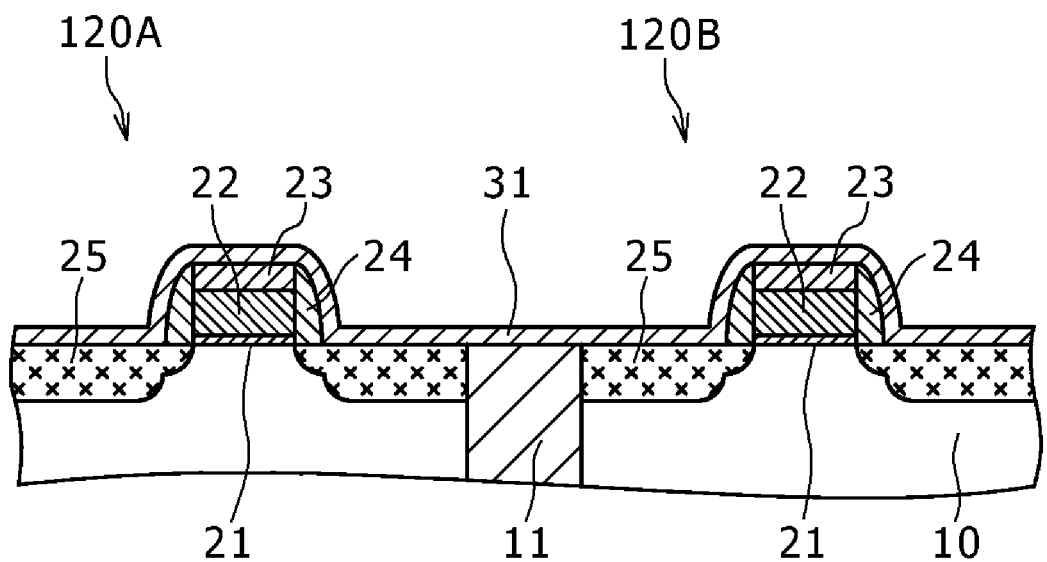
Figure 17A:
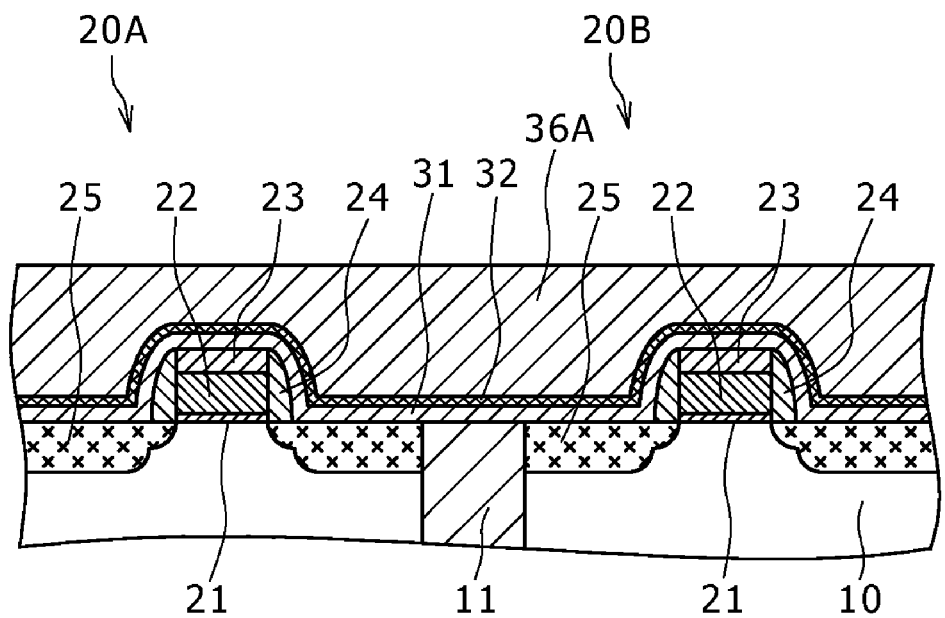
FIGS. 17A and 17B are schematic partly end elevation diagrams of the semiconductor substrate and the like for illustrating the method of manufacturing a semiconductor integrated circuit according to Example 5, following to FIGS. 16A and 16B.
Figure 17B:
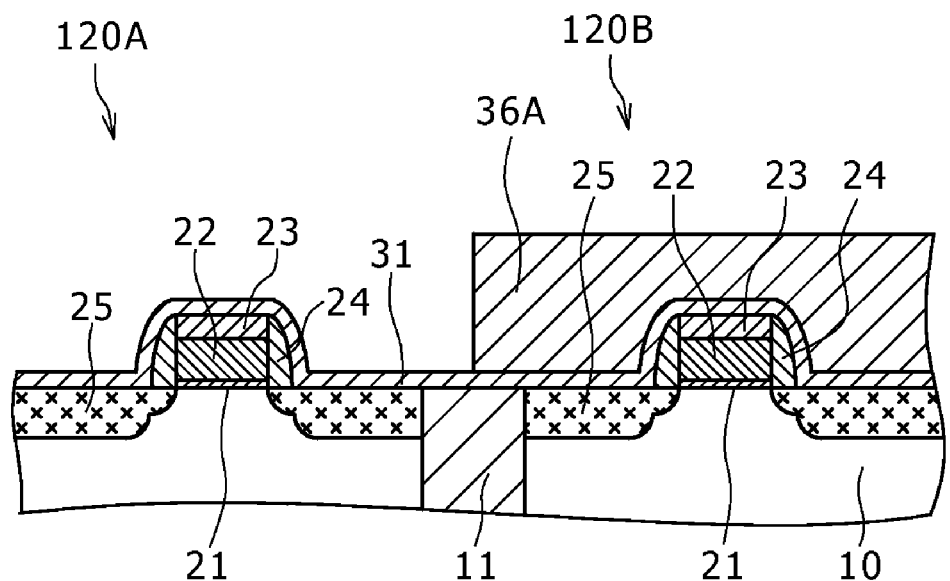
Figure 18A:
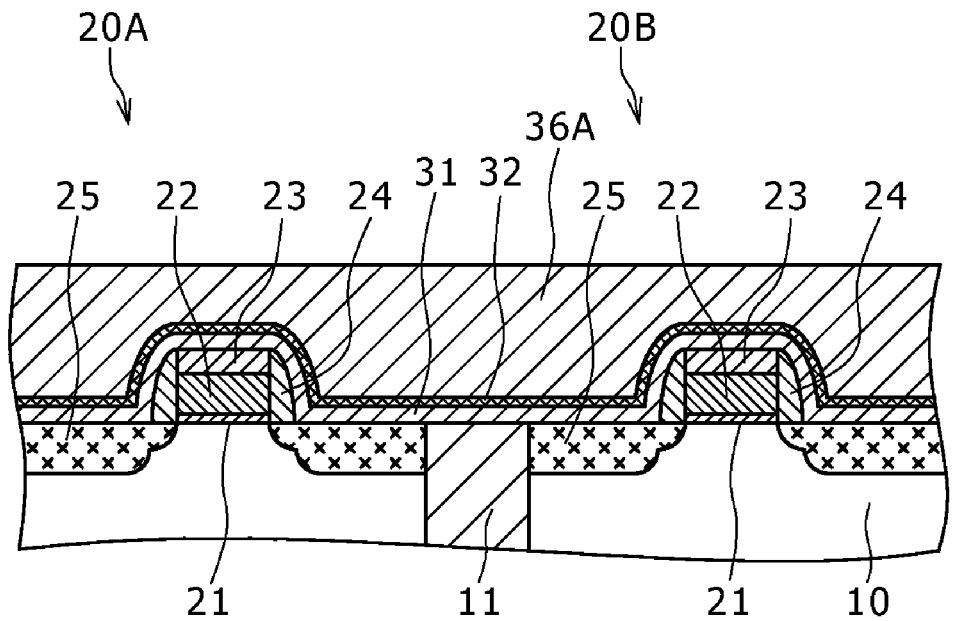
FIGS. 18A and 18B are schematic partly end elevation diagrams of the semiconductor substrate and the like for illustrating the method of manufacturing a semiconductor integrated circuit according to Example 5, following to FIGS. 17A and 17B.
Figure 18B:
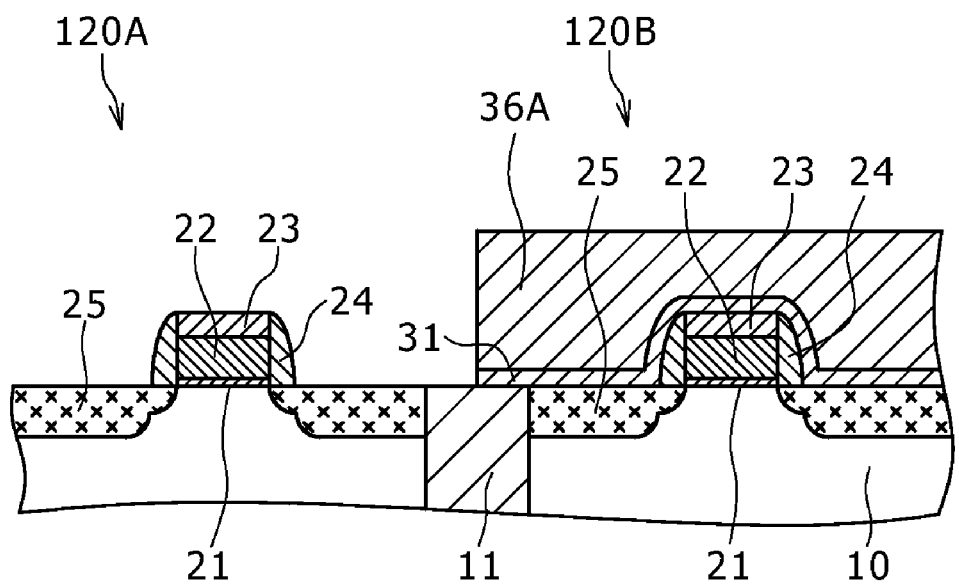
Figure 19A:
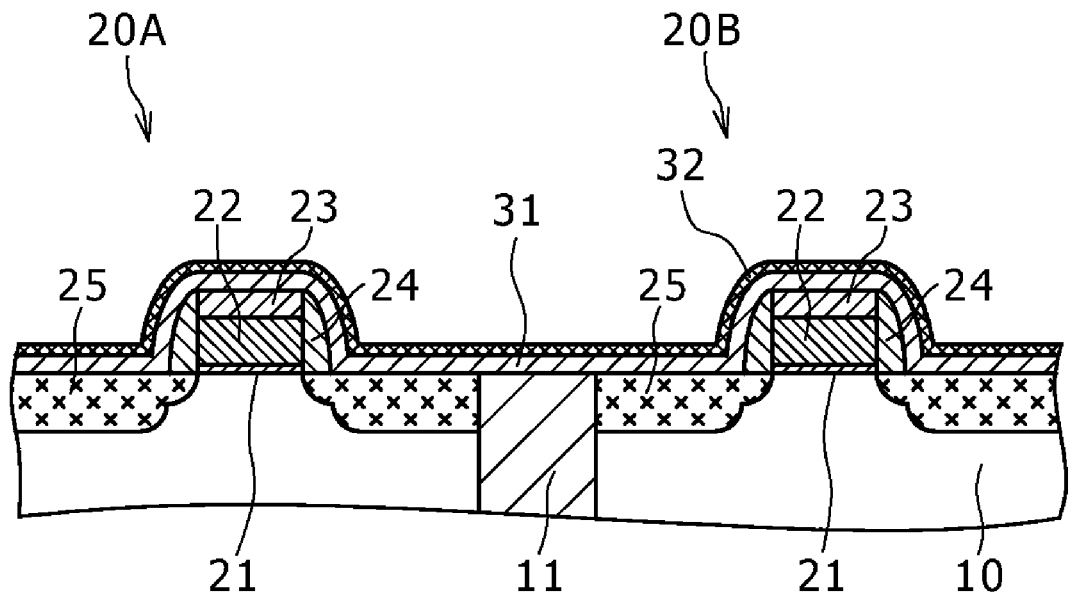
FIGS. 19A and 19B are schematic partly end elevation diagrams of the semiconductor substrate and the like for illustrating the method of manufacturing a semiconductor integrated circuit according to Example 5, following to FIGS. 18A and 18B.
Figure 19B:
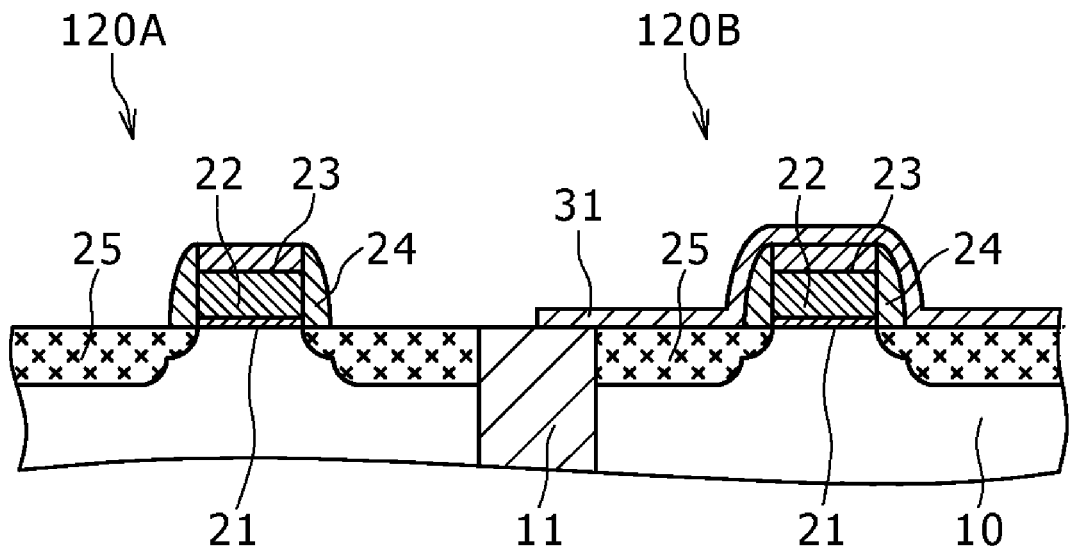

Example 4 is a modification of the method of manufacturing a semiconductor integrated circuit of Example 3. In Example 4, in Step 300 of Example 3 (to be more specific, after the formation of the first insulation film 31 and the second insulation film 32, or after the selective removal of the second insulation film 32 and the first insulation film 31 present on the upper side of the region of the P-type FET 120A constituting the logic part), ion implantation for relaxation of tensile stress is applied to the first insulation film 31 on the region of the P-type FET 20A constituting the memory array part. Specifically, based on a known lithographic technique, a resist layer 39 covering the regions of the N-type FET 20B constituting the memory array part and the N-type FET 120B constituting the logic part is formed (see FIG. 15A), ion implantation is applied to the first insulation film 31 exposed in the region of the P-type FET 20A constituting the memory array part which region is not covered with the resist layer 39 (see FIG. 15B), and ion implantation is applied also to the first insulation film 31 exposed in the region of the P-type FET 120A constituting the logic part which region is not covered with the resist layer 39. The ion implantation conditions may be the same as exemplified in Table 1 above. Incidentally, a method may be adopted in which the resist layer 39 covering the region of the P-type FET 120A constituting the logic part is formed, and the ion implantation for relaxation of tensile stress is not applied to the first insulation film 31 present on the region of the P-type FET 120A constituting the logic part.

By this, the tensile stress on the first insulation film 31 which is formed on the region of the P-type FET 20A constituting the memory array part and which has a tensile stress is relaxed, so that a further enhancement of the performance of the P-type FET 20A can be contrived, as compared with Example 3.

EXAMPLE 5

Example 5 relates to a method of manufacturing a semiconductor integrated circuit according to a third embodiment of the present invention. Now, the method of manufacturing a semiconductor integrated circuit in Example 5 will be described below, referring to FIGS. 16A and 16B, FIGS. 17A and 17B, FIGS. 18A and 18B, FIGS. 19A and 19B, FIGS. 20A and 20B, FIGS. 21A and 21B, FIGS. 22A and 22B, and FIGS. 23A and 23B, which are schematic partly end elevation diagrams of a semiconductor substrate and the like.

[Step 500]

First, in the same manner as in Steps 100 and 110 of Example 1, gate parts, channel forming regions and source/drain regions of an N-type FET 120B and a P-type FET 120A which constitute a logic part, and gate parts, channel forming regions and source/drain regions of an N-type FET 20B and a P-type FET 20A which constitute a memory array part are formed in a semiconductor substrate 10, then a first insulation film 31 having a tensile stress is formed on the whole surface, and a second insulation film 32 is formed on the first insulation film 31.

[Step 510]

Thereafter, the second insulation film 32 on the regions of the N-type FET 120B and the P-type FET 120A which constitute the logic part is selectively removed. Specifically, based on a known lithographic technique, a resist layer (not shown) covering the regions of the P-type FET 20A and the N-type FET 20B which constitute the memory array part is formed, then the second insulation film 32 exposed in the regions of the P-type FET 120A and the N-type FET 120B constituting the logic part which regions are not covered with the resist layer is removed by dry etching, and the resist layer is removed by an ashing treatment (see FIGS. 16A and 16B).

[Step 520]

Next, the first insulation film 31 on the region of the P-type FET 120A constituting the logic part is selectively removed. Specifically, based on a known lithographic technique, a resist layer 36A covering the regions of the P-type FET 20A and the N-type FET 20B which constitute the memory array part and the N-type FET 120B constituting the logic part is formed (see FIGS. 17A and 17B), then the first insulation film 31 exposed in the region of the P-type FET 120A constituting the logic part which region is not covered with the resist layer 36A is removed by dry etching (see FIGS. 18A and 18B), and the resist layer 36A is removed by an ashing treatment (see FIGS. 19A and 19B).

[Step 530]

Figure 20A:
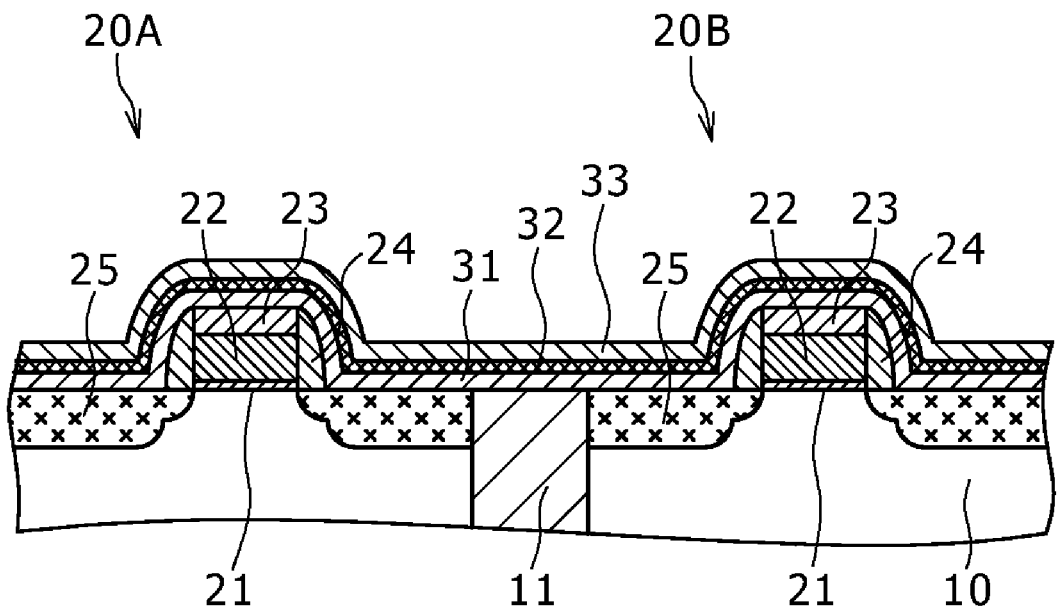
FIGS. 20A and 20B are schematic partly end elevation diagrams of the semiconductor substrate and the like for illustrating the method of manufacturing a semiconductor integrated circuit according to Example 5, following to FIGS. 19A and 19B.
Figure 20B:
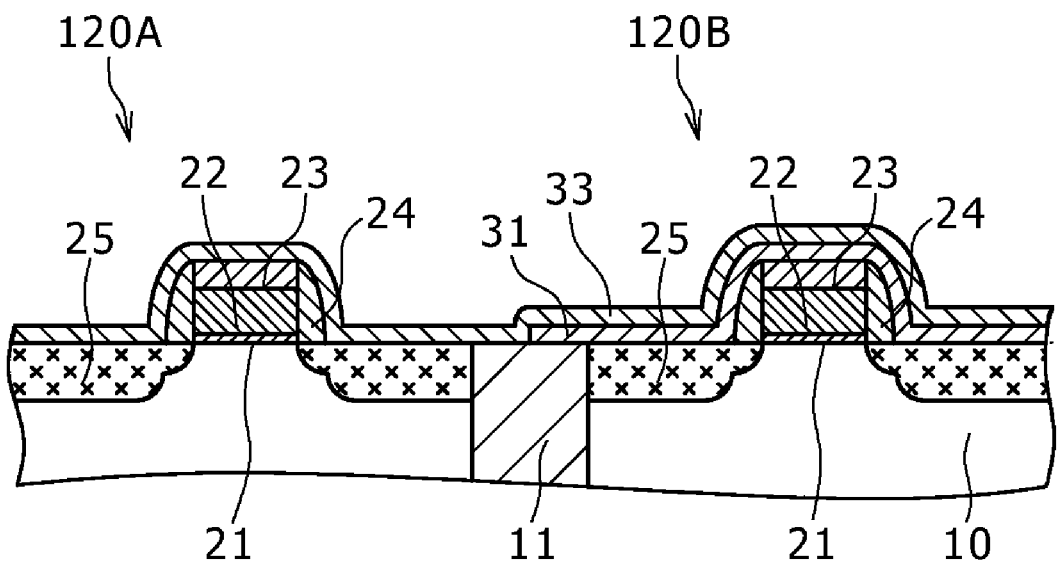
Figure 21A:
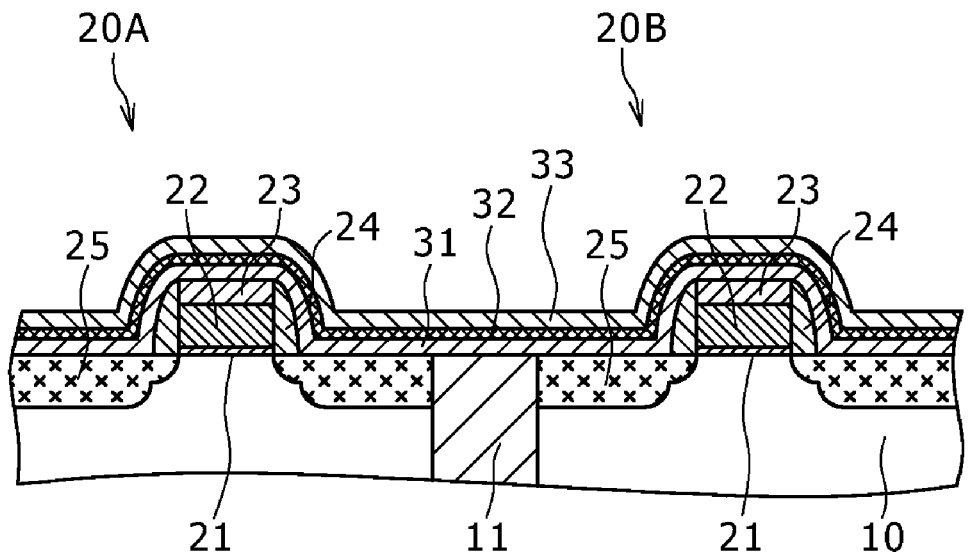
FIGS. 21A and 21B are schematic partly end elevation diagrams of the semiconductor substrate and the like for illustrating the method of manufacturing a semiconductor integrated circuit according to Example 5, following to FIGS. 20A and 20B.
Figure 21B:
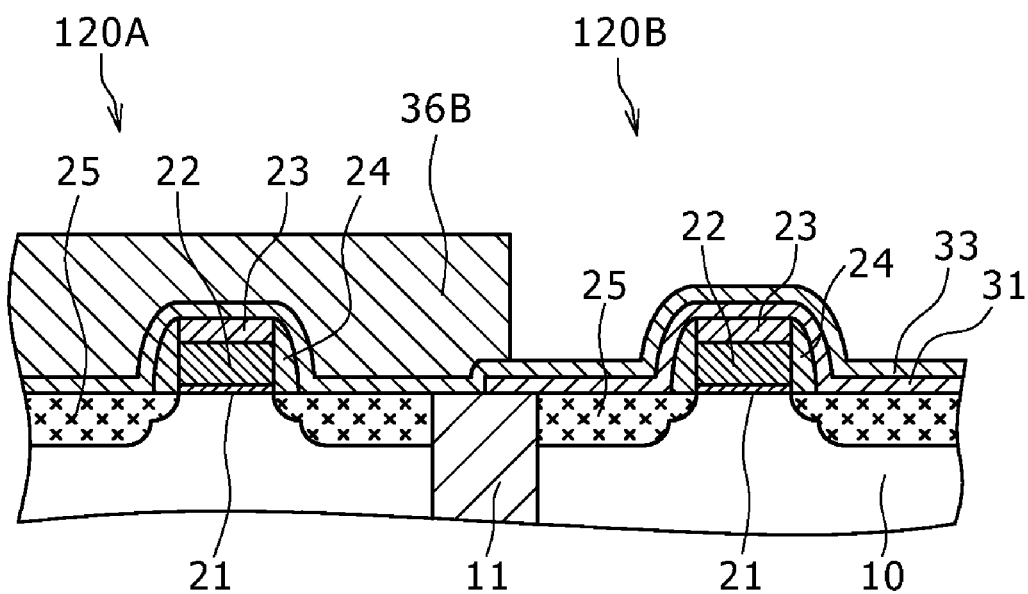
Figure 22A:
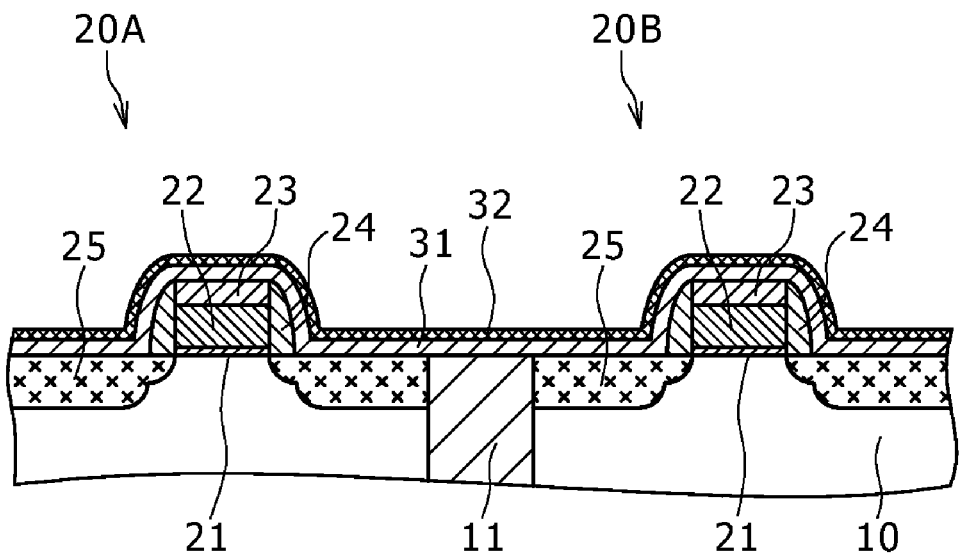
FIGS. 22A and 22B are schematic partly end elevation diagrams of the semiconductor substrate and the like for illustrating the method of manufacturing a semiconductor integrated circuit according to Example 5, following to FIGS. 21A and 21B.
Figure 22B:
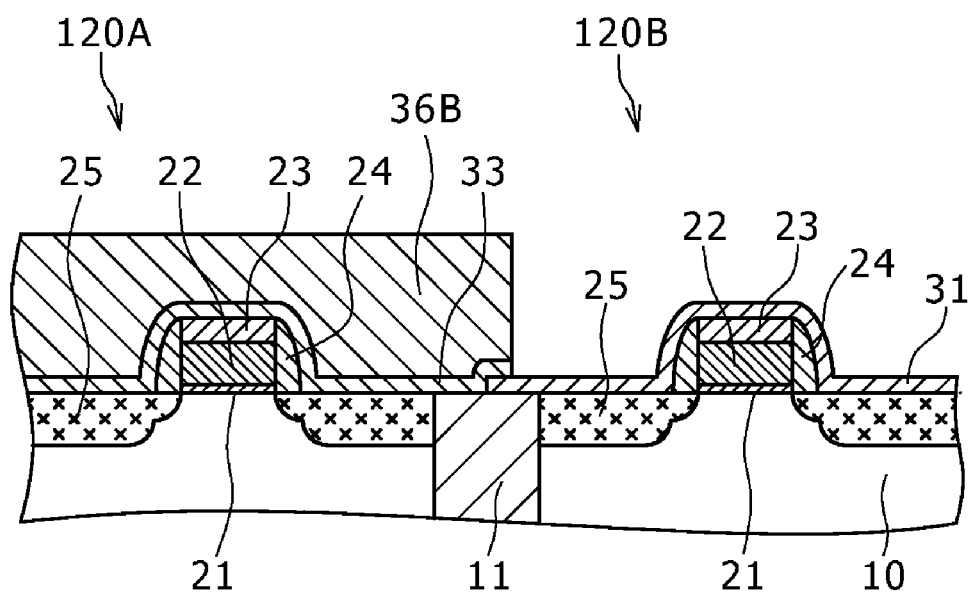
Figure 23A:
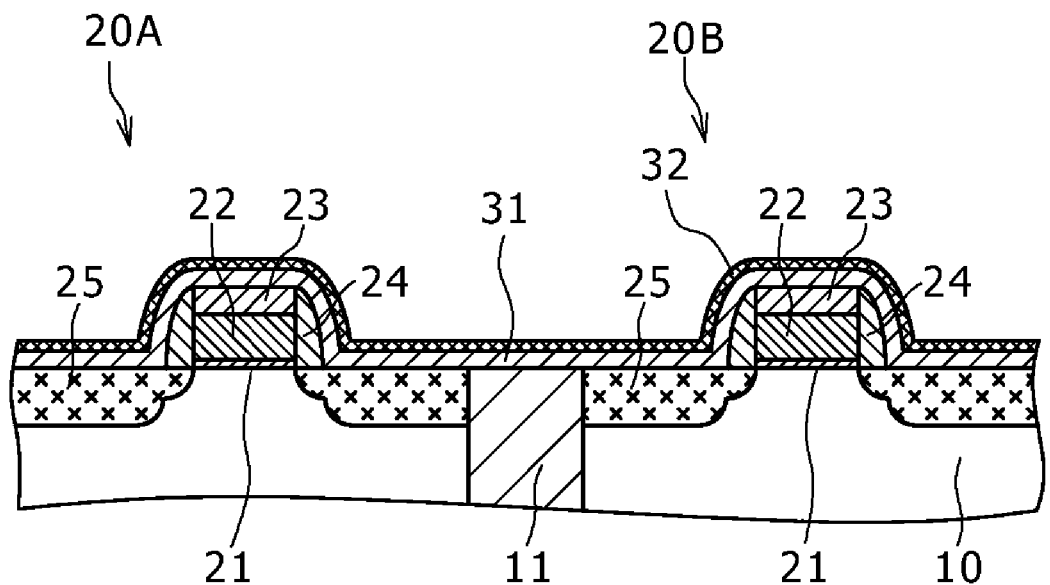
FIGS. 23A and 23B are schematic partly end elevation diagrams of the semiconductor substrate and the like for illustrating the method of manufacturing a semiconductor integrated circuit according to Example 5, following to FIGS. 22A and 22B.
Figure 23B:
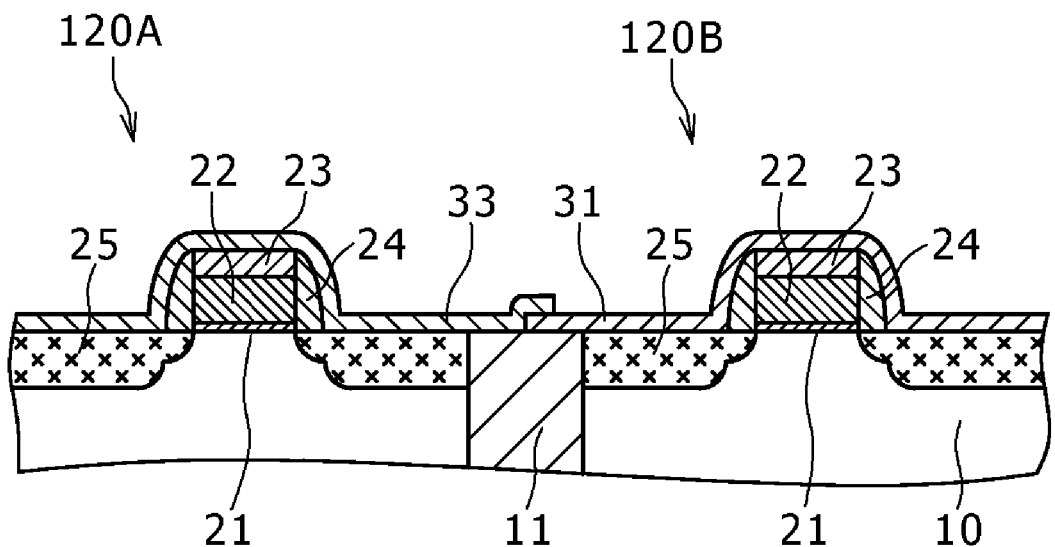

Thereafter, in the same manner as in Step 130 of Example 1, a third insulation film 33 having a compressive stress is formed on the whole surface (see FIGS. 20A and 20B).

[Step 540]

Next, the third insulation film 33 present on the upper side of the region of the N-type FET 120B constituting the logic part and the third insulation film 33 present on the upper side of the regions of the N-type FET 20B and the P-type FET 20A which constitute the memory array part are selectively removed. Specifically, based on a known lithographic technique, a resist layer 36B covering the region of the P-type FET 120A is formed (see FIGS. 21A and 21B), then the third insulation film 33 exposed in the regions of the P-type FET 20A and the N-type FET 20B constituting the memory array part and the N-type FET 120B constituting the logic part which regions are not covered with the resist layer 36B is removed by a dry etching process (see FIGS. 22A and 22B), and thereafter the resist layer 36B is removed based on an ashing treatment (see FIGS. 23A and 23B).

[Step 550]

Next, the same step as Step 150 of Example 1 is carried out, whereby a semiconductor integrated circuit can be obtained.

In the P-type FET 20A and the N-type FET 20B which constitute the memory array part obtained in Example 5 in this manner, the first insulation film 31 having a tensile stress if formed on the P-type FET 20A and the N-type FET 20B. With such a structure adopted, it is possible to contrive enhancement of the performance of the N-type FET 20B constituting the memory array part, and a lowering in the cell current determining the SRAM reading speed is obviated. Incidentally, in Example 5 also, like in Example 1, the third insulation film 33 having a compressive stress is not formed on the region of the P-type FET 20A constituting the memory array part, so that it is impossible to contrive enhancement of the performance of the P-type FET 20A. However, basically, the regions of the P-type FET 20A and the N-type FET 20B which constitute the memory array part are continuedly covered with the first insulation film 31, so that there would not arise the problem that the MOS transistors constituting the memory array part are damaged, with the result of deterioration of memory retention characteristics.

Incidentally, the method of manufacturing a semiconductor integrated circuit including the method of forming the P-type FET 120A and the N-type FET 120B which constitute the logic part, specifically, the step of removing the second insulation film 32, in Example 5, can be combined with the method of manufacturing a semiconductor integrated circuit described in Example 2. Namely, in the same manner as in Example 2, ion implantation for relaxation of tensile stress may be applied to the first insulation film 31 on the region of the P-type FET 20A constituting the memory array part, following to Step 540. Specifically, based on a known lithographic technique, a resist layer (not shown) covering the regions of the N-type FET 20B constituting the memory array part and the P-type FET 120A and the N-type FET 120B which constitute the logic part is formed, and ion implantation is applied to the first insulation film 31 exposed in the region of the P-type FET 20A constituting the memory array part which region is not covered with the resist layer. The conditions of the ion implantation may be the same as exemplified in Table 1 above. Incidentally, this ion implantation does not give any influence on the source/drain regions 25 of the P-type FET 20A constituting the memory array part.

By this, the tensile stress of the first insulation film 31 which is formed on the region of the P-type FET 20A constituting the memory array part and which has a tensile stress is relaxed, so that it is possible to contrive enhancement of the performance of the P-type FET 20A.

Incidentally, the step of applying ion implantation for relaxation of tensile stress to the first insulation film 31 on the region of the P-type FET 20A constituting the memory array part may be carried out following to Step 540 as above-described, or may be carried out after the formation of the first insulation film 31 and before the formation of the layer insulation layer 34.

Furthermore, the method of manufacturing a semiconductor integrated circuit including the method of forming the P-type FET 120A and the N-type FET 120B constituting the logic part, specifically, the step of removing the second insulation film 32, in Example 5, can be combined with the method of manufacturing a semiconductor integrated circuit described in Example 3 or Example 4. In other words, a method of manufacturing a semiconductor integrated circuit according to a fourth embodiment of the present invention may be adopted.

Specifically, in the method of manufacturing a semiconductor integrated circuit according to the fourth embodiment of the present invention, after Step 500 of Example 5 is conducted, namely, after the step of forming in the semiconductor substrate 10 the gate parts, channel forming regions and source/drain regions of the N-type FET 120B and the P-type FET 120A constituting the logic part, and the gate parts, channel forming regions and source/drain regions of the N-type FET 20B and the P-type FET 20A constituting the memory array part, and the step of forming the first insulation film 31 having a tensile stress on the whole surface and forming the second insulation film 32 on the first insulation film 31 are conducted, Step 510 of Example 5 is carried out, i.e., the step of selectively removing the second insulation film 32 present on the upper side of the regions of the N-type FET 120B and the P-type FET 120A constituting the logic part is carried out. Next, Step 520 of Example 5, namely, the step of selectively removing the first insulation film 31 on the region of the P-type FET 120A constituting the logic part, and Step 530 of Example 5, namely, the step of forming the third insulation film 33 having a compressive stress on the whole surface, are carried out.

Thereafter, the same step as Step 310 of Example 3 is carried out, i.e., a step of applying ion implantation for relaxation of compressive stress to the third insulation film 33 present on the upper side of the region of the N-type FET 20B constituting the memory array part is carried out. Next, the same step as Step 320 of Example 3 is conducted, i.e., a step of selectively removing the third insulation film 33 present on the upper side of the N-type FET 120B constituting the logic part is conducted. Thereafter, the same step as Step 150 of Example 1 is carried out, whereby a semiconductor integrated circuit can be obtained.

The P-type FET 20A and the N-type FET 20B constituting the memory array part obtained in this manner has the same structure as that of the P-type FET 20A and the N-type FET 20B in Example 3.

Incidentally, like in Example 3, the step of applying ion implantation for relaxation of compressive stress to the third insulation film 33 present on the upper side of the region of the N-type FET 20B constituting the memory array part may be carried out in any step after the formation of the third insulation film 33 and before the formation of the layer insulation layer 34.

Furthermore, like in Example 4, after the formation of the first insulation film 31 and the second insulation film 32, or after the selective removal of the second insulation film 32 present on the upper side of the regions of the P-type FET 120A and the N-type FET 120B constituting the logic part, or after the selective removal of the first insulation film 31 on the region of the P-type FET 120A constituting the logic part, ion implantation for relaxation of tensile stress may be applied to the first insulation film 31 on the region of the P-type FET 20A constituting the memory array part. Specifically, based on a known lithographic technique, a resist layer (not shown) covering the regions of the N-type FET 20B constituting the memory array part and the P-type FET 120A constituting the logic part is formed, then ion implantation is applied to the first insulation film 31 exposed in the region of the P-type FET 20A constituting the memory array part which region is not covered with the resist layer, and ion implantation is applied also to the first insulation film 31 exposed in the region of the P-type FET 120A constituting the logic part which region is not covered with the resist layer. The conditions of the ion implantation may be the same as exemplified in Table 1 above.

Incidentally, at the time of applying the ion implantation for relaxation of compressive stress to the third insulation film 33 present on the upper side of the region of the N-type FET 20B constituting the memory array part, the ion implantation for relaxation of compressive stress may simultaneously be applied to the third insulation film 33 present on the upper side of the region of the N-type FET 120B constituting the logic part.

EXAMPLE 6

Example 6 relates to a method of manufacturing a semiconductor integrated circuit according to a fifth embodiment of the present invention. The method of manufacturing a semiconductor integrated circuit in Example 6 or in any of Examples 7 and 8 which will be described later is a method of manufacturing a semiconductor integrated circuit including a logic part and a memory array part (specifically, a memory array part composed of an SRAM). The logic part has an N channel type field effect transistor (specifically, an N channel type MOS transistor, hereinafter referred to as N-type FET 140B) and a P channel type field effect transistor (specifically, a P channel type MOS transistor, hereinafter referred to as P-type FET 140A). The memory array part has an N channel type field effect transistor (specifically, an N channel type MOS transistor, hereinafter referred to as N-type FET 40B) and a P channel type field effect transistor (specifically, a P channel type MOS transistor, hereinafter referred to as P-type FET 40A). Now, the method of manufacturing a semiconductor integrated circuit in Example 6 will be described below, referring to FIGS. 24A and 24B, FIGS. 25A and 25B, FIGS. 26A and 26B, FIGS. 27A and 27B, FIGS. 28A and 28B, FIGS. 29A and 29B, FIGS. 30A and 30B, and FIGS. 31A and 31B, which are schematic partly end elevation diagrams of a semiconductor substrate and the like.

[Step 600]

First, based on a known method, a device separation region 11 having a trench structure is formed in a semiconductor substrate 10, then gate parts each composed of a gate insulation film 21, a gate electrode 22 and an offset film 23 are formed on the semiconductor substrate 10, thereafter gate side walls 24 are formed on side surfaces of the gate parts, and source/drain regions 25 are formed in the semiconductor substrate 10. Incidentally, the region, between the two source/drain regions 25, of the semiconductor substrate 10 corresponds to a channel forming region. In this manner, a P-type FET 40A (see $TR_1$ and $TR_4$ in FIGS. 1B and 1C) and an N-type FET 40B (see $TR_2$, $TR_3$, $TR_5$ and $TR_6$ in FIGS. 1B and 1C) which constitute a memory array part can be obtained (see FIG. 1A). Simultaneously, a P-type FET 140A and an N-type FET 140B which constitute a logic part can be obtained.

[Step 610]

Figure 24A:
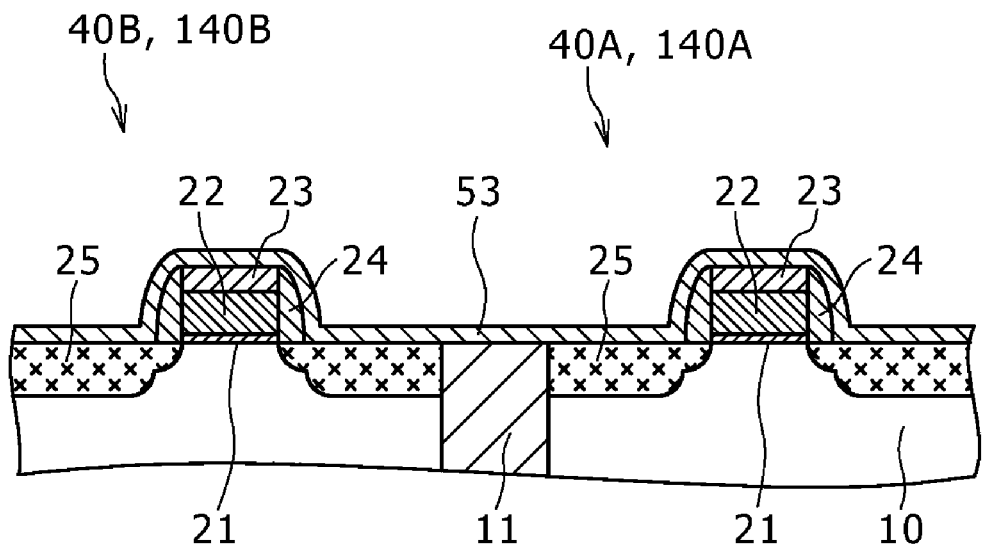
FIGS. 24A and 24B are schematic partly end elevation diagrams of a semiconductor substrate and the like for illustrating a method of manufacturing a semiconductor integrated circuit according to Example 6.
Figure 24B:
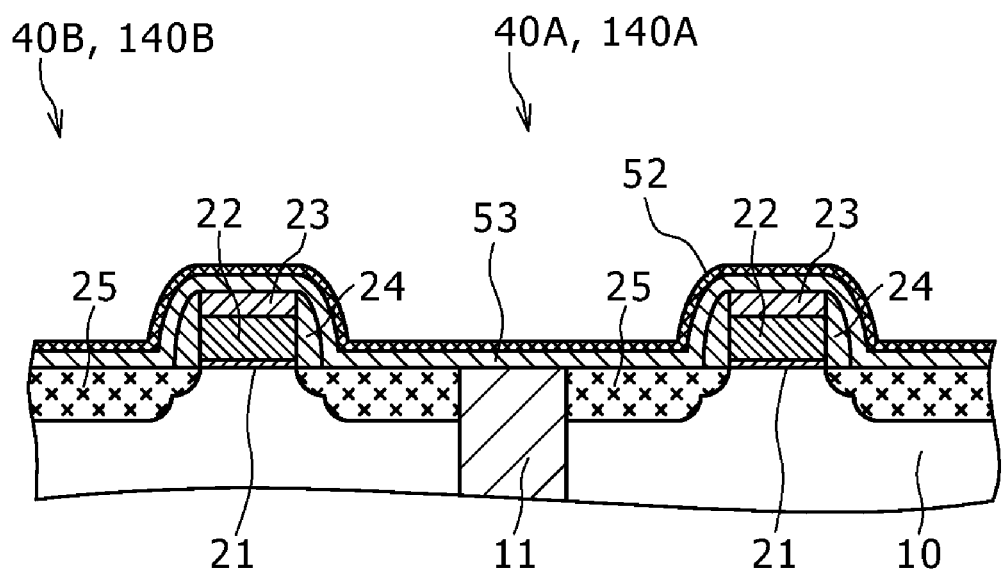
Figure 25A:
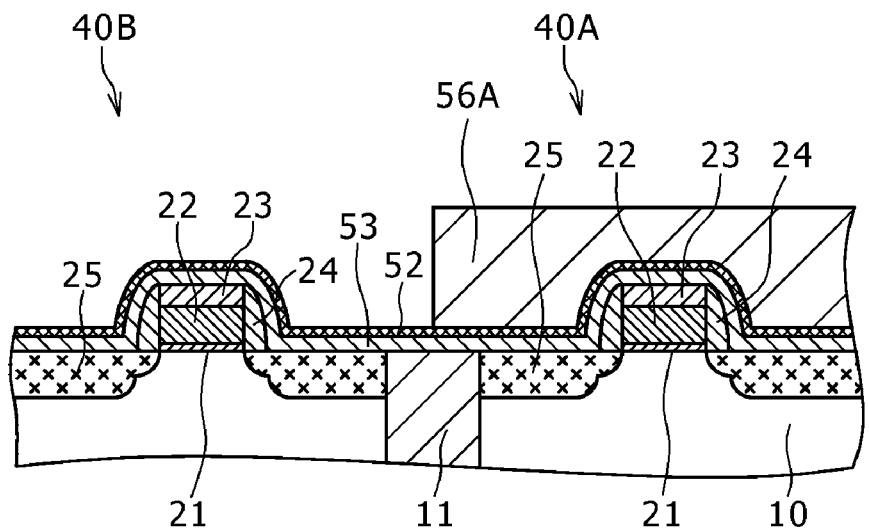
FIGS. 25A and 25B are schematic partly end elevation diagrams of the semiconductor substrate and the like for illustrating the method of manufacturing a semiconductor integrated circuit according to Example 6, following to FIGS. 24A and 24B.
Figure 25B:
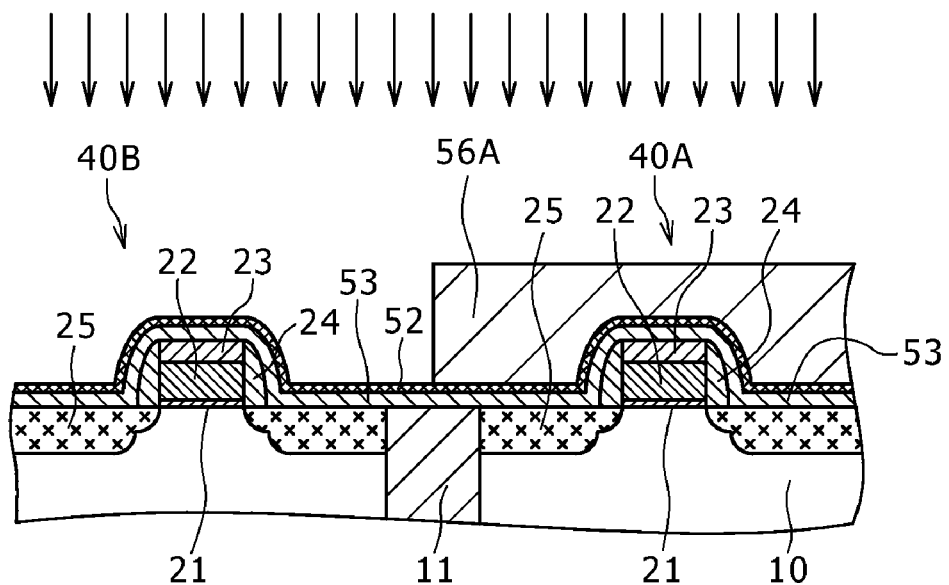
Figure 26A:
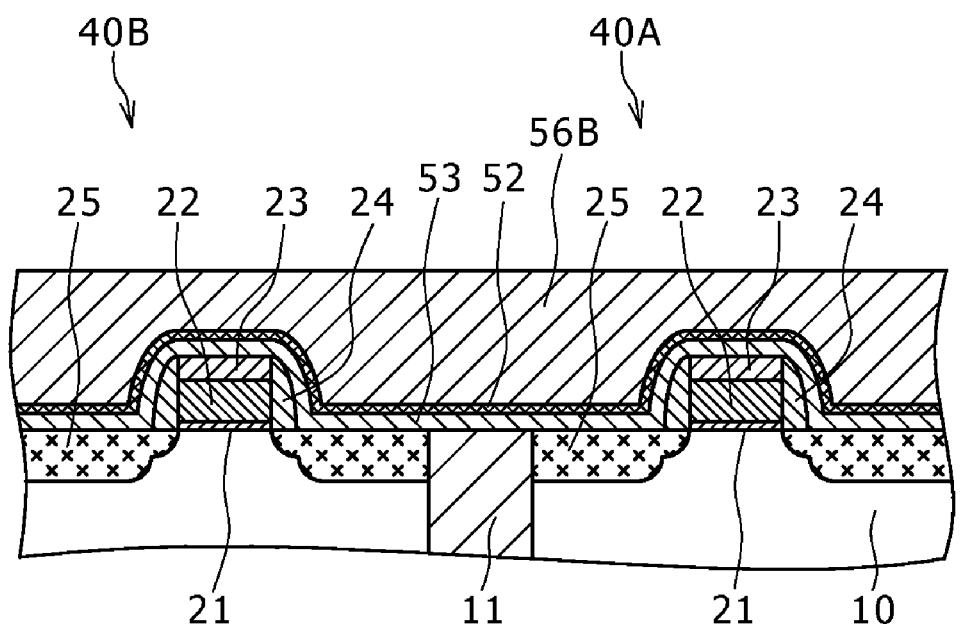
FIGS. 26A and 26B are schematic partly end elevation diagrams of the semiconductor substrate and the like for illustrating the method of manufacturing a semiconductor integrated circuit according to Example 6, following to FIGS. 25A and 25B.
Figure 26B:
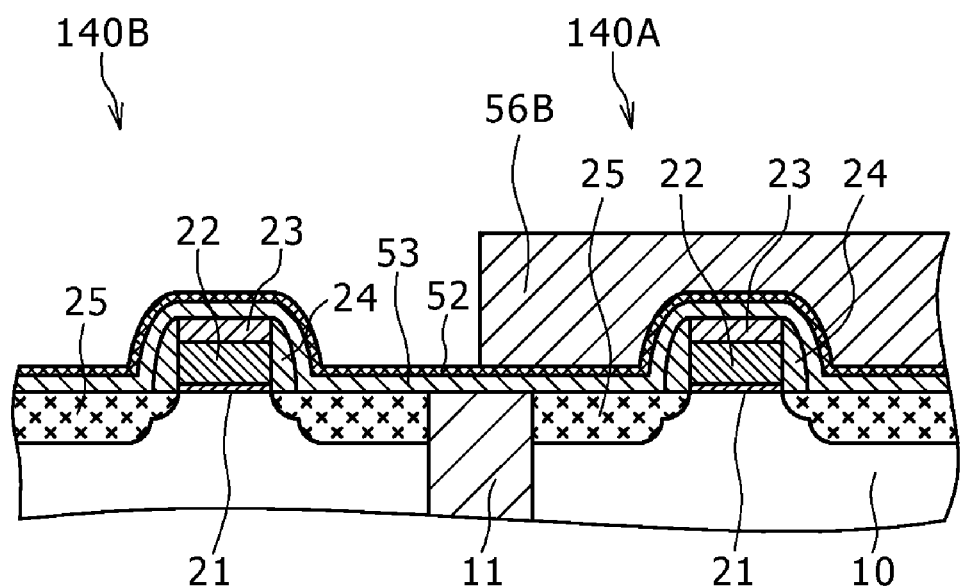
Figure 27A:
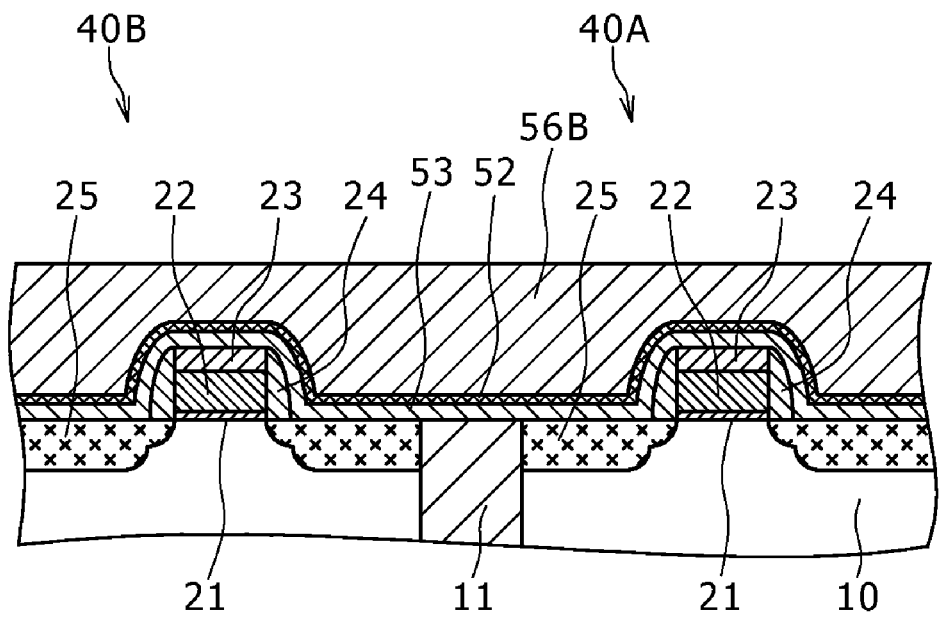
FIGS. 27A and 27B are schematic partly end elevation diagrams of the semiconductor substrate and the like for illustrating the method of manufacturing a semiconductor integrated circuit according to Example 6, following to FIGS. 26A and 26B.
Figure 27B:
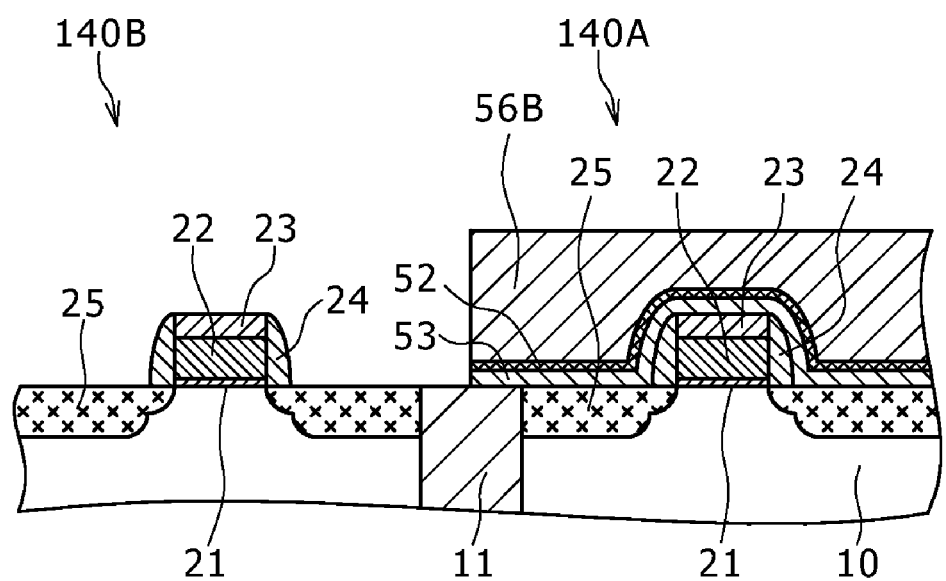
Figure 28A:
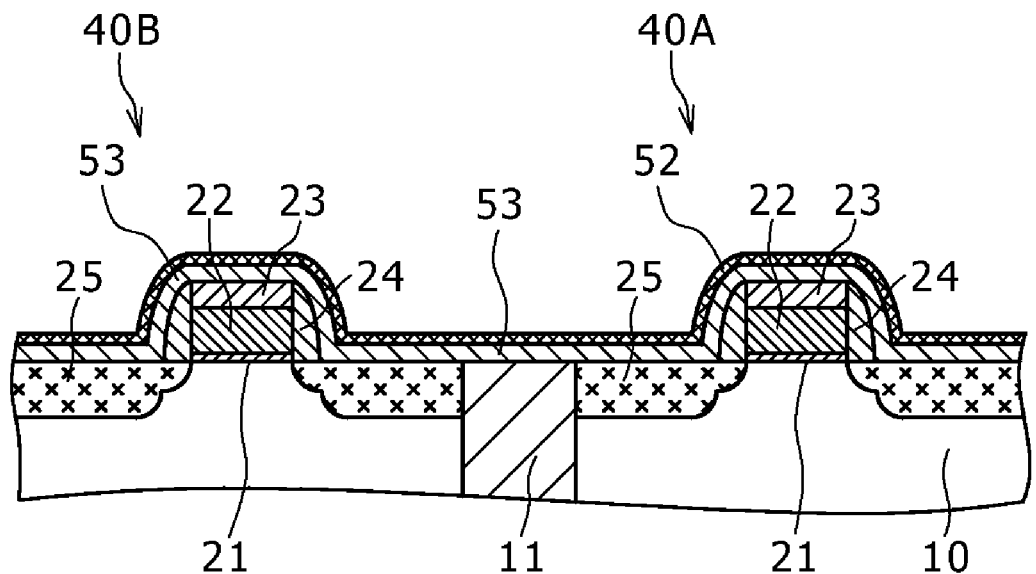
FIGS. 28A and 28B are schematic partly end elevation diagrams of the semiconductor substrate and the like for illustrating the method of manufacturing a semiconductor integrated circuit according to Example 6, following to FIGS. 27A and 27B.
Figure 28B:
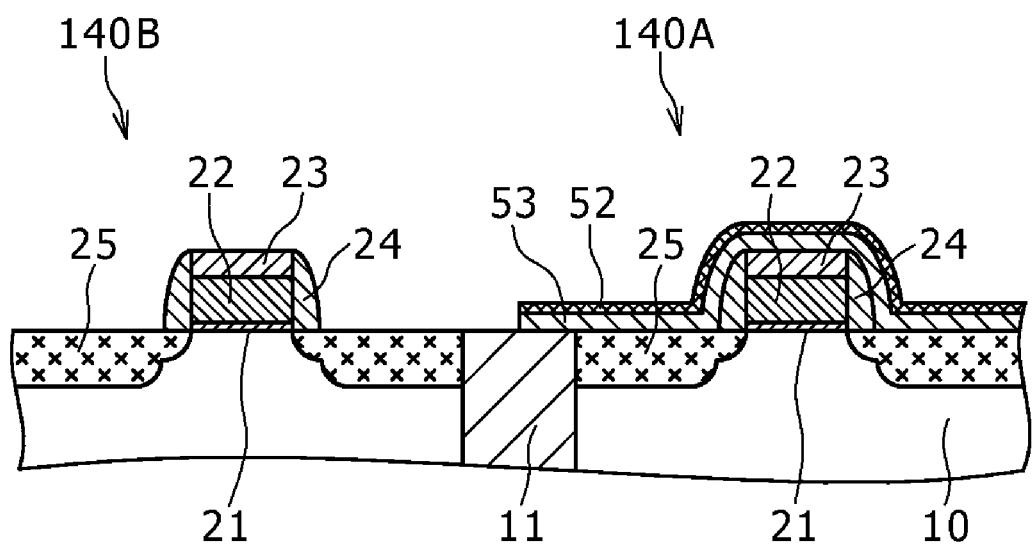

Next, for example in the same manner as in Step 130 of Example 1, based on a plasma CVD process, a first insulation film 53 composed of a 50 nm thick silicon nitride film and having a compressive stress is formed on the whole surface (see FIG. 24A), and, in the same manner as in Step 110 of Example 1, based on a CVD process, a second insulation film 52 composed of a 30 nm thick silicon oxide film is formed on the first insulation film 53 (see FIG. 24B).

[Step 620]

Subsequently, ion implantation for relaxation of compressive stress is applied to the first insulation film 53 on the region of the N-type FET 40B constituting the memory array part. Specifically, based on a known lithographic technique, a resist layer 56A covering the region of the P-type FET 40A constituting the memory array part is formed (see FIG. 25A), a resist layer 56A covering the regions of the P-type FET 140A and the N-type FET 140B constituting the logic part is also formed, and ion implantation is applied to the first insulation film 53 exposed in the region of the N-type FET 40B constituting the memory array part which region is not covered with the resist layer 56A (see FIG. 25B). The conditions of the ion implantation may be the same as exemplified in Table 1 above. Incidentally, this ion implantation does not exert any influence on the source/drain regions 25 in the N-type FET 40B constituting the memory array part.

[Step 630]

Thereafter, the second insulation film 52 and the first insulation film 53 present on the upper side of the region of the N-type FET 140B constituting the logic part are selectively removed. Specifically, based on a known lithographic technique, a resist layer 56B covering the regions of the P-type FET 40A and the N-type FET 40B constituting the memory array part and the P-type FET 140A constituting the logic part is formed (see FIGS. 26A and 26B), then the second insulation film 52 and the first insulation film 53 exposed in the region of the N-type FET 140B which region is not covered with the resist layer 56B are removed by a dry etching process (see FIGS. 27A and 27B), and thereafter the resist layer 56B is removed based on an ashing treatment (see FIGS. 28A and 28B).

[Step 640]

Figure 29A:
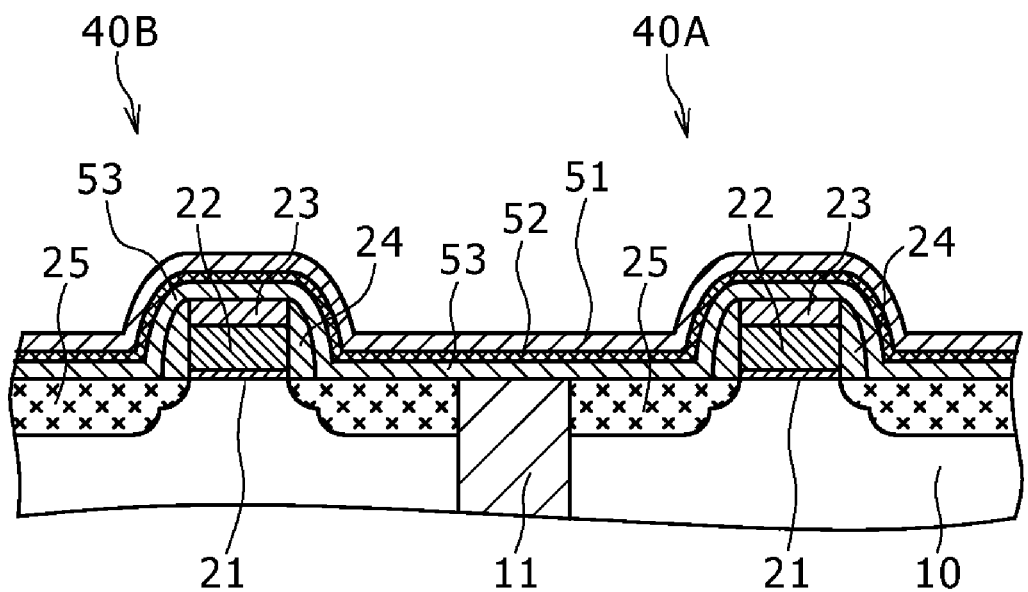
FIGS. 29A and 29B are schematic partly end elevation diagrams of the semiconductor substrate and the like for illustrating the method of manufacturing a semiconductor integrated circuit according to Example 6, following to FIGS. 28A and 28B.
Figure 29B:
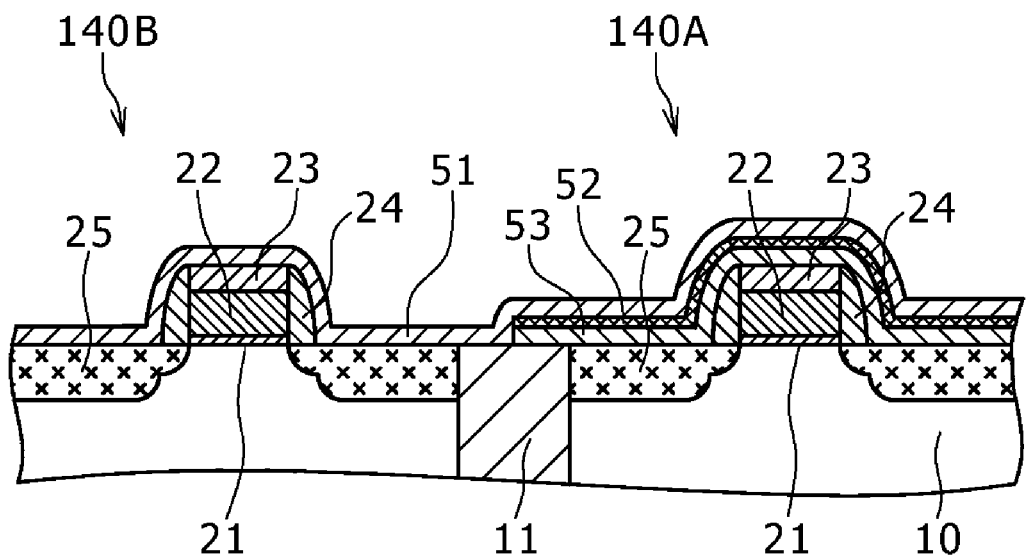
Figure 30A:
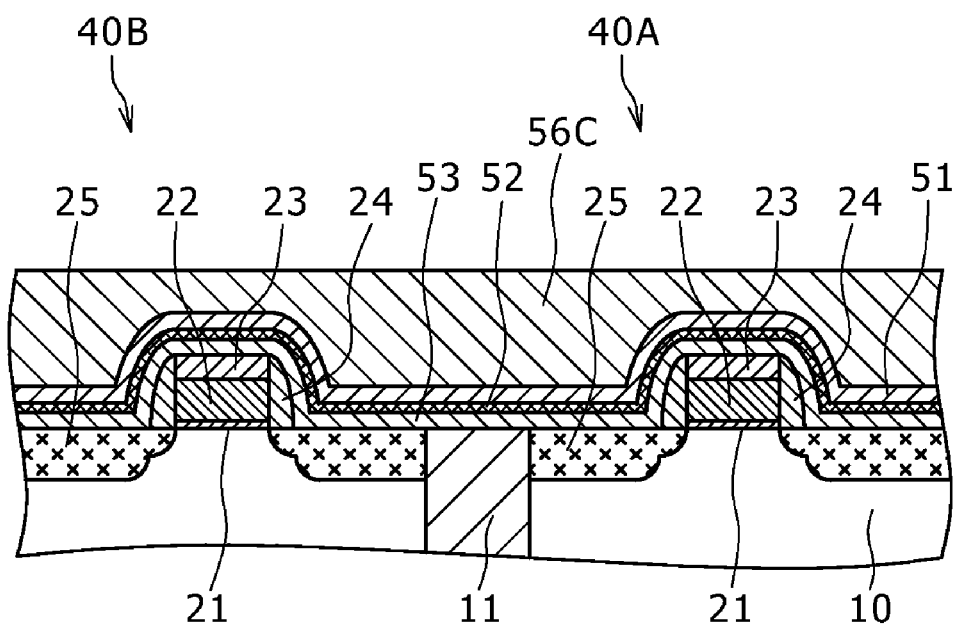
FIGS. 30A and 30B are schematic partly end elevation diagrams of the semiconductor substrate and the like for illustrating the method of manufacturing a semiconductor integrated circuit according to Example 6, following to FIGS. 29A and 29B.
Figure 30B:
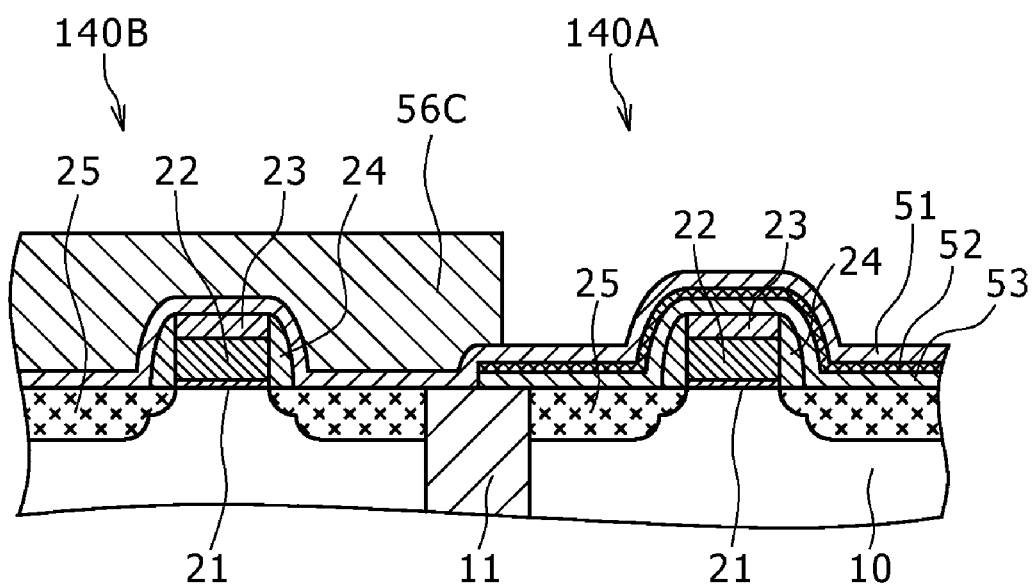
Figure 31A:
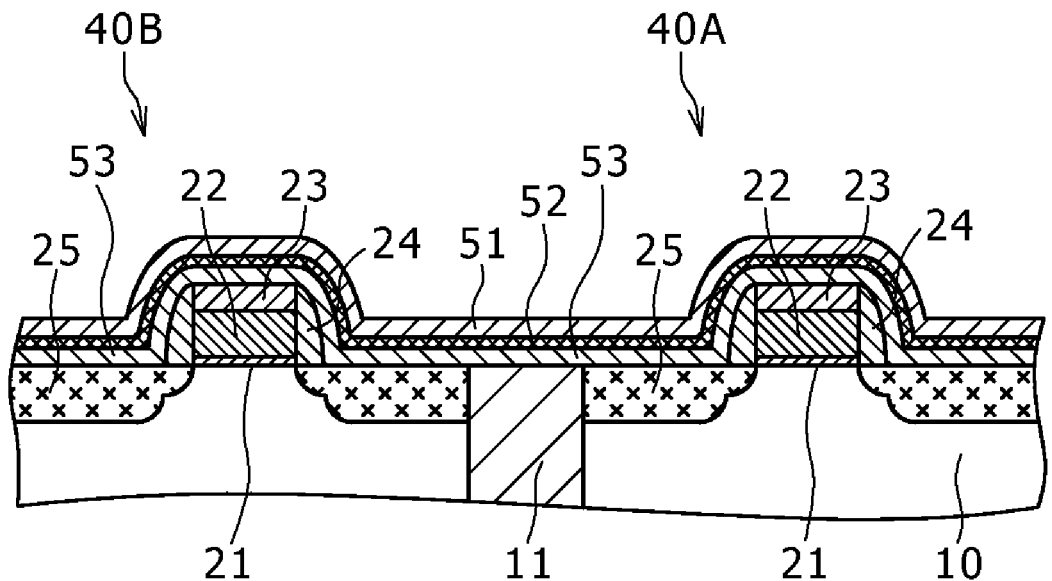
FIGS. 31A and 31B are schematic partly end elevation diagrams of the semiconductor substrate and the like for illustrating the method of manufacturing a semiconductor integrated circuit according to Example 6, following to FIGS. 30A and 30B.
Figure 31B:
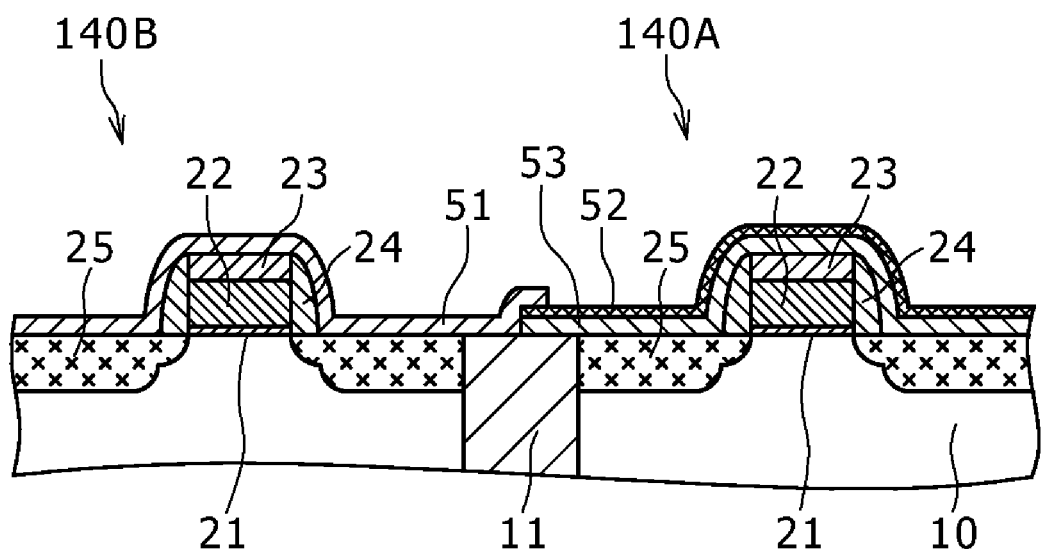

Next, for example in the same manner as in Step 110 of Example 1, based on a plasma CVD process, a third insulation film 51 composed of a 50 nm thick silicon nitride film and having a tensile stress is formed on the whole surface (see FIGS. 29A and 29B).

[Step 650]

Thereafter, the third insulation film 51 present on the upper side of the region of the P-type FET 140A constituting the logic part is selectively removed. Specifically, based on a known lithographic technique, a resist layer 56C covering the regions of the P-type FET 40A and the N-type FET 40B constituting the memory array part and the N-type FET 140B constituting the logic part I formed (see FIGS. 30A and 30B), then the third insulation film 51 exposed in the region of the P-type FET 140A constituting the logic part which region is not covered with the resist layer 56C is removed by a dry etching process, and thereafter the resist layer 56C is removed based on an ashing treatment (see FIGS. 31A and 31B). Since the second insulation film 52 composed of the silicon oxide film is provided as an etching stopper layer, the third insulation film 51 can be securely removed by the dry etching process. Incidentally, the third insulation film 51 is dry etched so as to obtain a three-layer structure of the first insulation film 53, the second insulation film 52, and the third insulation film 51 so that the semiconductor substrate 10 and the like would not be exposed in the boundary region between the first insulation film 53 and the third insulation film 51, at the time of removing the third insulation film 51, in the logic part. When such a structure is formed in the memory array part, the above-mentioned problems are generated, but, in the logic part, such a structure does not generate serious problems.

[Step 660]

Next, the same step as Step 150 of Example 1 is carried out, whereby a semiconductor integrated circuit can be obtained.

In the P-type FET 40A and the N-type FET 40B which constitute the memory array obtained in Example 6 in this manner, the first insulation film 53 having a compressive stress, the second insulation film 52, and the third insulation film 51 having a tensile stress are formed on the regions of the P-type FET 40A and the N-type FET 40B, and the compressive stress on the first insulation film 53 formed on the region of the N-type FET 40B and having a compressive stress is relaxed. With such a structure adopted, it is possible to contrive enhancement of the performance of the N-type FET 40B constituting the memory array part, and a lowering in the cell current determining the SRAM reading speed is obviated. Incidentally, in Example 6, though the first insulation film 53 having a compressive stress is formed on the region of the P-type FET 40A constituting the memory array part, the third insulation film 51 having a tensile stress is provided on the upper side thereof, so that it is impossible to contrive enhancement of the performance of the P-type FET 40A; however, difficulties in processing for forming an opening for forming a local interconnect in the layer insulation layer can be obviated. Besides, in any of the steps, basically, the regions of the P-type FET 40A and the N-type FET 40B constituting the memory array part are continuedly covered with the first insulation film 53, so that there would not arise the problem that the MOS transistors constituting the memory array part are damaged, with the result of deterioration of memory retention characteristics.

EXAMPLE 7

Figure 32A:
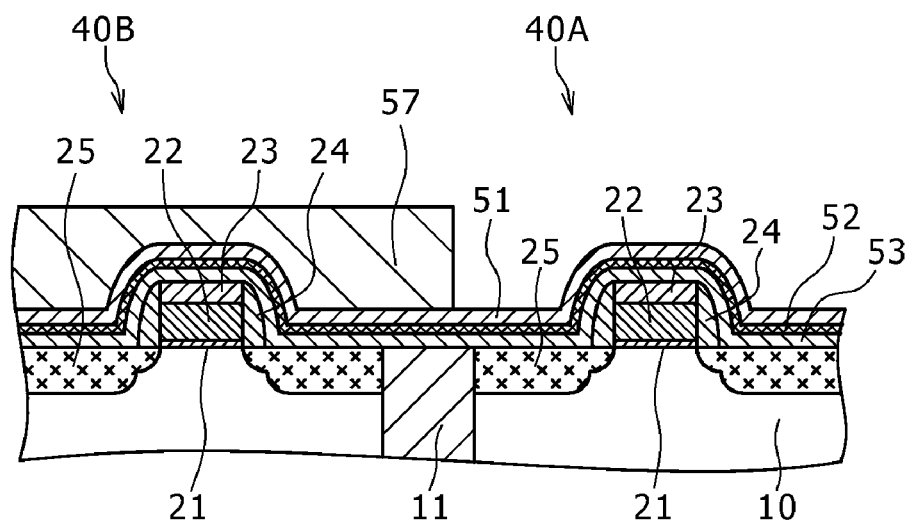
FIGS. 32A and 32B are schematic partly end elevation diagrams of a semiconductor substrate and the like for illustrating a method of manufacturing a semiconductor integrated circuit according to Example 7.
Figure 32B:
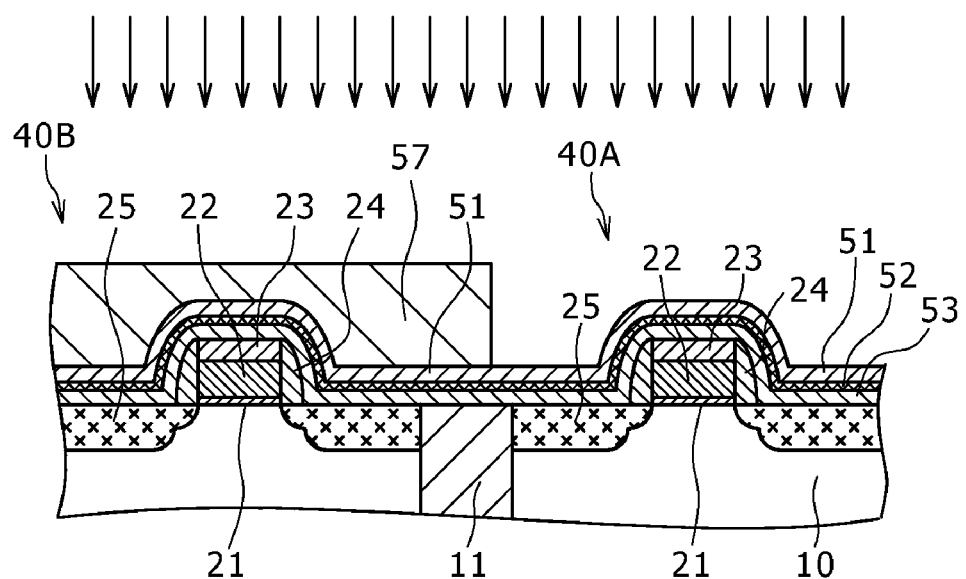
Figure 33A:
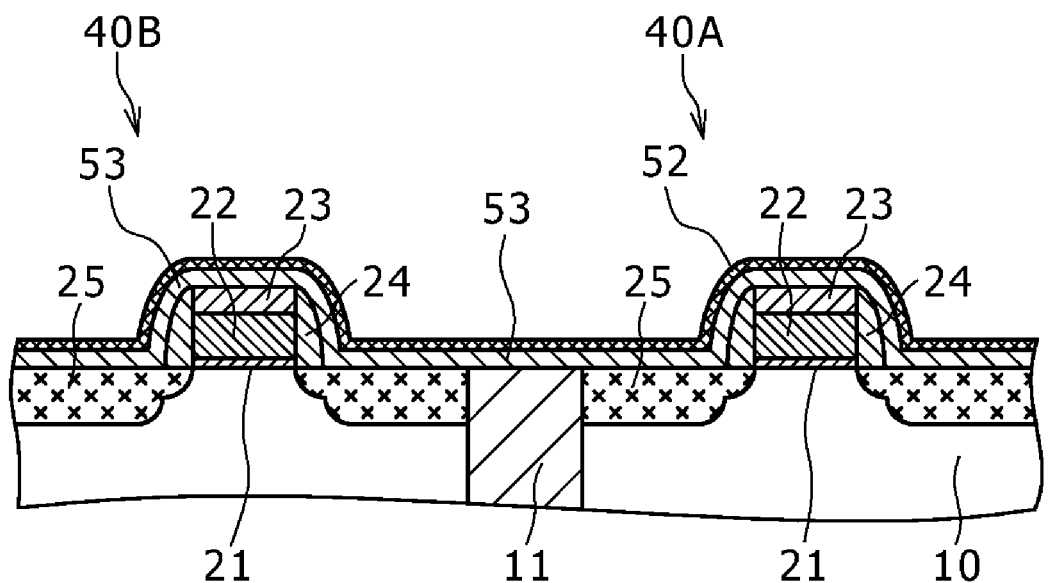
FIGS. 33A and 33B are schematic partly end elevation diagrams of a semiconductor substrate and the like for illustrating a method of manufacturing a semiconductor integrated circuit according to Example 8.
Figure 33B:
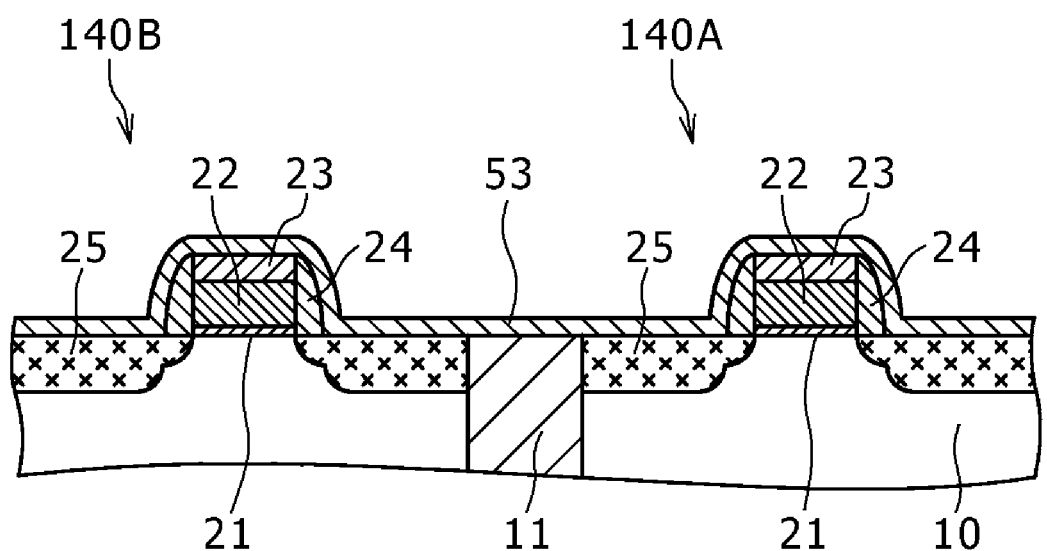
Figure 34A:
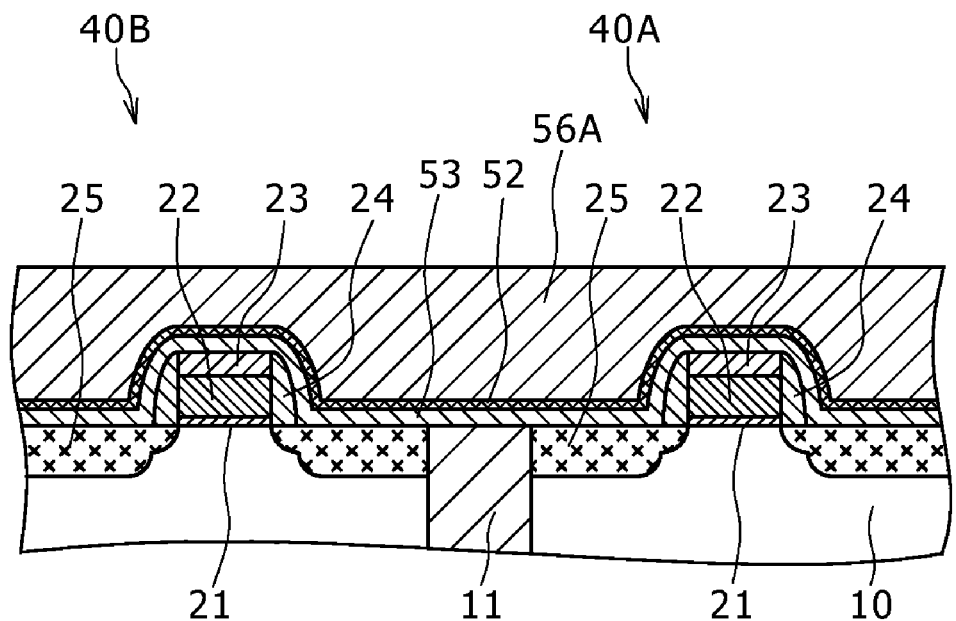
FIGS. 34A and 34B are schematic partly end elevation diagrams of the semiconductor substrate and the like for illustrating the method of manufacturing a semiconductor integrated circuit according to Example 8, following to FIG. 33B.
Figure 34B:
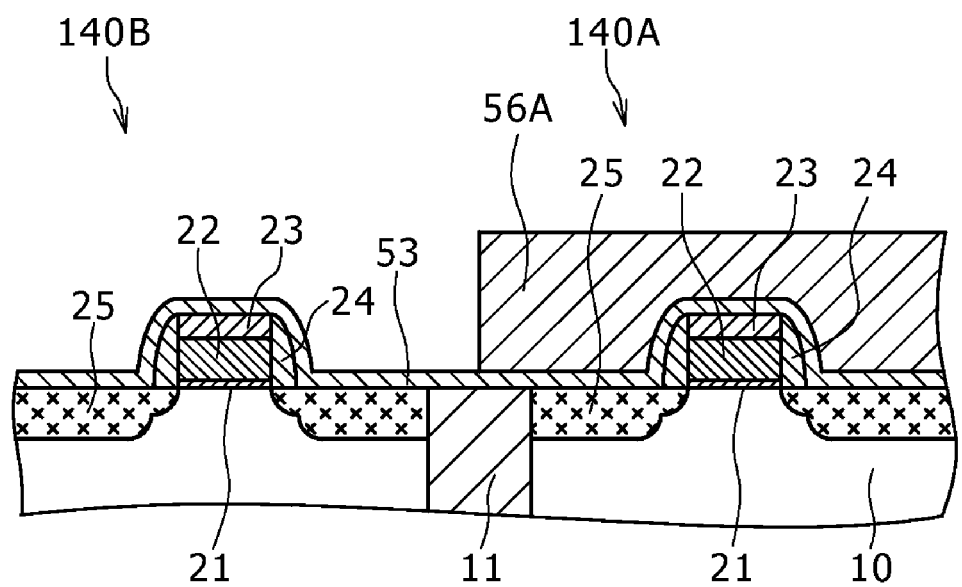
Figure 35A:
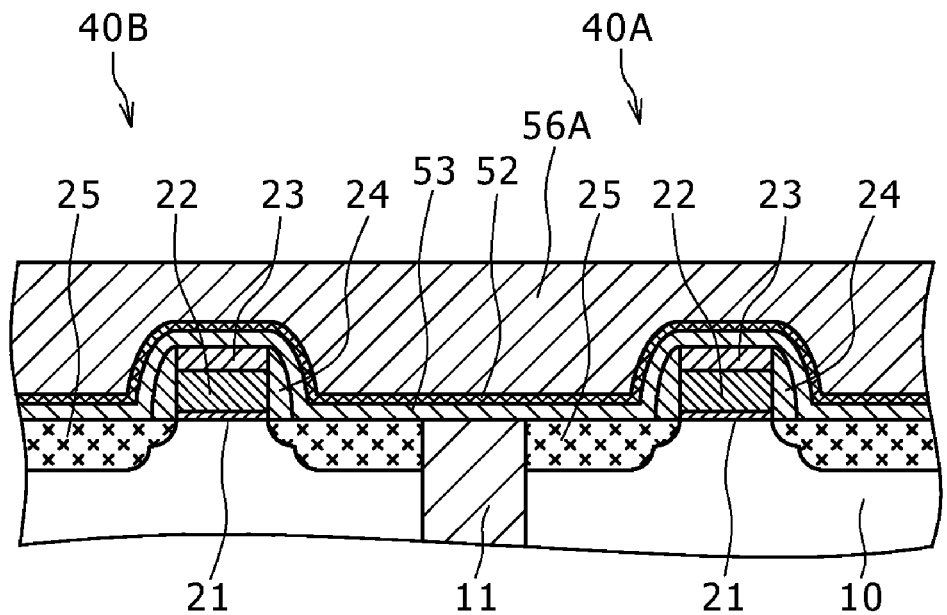
FIGS. 35A and 35B are schematic partly end elevation diagrams of the semiconductor substrate and the like for illustrating the method of manufacturing a semiconductor integrated circuit according to Example 8, following to FIGS. 34A and 34B.
Figure 35B:
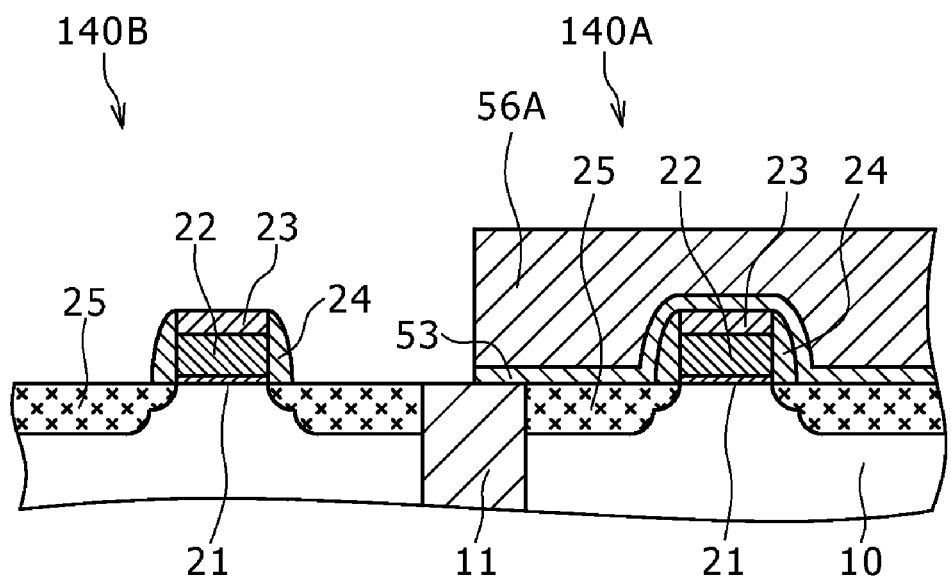
Figure 36A:
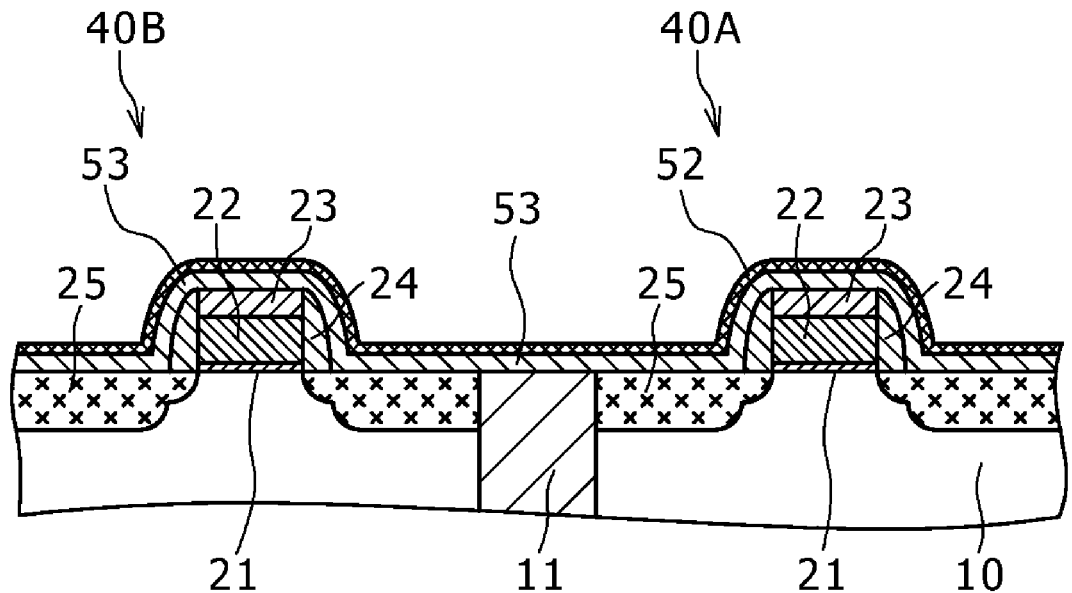
FIGS. 36A and 36B are schematic partly end elevation diagrams of the semiconductor substrate and the like for illustrating the method of manufacturing a semiconductor integrated circuit according to Example 8, following to FIGS. 35A and 35B.
Figure 36B:
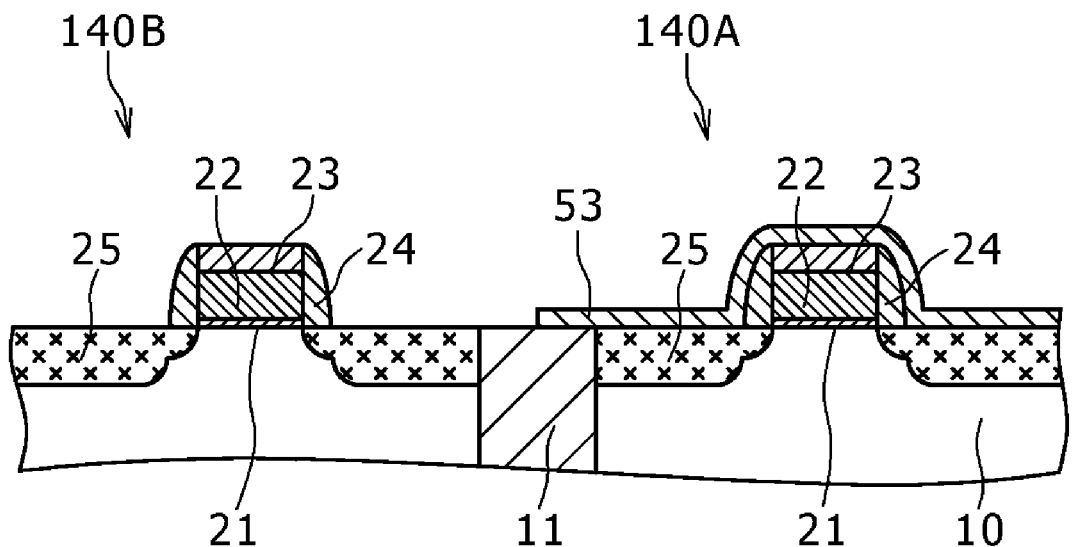

Example 7 is a modification of the method of manufacturing a semiconductor integrated circuit in Example 6. In Example 7, subsequently to Step 640 or Step 650, ion implantation for relaxation of tensile stress is applied to the third insulation film 51 present on the upper side of the region of the P-type FET 40A constituting the memory array part. Specifically, based on a known lithographic technique, a resist layer 57 covering the regions of the N-type FET 40B constituting the memory array part and the N-type FET 140B and the P-type FET 140A which constitute the logic part is formed (see FIG. 32A), and ion implantation is applied to the third insulation film exposed in the region of the P-type FET 40A constituting the memory array part which region is not covered with the resist layer 57 (see FIG. 32B). The conditions of the ion implantation may be the same as exemplified in Table 1 above. Incidentally, this ion implantation does not have any influence on the compressive stress on the first insulation film 53 in the P-type FET 40A constituting the memory array part.

By this, the tensile stress on the third insulation film which is formed on the region of the P-type FET 40A constituting the memory array part and which has a tensile stress is relaxed, so that it is possible to contrive further enhancement of the performance of the P-type FET 40A, as compared with Example 6.

EXAMPLE 8

Example 8 also is a modification of Example 6. In Example 8, before conducting Step 630 of Example 6, the second insulation film formed on the upper side of the regions of the P-type FET 140A and the N-type FET 140B which constitute the logic part is removed, in the same manner as in Example 5. Now, the method of manufacturing a semiconductor integrated circuit in Example 8 will be described below, referring to FIGS. 33A and 33B, FIGS. 34A and 34B, FIGS. 35A and 35B, FIGS. 36A and 36B, FIGS. 37A and 37B, FIGS. 38A and 38B, and FIGS. 39A and 39B, which are schematic partly end elevation diagrams of a semiconductor substrate and the like.

[Step 800]

First, the same step as Step 600 of Example 6 is carried out, whereby a P-type FET 40A and an N-type FET 40B which constitute a memory array part and a P-type FET 140A and an N-type FET 140B which constitute a logic part can be obtained. Thereafter, the same steps as Step 610 and Step 620 of Example 6 are carried out.

[Step 810]

Thereafter, a second insulation film 52 present on the upper side of the regions of the N-type FET 140B and the P-type FET 140A which constitute the logic part is selectively removed. Specifically, based on a known lithographic technique, a resist layer (not shown) covering the regions of the P-type FET 40A and the N-type FET 40B which constitute the memory array part is formed, then the second insulation film 52 exposed in the regions of the P-type FET 140A and the N-type FET 140B constituting the logic part which regions are not covered with the resist layer is removed by dry etching, and the resist layer is removed by an ashing treatment (see FIGS. 33A and 33B).

[Step 820]

Following to this, the same step as Step 630 of Example 6 is carried out, whereby the second insulation film 52 and the first insulation film 53 present on the upper side of the region of the N-type FET 140B constituting the logic part are selectively removed (see FIGS. 34A and 34B, FIGS. 35A and 35B, and FIGS. 36A and 36B).

[Step 830]

Figure 37A:
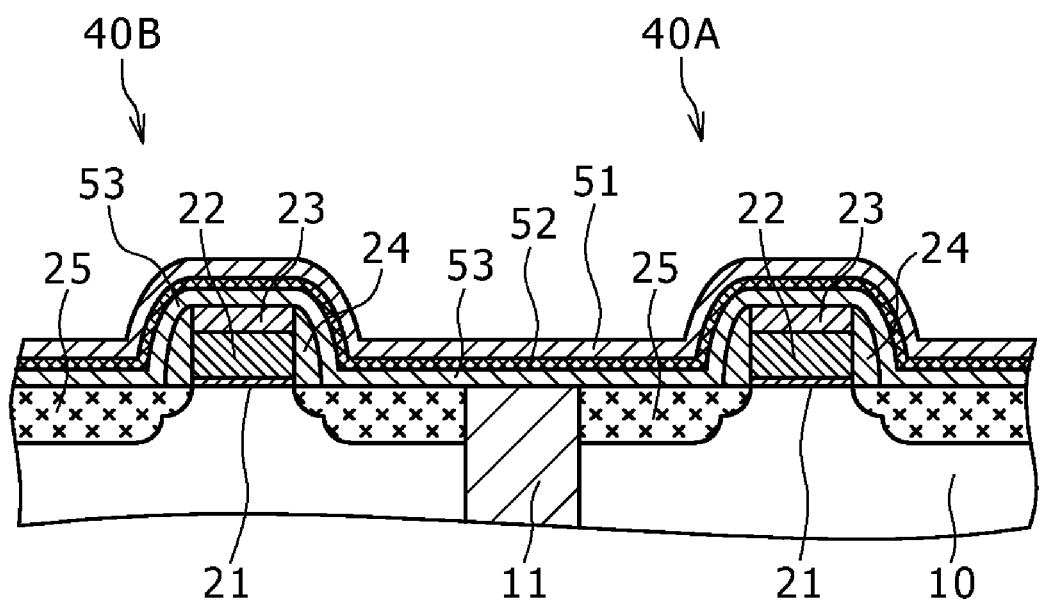
FIGS. 37A and 37B are schematic partly end elevation diagrams of the semiconductor substrate and the like for illustrating the method of manufacturing a semiconductor integrated circuit according to Example 8, following to FIGS. 36A and 36B.
Figure 37B:
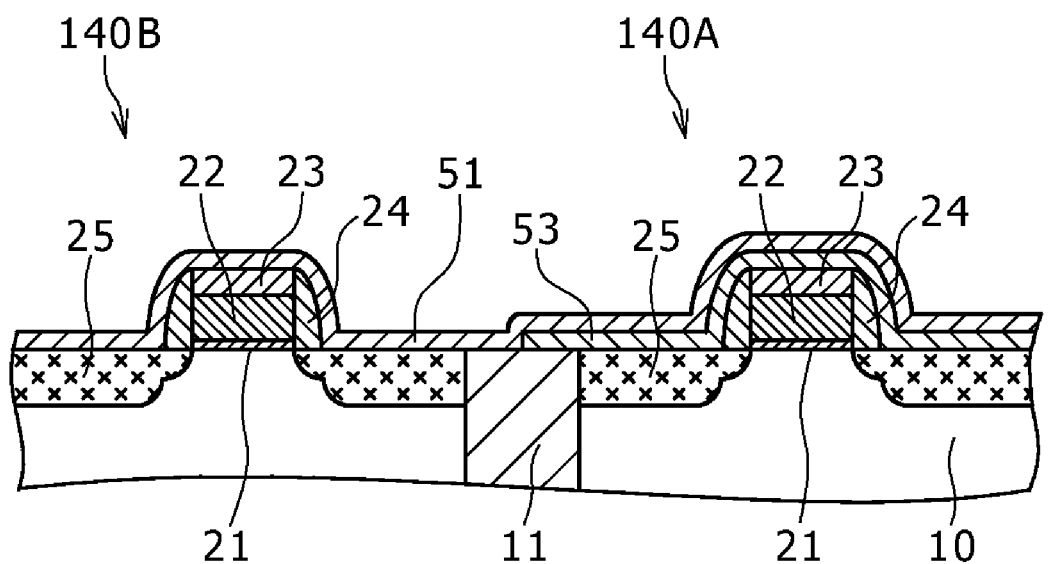
Figure 38A:
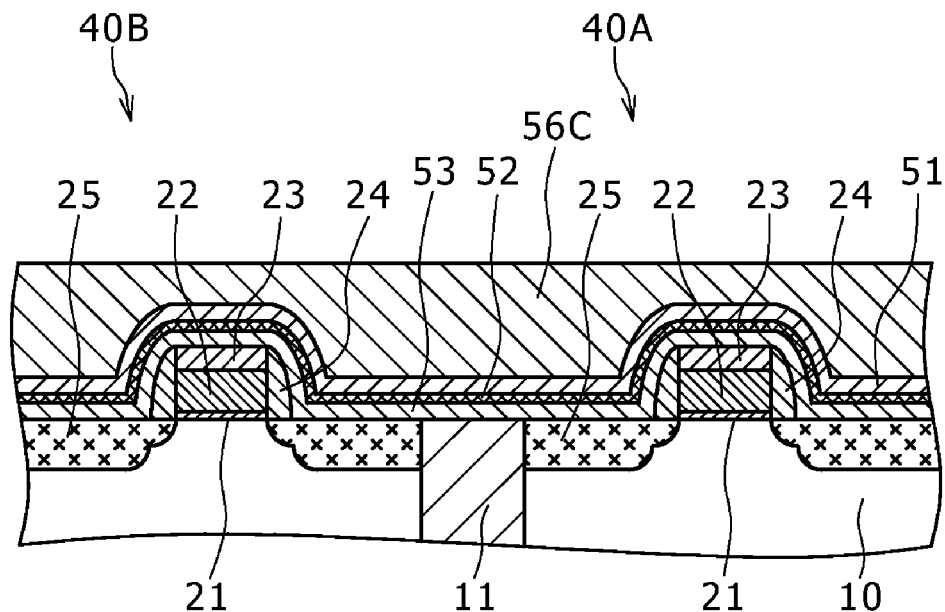
FIGS. 38A and 38B are schematic partly end elevation diagrams of the semiconductor substrate and the like for illustrating the method of manufacturing a semiconductor integrated circuit according to Example 8, following to FIGS. 37A and 37B.
Figure 38B:
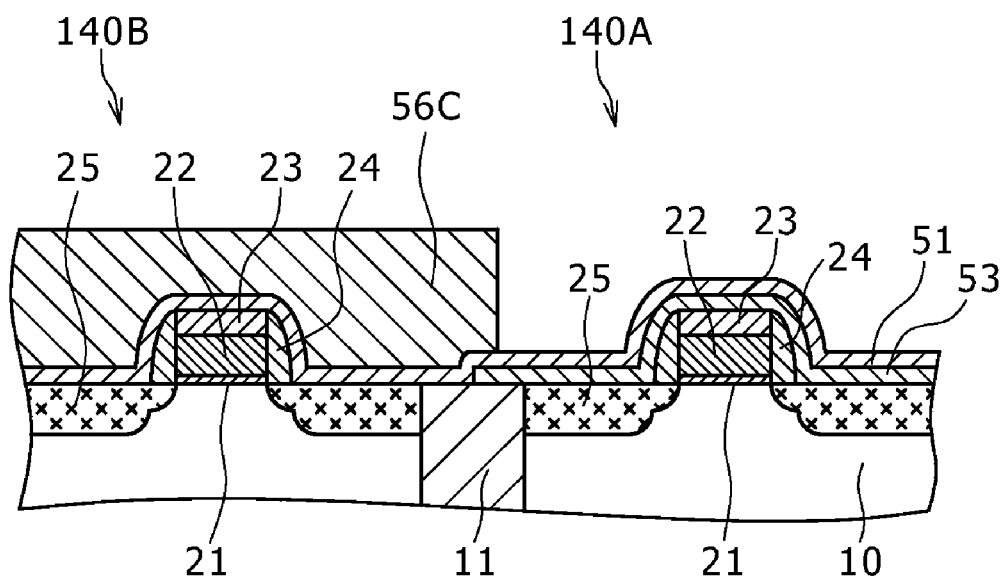
Figure 39A:
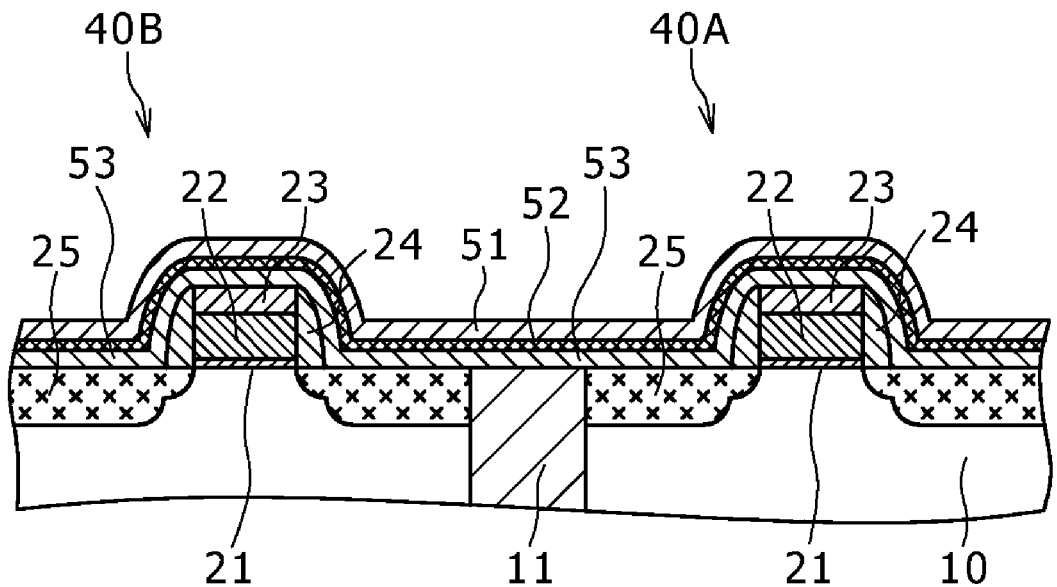
FIGS. 39A and 39B are schematic partly end elevation diagrams of the semiconductor substrate and the like for illustrating the method of manufacturing a semiconductor integrated circuit according to Example 8, following to FIGS. 38A and 38B.
Figure 39B:
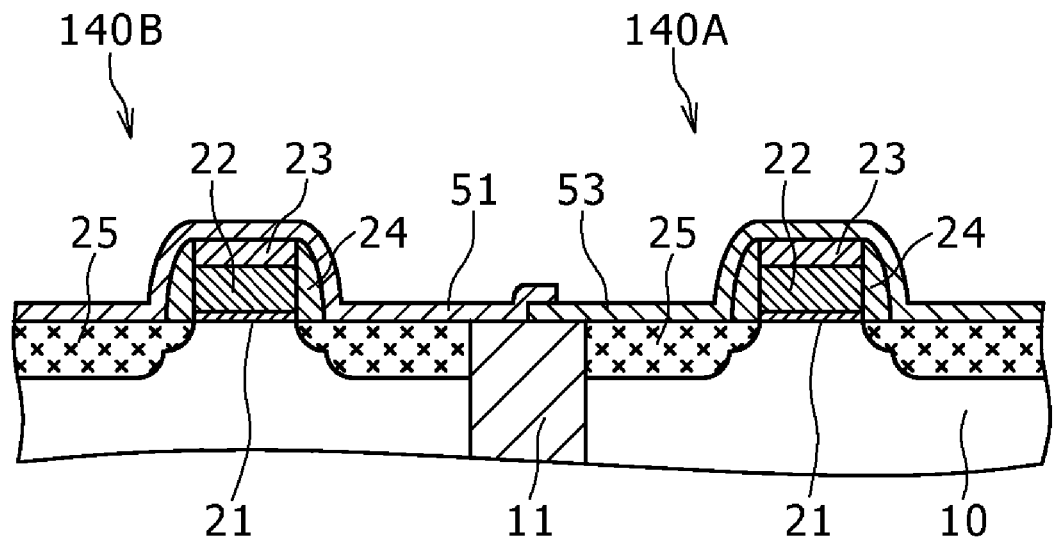

Thereafter, the same step as Step 640 of Example 6 is conducted, whereby a third insulation film 51 having a tensile stress is formed on the whole surface (see FIGS. 37A and 37B).

[Step 840]

Subsequently, the same step as Step 650 of Example 6 is carried out, whereby the third insulation film 51 present on the upper side of the region of the P-type FET 140A constituting the logic part is selectively removed (see FIGS. 38A and 38B, and FIGS. 39A and 39B).

[Step 850]

Next, the same step as Step 150 of Example 1 is carried out, whereby a semiconductor integrated circuit can be obtained.

Incidentally, in Example 8 also, like in Example 7, ion implantation for relaxation of tensile stress may be applied to the third insulation film 51 present on the upper side of the region of the P-type FET 40A constituting the memory array part, following to Step 830 or Step 840. By this, the tensile stress on the third insulation film 51 which is formed on the upper side of the region of the P-type FET 40A constituting the memory array part and which has a tensile stress is relaxed, so that it is possible to contrive enhancement of the performance of the P-type FET 40A.

While the present invention has been described above based on the preferred Examples thereof, the present invention is not limited to or by these Examples. The transistor structures and configurations described in the Examples are merely exemplifications, which can be modified as required, and the manufacturing conditions of the transistors and the like described in the Examples are also mere exemplifications, which can be changed as required. While the device separation region having a trench structure has been formed in the semiconductor substrate in the Examples, the device separation region is not limited to the one having the trench structure, and may be of a LOCOS structure or of a combination of the trench structure and the LOCOS structure. Furthermore, the semiconductor integrated circuit may be provided on a substrate having an SOI structure obtained by a SIMOX method or a substrate adhesion method, and, in that case, the formation of the device separation region is unnecessary.

What is claimed is:

1. A method of manufacturing a semiconductor integrated circuit said method comprising the steps of:
    (A) forming a logic part and a memory array part in a semiconductor substrate the logic part and the memory array part each including (1) an N channel type field effect transistor comprising gate parts, channel regions and source/drain regions, and (2) a P channel type field effect transistor comprising gate parts, channel regions and source/drain regions;
    (B) forming a first insulation film having a tensile stress on an entire surface of the semiconductor substrate with said logic part and said memory array part formed therein and forming a second insulation film on said first insulation film;
    (C) selectively removing said second insulation film and said first insulation film present on an upper side of a region of said P channel type field effect transistor in said logic part;
    (D) forming a third insulation film having a compressive stress on a whole surface; and
    (E) selectively removing said third insulation film present on an upper side of a region of said N channel type field effect transistor in said logic part and an upper side of a region of said N channel type field effect transistor in said memory array part and an upper side of a region of said P channel type field effect transistor in said memory array part;
    (G) applying ion implantation for relaxation of tensile stress to said first insulation film on the region of said P channel type field effect transistor in said memory array subsequent to step (E).

2. The method of manufacturing a semiconductor integrated circuit as set forth in claim 1, wherein said first insulation film and said third insulation film are each comprised of a silicon nitride film, and said second insulation film is comprised of a silicon oxide film.

3. A method of manufacturing a semiconductor integrated circuit said method comprising the steps of:
    (A) forming a logic part and a memory array part in a semiconductor substrate each including (1) an N channel type field effect transistor comprising gate parts, channel regions and source/drain regions, and (2) a P channel type field effect transistor comprising gate parts, channel regions and source/drain regions;
    (B) forming a first insulation film having a tensile stress on an entire surface of the semiconductor substrate with said logic part and said memory array part formed therein and forming a second insulation film on said first insulation film;
    (C) selectively removing said second insulation film and said first insulation film present on an upper side of a region of said P channel type field effect transistor in said logic part;
    (D) forming a third insulation film having a compressive stress on a whole surface;
    (E) applying ion implantation for relaxation of compressive stress to said third insulation film present on an upper side of a region of said N channel field effect transistor in said memory array part and selectively removing said third insulation film present on an upper side of a region of said N channel type field effect transistor in said logic part; and (F) applying ion implantation for relaxation of tensile stress to said first insulation film on a region of said P channel type field effect transistor in said memory array part at any point between steps (B)-(D).

4. The method of manufacturing a semiconductor integrated circuit as set forth in claim 3, wherein said first insulation film and said third insulation film are each comprised of a silicon nitride film, and said second insulation film is comprised of a silicon oxide film.

5. A method of manufacturing a semiconductor integrated circuit, said method comprising the steps of:
- (A) forming a logic part and a memory array part in a semiconductor substrate each including (1) an N channel type field effect transistor comprising gate parts, channel regions and source/drain regions, and (2) a P channel type field effect transistor comprising gate parts, channel regions and source/drain regions;
- (B) forming a first insulation film having a tensile stress on an entire surface of the semiconductor substrate with said logic part and said memory array part formed therein and forming a second insulation film on said first insulation film;
- (C) selectively removing said second insulation film present on an upper side of a region of said N channel type field effect transistor and said P channel type field effect transistor in said logic part;
- (D) selectively removing said first insulation film present on said region of said P channel type field effect transistor constituting said logic part;
- (E) forming a third insulation film having a compressive stress on a whole surface; and
- (F) selectively removing said third insulation film present on the upper side of said region of said N channel type field effect transistor in said logic part and said third insulation film present on an upper side of a region of said N channel type field effect transistor and an upper side of a region of said P channel type field effect transistor in said memory array part;
- (G) applying ion implantation for relaxation of tensile stress to said first insulation film on the region of said P channel type field effect transistor constituting said memory array subsequent to step (F).

6. The method of manufacturing a semiconductor integrated circuit as set forth in claim 5, wherein said first insulation film and said third insulation film are each comprised of a silicon nitride film, and said second insulation film is comprised of a silicon oxide film.

7. A method of manufacturing a semiconductor integrated circuit said method comprising the steps of:
- (A) forming a logic part and a memory part in a semiconductor substrate each including (1) an N channel type field effect transistor comprising gate parts, channel regions and source/drain regions, and (2) a P channel type field effect transistor comprising gate parts, channel regions and source/drain regions
- (B) forming a first insulation film having a tensile stress on an entire surface of the semiconductor substrate with said logic part and said memory array part formed therein and forming a second insulation film on said first insulation film;
- (C) selectively removing said second insulation film present on both an upper side of a region of said N channel type field effect transistor and an upper side of a region of said P channel type field effect transistor in said logic part;
- (D) selectively removing said first insulation film present on the region of said P channel type field effect transistor constituting said logic part;
- (E) forming a third insulation film having a compressive stress on a whole surface;
- (F) applying ion implantation for relaxation of compressive stress to said third insulation film present on an upper side of a region of said N channel type field effect transistor in said memory array part, and selectively removing said third insulation film present on the upper side of the region of said N channel type field effect transistor constituting said logic part; and
- (G) applying ion implantation for relaxation of tensile stress to said first insulation film on a region of said P channel type field effect transistor in said memory array part at any point between step (B) and step (D).

8. The method of manufacturing a semiconductor integrated circuit as set forth in claim 7, wherein said first insulation film and said third insulation film are each comprised of a silicon nitride film, and said second insulation film is comprised of a silicon oxide film.

* * * * *